United States Patent
Yamamoto et al.

(10) Patent No.: US 9,411,026 B2
(45) Date of Patent: Aug. 9, 2016

(54) ISING MODEL QUANTUM COMPUTATION DEVICE AND ISING MODEL QUANTUM COMPUTATION METHOD

(75) Inventors: Yoshihisa Yamamoto, Chiyoda-ku (JP);
Shoko Utsunomiya, Chiyoda-ku (JP);
Kenta Takata, Chiyoda-ku (JP); Kai Yan, Chiyoda-ku (JP)

(73) Assignee: INTER-UNIVERSITY RESEARCH INSTITUTE CORPORATION, RESEARCH ORGANIZATION OF INFORMATION AND SYSTEMS, Tokyo (JP)

( * ) Notice: Subject to any disclaimer, the term of this patent is extended or adjusted under 35 U.S.C. 154(b) by 521 days.

(21) Appl. No.: 13/996,126

(22) PCT Filed: Feb. 28, 2012

(86) PCT No.: PCT/JP2012/054890
§ 371 (c)(1),
(2), (4) Date: Jun. 20, 2013

(87) PCT Pub. No.: WO2012/118064
PCT Pub. Date: Sep. 7, 2012

(65) Prior Publication Data
US 2014/0046626 A1 Feb. 13, 2014

(30) Foreign Application Priority Data
Mar. 1, 2011 (JP) .................. 2011-044037

(51) Int. Cl.
*G01C 9/00* (2006.01)
*G01R 33/12* (2006.01)
(Continued)

(52) U.S. Cl.
CPC ............ *G01R 33/1284* (2013.01); *B82Y 10/00* (2013.01); *G01R 33/0023* (2013.01); *G06N 99/002* (2013.01)

(58) Field of Classification Search
CPC .......... G01R 33/0023; G01R 33/1284; G06N 99/002
USPC .......................................................... 702/151
See application file for complete search history.

(56) References Cited

U.S. PATENT DOCUMENTS 7,126,106 B2 * 10/2006 Goto .................... G06N 99/002
250/214 R

FOREIGN PATENT DOCUMENTS

| JP | H0996845 A | 4/1997 |
|----|------------|--------|
| JP | H0996815 A | 8/1997 |
| JP | 2010-054938 A | 11/2010 |

OTHER PUBLICATIONS

Brynes T. et al.; "Optimization Using Bose-Einstein Condensation and Measurement-Feedback Circuits"; Jan. 26, 2010; arXiv:0909.253v2; http://arxiv.org/pdf/0909.2530v2; pp. 1-10.

(Continued)

*Primary Examiner* — John Breene
*Assistant Examiner* — Jeremy Bishop
(74) *Attorney, Agent, or Firm* — Ohlandt, Greeley, Ruggiero & Perle, L.L.P.

(57) ABSTRACT

This computation device and method exponentially shortens a computation time of an NP-complete problem or the like mapped into an Ising model by exponentially shortening a computation time of the Ising mode. For each pair of a plurality of slave lasers, by controlling the intensity, the polarization, and the phase of light exchanged between two slave lasers using an attenuator and a wave plate, the magnitude and the sign of pseudo Ising interaction between two slave lasers are implemented. Then, after the plurality of slave lasers arrive at a steady state, by measuring the polarization of light generated by each slave laser with left-handed circular polarization and right-handed circular polarization used as bases, a pseudo spin of each slave laser is measured.

27 Claims, 39 Drawing Sheets

(51) Int. Cl.
*G06N 99/00* (2010.01)
*G01R 33/00* (2006.01)
*B82Y 10/00* (2011.01)
*G01C 17/00* (2006.01)
*G01C 19/00* (2013.01)
*G01C 7/00* (2006.01)

(56) References Cited

OTHER PUBLICATIONS

Utsunomiya S. et al.; "Mapping of Ising Medels Onto Injection-Locked Laser Systems"; Optics Express; Sep. 12, 2011; vol. 19, No. 19; pp. 18091-18108.

Takata K. et al.; "Transient Time of an Ising Machine Based on Injection-Locked Laser Network"; New Journal of Physics 14; Jan. 4, 2012; p. 013052.

Shoko Utsunomiya; "Ising Model No Chunya Doki Laser System ENO Mapping"; Ryoshi News; Dec. 2011; No. 6, p. 5.

International Search Report dated May 29, 2012 for corresponding International Patent Application No. PCT/JP2012/054890 with English translation (2 pages).

Brynes T. et al.; "Optimization Using Bose-Einstein Condensation and Measurment-Feedback Circuits"; Jan. 26, 2010; arXiv:0909.250v2; http://arxiv.org/pdf/0909.2530v2; p. 1-10.

Shoko Utsunomiya; "Ising Model No Chunyu Doki Laser System ENO Mapping"; Ryoshi News; Dec. 2011; No. 6, p. 5.

International Preliminary Report on Patentability dated Sep. 12, 2013 corresponding to International Patent Application No. PCT/JP2012/054890; 5 pages.

\* cited by examiner

FIG. 29

| ITEM M | 16 | 18 | 20 |
|---|---|---|---|
| # OF SAMPLED PROBLEMS | 5 | 5 | 4 |
| # OF TRIALS ON EACH PROBLEMS | 10 | 10 | 10 |
| THE LARGEST # OF DEGENERATED GROUND STATES | 16 | 18 | 18 |
| THE LOWEST SUCCESS PROBABILITY ON A PROBLEM | 100% | 100% | 100% |
| TIME LENGTH OF EACH COMPUTATIONAL STEP | 50 ns | 50 ns | 50 ns |
| THE SMALLEST # OF COMPUTATIONAL STEPS | 2 | 2 | 3 |
| THE LARGEST # OF COMPUTATIONAL STEPS | 5 | 6 | 6 |
| THE LONGEST COMPUTATIONAL TIME | 250 ns | 300 ns | 300 ns |

| INJECTION MODE | \|H⟩ | \|V⟩ | \|A⟩ | \|D⟩ | \|R⟩ | \|L⟩ |
|---|---|---|---|---|---|---|
| FIDELITY (SLAVE & MASTER) | 0.857 | 0.796 | 0.596 | 0.642 | 0.795 | 0.891 |
| PURITY (SLAVE LASER) | 0.601 | 0.534 | 0.605 | 0.192 | 0.450 | 0.542 |

FIG. 33

ISING MODEL QUANTUM COMPUTATION DEVICE AND ISING MODEL QUANTUM COMPUTATION METHOD

BACKGROUND

1. Field of the Disclosure

The present disclosure relates to a computation device and a computation method capable of easily solving an NP-complete problem mapped into the Ising model by easily solving the Ising model.

2. Discussion of the Background Art

The Ising model has been researched originally as a model of a magnetic material but recently it is paid attention as a model mapped in an NP-complete problem or the like. However, it is very difficult to solve the Ising model when the number of sites is large. Thus, a quantum annealing machine and a quantum adiabatic machine in which the Ising model is implemented are proposed.

In the quantum annealing machine, after Ising interaction and Zeeman energy are physically implemented, the system is sufficiently cooled so as to realize a ground state, and the ground state is observed, whereby the Ising model is solved. However, in a case where the number of sites is large, when the system is trapped into a metastable state in the process of being cooled, the life of the metastable state exponentially increases with respect to the number of sites, and accordingly, there is a problem in that the metastable state is not easily mitigated to the ground state.

In the quantum adiabatic machine, transverse magnetic field Zeeman energy is physically implemented, and then the ground state of only the transverse magnetic field Zeeman energy is realized by sufficiently cooling the system. Then, Ising interaction is physically implemented slowly, the ground state of the system that includes the Ising interaction and vertical magnetic field Zeeman energy is realized, and ground state is observed, whereby the Ising model is solved. However, when the number of sites is large, there is a problem in that the speed of physically implementing the Ising interaction needs to be exponentially decreased with respect to the number of sites.

In a case where the NP-complete problem or the like is mapped into an Ising model, and the Ising model is implemented as a physical spin system, there is a problem of a natural law that Ising interaction between sites that are physically located close to each other is high, and Ising interaction between sites that are physically located far from each other is low. The reason for this is that, in an artificial Ising model in which the NP-complete problem is mapped, there may be cases where Ising interaction between sites that are physically located close to each other is low, and Ising interaction between sites that are physically located far is high. The difficult in mapping into a natural spin system also makes it difficult to easily solve the NP-complete problem or the like.

Non-Patent Document 1: Tim Byrnes, Kai Yan, and Yoshihisa Yamamoto, Optimization using Bose-Einstein condensation and measurement-feedback circuits, [online], Jan. 26, 2010, arXiv.org, [searched on Jan. 11, 2011], the Internet <URL: http://arxiv.org/abs/0909.2530>

The configuration of an Ising model computation device that is disclosed in Non-Patent Document 1 for solving some of the above-described problems is illustrated in FIG. 1. The Ising model computation device is configured by Bose-Einstein condensing units B1, B2, and B3, spin measuring units D1, D2, and D3, a feedback control circuit F, and Ising interaction implementing units I1, I2, and I3.

The Bose-Einstein condensing units B1, B2, and B3 are systems in which almost all the Bose particles are in the ground state at a very low temperature and are configured by exciton polaritons included in semiconductor micro-cavities, neutral atoms each having an unpaired electron, or the like. The Bose-Einstein condensing units B1, B2, and B3 are applied with magnetic fields $B_1$, $B_2$, and $B_3$ to be described later and are configured by Bose particles having mutually-different spin directions denoted by white circles and black circles illustrated in FIG. 1.

The spin measuring units D1, D2, and D3 output currents $I_1$, $I_2$, and $I_3$ that are in proportion to sums of all the spins respectively included in the Bose-Einstein condensing units B1, B2, and B3. Here, a sum $S_i$ of all the spins inside each site is represented as below. Here, $\sigma_i$ represents the spin of each Bose particle of each site, and N represents a total number of Bose particles of each site.

$$S_i = \sum_{k=1}^{N} \sigma_i^k \quad \text{[Expression 1]}$$

The feedback control circuit F receives the currents $I_1$, $I_2$, and $I_3$ as inputs from the spin measuring units D1, D2, and D3 and outputs feedback signals to the Ising interaction implementing units I1, I2, and I3. The Ising interaction implementing units I1, I2, and I3 receives the feedback signals from the feedback control circuit F as inputs and applies magnetic fields $B_1$, $B_2$, and $B_3$ to the Bose-Einstein condensing units B1, B2, and B3, respectively. Here, the magnetic fields $B_1$, $B_2$, and $B_3$ are represented as below. In addition, $J_{ij}$ represents an Ising interaction coefficient between an i-th site and a j-th site, and M represents the number (three in FIG. 1) of all the sites.

$$B_i = \sum_{j=1}^{M} J_{ij} S_j \quad \text{[Expression 2]}$$

Hamiltonian H of all the Bose-Einstein condensing units B1, B2, and B3 is represented as below. In other words, the Ising interaction is implemented.

$$H = \sum_{i=1}^{M} B_i S_i = \sum_{i,j=1}^{M} J_{ij} S_i S_j \quad \text{[Expression 3]}$$

When the Ising model computation device illustrated in FIG. 1 is applied as a quantum annealing machine, the problem that the system is not easily mitigated from the metastable state to the ground state can be partly solved. In other words, in a case where the mitigation rate from the metastable state to the ground state is A when the number of Bose particles occupying the ground state is zero, the mitigation rate increases to A(L+1) when the number of Bose particles occupying the ground state is L. Here, since L and N are of a same order, the computation time is shortened in inverse proportion to the number N of Bose particles.

When the Ising model computation device illustrated in FIG. 1 is applied as a quantum adiabatic machine, the problem that the speed of physically implementing the Ising interaction needs to be lowered step by step in accordance with an increase in the number of sites can be partly solved. In other words, even in a case where a change in Hamiltonian is too fast, and Bose particles leak from the ground state to an excited state, the Bose particles are returned from the excited state to the ground state by Bose-Einstein condensing, and error correction is made in proportion to the number N of Bose particles. Accordingly, the computation time is shortened in inverse proportion to the number N of Bose particles.

In the Ising model computation device illustrated in FIG. 1 can freely control not only the magnitude of Ising interaction between sites that are physically located close to each other but also the magnitude of Ising interaction between sites that are physically located far from each other through the feedback control circuit F. Accordingly, regardless of a physical distance between sites, an artificial Ising model mapped from an NP-complete problem can be solved.

In the Ising model computation device illustrated in FIG. 1, for N spins included in each site, it is determined whether one type of upward and downward spins is more than the other type based on the rule of majority. Thus, the temperature of the system is a finite temperature, and, accordingly, even when there is a spin leaking from the ground state to the excited state, the probability of acquiring a correct answer is markedly higher when the number of spins included in each site is N than that when the number of spins is one.

However, in the Ising model computation device illustrated in FIG. 1, the spin measuring units D1, D2, and D3 output currents $I_1$, $I_2$, and $I_3$ that are respectively in proportion to sums of all the spins included in the Bose-Einstein condensing units B1, B2, and B3, and the feedback control circuit F receives the currents $I_1$, $I_2$, and $I_3$ from the spin measuring units D1, D2, and D3 as inputs and outputs feedback signals to the Ising interaction implementing units I1, I2, and I3. In other words, for each feedback, quantum coherence of the whole system is broken, whereby the spin state of the whole system is determined.

Here, the determined spin state of the whole system is not limited to the ground state. Thus, the spin state of the whole system needs to be determined over and over until the spin state of the whole system is settled to the ground state, and, in a worst case, spin states of $2^M$ kinds of the whole system need to be determined. In other words, the computation time is in proportion to $2^M/N$, and thus, even when Bose-Einstein condensing is applied, the exponential divergence of the computation time cannot be suppressed.

Thus, in order to solve the above-described problems, an object of the present disclosure is to provide a computation device and a computation method suppressing exponential divergence of the computation time of an NP-complete problem or the like mapped into an Ising model.

SUMMARY

In order to achieve the above-described objects, for each pair of a plurality of coherent oscillators, by controlling the intensity, the polarization, and the phase of light exchanged between two coherent oscillators, the magnitude and the sign of pseudo Ising interaction between two coherent oscillators are implemented. Then, after the plurality of coherent oscillators arrive at a steady state, by measuring the polarization of light generated by the plurality of coherent oscillators with left-handed circular polarization and right-handed circular polarization used as bases, pseudo spins of the plurality of coherent oscillators are measured.

Specifically, the present disclosure provides an Ising model quantum computation device including: a plurality of coherent oscillators that have an oscillation mode in which light having left-handed circular polarization or right-handed circular polarization is generated; inter-oscillator optical path units that are arranged between two coherent oscillators for each pair of the plurality of coherent oscillators; inter-oscillator intensity control units that, for each pair of the plurality of coherent oscillators, are arranged in the inter-oscillator optical path units and implement a magnitude of pseudo Ising interaction between two coherent oscillators by controlling an intensity of light exchanged between the two coherent oscillators; inter-oscillator polarization control units that, for each pair of the plurality of coherent oscillators, are arranged in the inter-oscillator optical path units and implement a sign of the pseudo Ising interaction between two coherent oscillators by controlling polarization and a phase of light exchanged between the two coherent oscillators; and a polarization measuring unit that measures pseudo spins of the plurality of coherent oscillators by measuring polarization of light generated by the plurality of coherent oscillators with left-handed circular polarization and right-handed circular polarization used as bases after the plurality of coherent oscillator arrive at a steady state.

Further, the present disclosure provides an Ising model quantum computation method including in sequence: an oscillating step of starting oscillation of a plurality of coherent oscillators that have an oscillation mode in which light having left-handed circular polarization or right-handed circular polarization is generated; an interaction implementing step of implementing a magnitude and a sign of pseudo Ising interaction between two coherent oscillators by controlling an intensity, polarization and a phase of light exchanged between the two coherent oscillators for each pair of the plurality of coherent oscillators; and a spin measuring step of measuring pseudo spins of the plurality of coherent oscillators by measuring polarization of light generated by the plurality of coherent oscillators with left-handed circular polarization and right-handed circular polarization used as bases after the plurality of coherent oscillator arrive at a steady state.

Furthermore, the present disclosure provides an Ising model quantum computation method including in sequence: an oscillating step of starting oscillation of a plurality of coherent oscillators that have an oscillation mode in which light having left-handed circular polarization or right-handed circular polarization is generated; an interaction implementing step of implementing a magnitude and a sign of pseudo Ising interaction between two coherent oscillators to approach final values from initial values by controlling an intensity, polarization and a phase of light exchanged between the two coherent oscillators for each pair of the plurality of coherent oscillators; and a spin measuring step of measuring pseudo spins of the plurality of coherent oscillators by measuring polarization of light generated by the plurality of coherent oscillators with left-handed circular polarization and right-handed circular polarization used as bases after the magnitude and the sign of the pseudo Ising interaction arrive at the final values.

According to such a configuration, the polarization direction of light emitted from the coherent oscillator is in correspondence with the pseudo spin direction of the coherent oscillator, and the pseudo spin state of the whole system is measured. Until the pseudo spin state of the whole system is settled to the ground state, the quantum coherence of the whole system is not broken, and accordingly, the problem of exponentially increasing of the computation time in accordance with the number of all the sites is solved, whereby the computation time can be shortened to a large extent.

Thus, for any pair out of M sites, through light exchanged between two sites, not only Ising interaction between sites physically located close to each other but also Ising interaction between sites physically located far from each other can be implemented. Accordingly, regardless of a physical distance between sites, an Ising model in which any NP-complete problem or the like can be mapped can be solved.

In addition, for a plurality of pseudo spins in each site, whether one type of upward and downward spins is more than the other type is determined based on the rule of majority. Accordingly, even when there is a pseudo spin that is leaked from the ground state to the excited state, the probability of acquiring a correct solution is markedly higher in a case where there are a plurality of pseudo spins than that in a case where there is one pseudo spin in each site.

In addition, the Ising model quantum computation device according to the present disclosure can be applied as a quantum annealing machine or a quantum adiabatic machine.

In addition, the present disclosure provides the Ising model quantum computation device further including: a master oscillator that injects light to the plurality of coherent oscillators and synchronizes oscillation phases of the plurality of coherent oscillators; and master-to-oscillator optical path units that are arranged between the master oscillator and the coherent oscillators.

In addition, the present disclosure provides the Ising model quantum computation method in which, in the step of oscillation, oscillation of a master oscillator synchronizing oscillation phases of the plurality of coherent oscillators is started by injecting light to the plurality of coherent oscillators.

According to such a configuration, the phases of light can be arranged in order in the whole Ising model quantum computation device, whereby the coherence of light can be maintained.

In addition, the present disclosure provides the Ising model quantum computation device further including: master-to-oscillator intensity control units that are arranged in the master-to-oscillator optical path units and implement a magnitude of pseudo Zeeman energy in each coherent oscillator by controlling an intensity of light injected to each coherent oscillator; and master-to-oscillator polarization control units that are arranged in the master-to-oscillator optical path units and implement a magnitude and a sign of the pseudo Zeeman energy in each coherent oscillator by controlling polarization and a phase of light injected to each coherent oscillator.

In addition, the present disclosure provides the Ising model quantum computation method in which, in the interaction implementing step, a magnitude and a sign of pseudo Zeeman energy in each coherent oscillator is implemented by controlling an intensity, polarization, and a phase of light injected to each coherent oscillator from the master oscillator.

In addition, the present disclosure provides the Ising model quantum computation method in which, in the interaction implementing step, a magnitude and a sign of pseudo Zeeman energy in each coherent oscillator are implemented so as to approach final values from initial values by controlling an intensity, polarization, and a phase of light injected to each coherent oscillator from the master oscillator, and, in the spin measuring step, pseudo spins of the plurality of coherent oscillators are measured by measuring polarization of light generated by the plurality of coherent oscillators with left-handed circular polarization and right-handed circular polarization used as bases after the magnitude and the sign of the pseudo Zeeman energy arrive at the final values.

According to such a configuration, when only the Ising interaction is implemented, in a case where the degeneracy of the ground state is present, by implementing the Ising interaction and the Zeeman energy, the degeneracy of the ground state can be dissolved, whereby the probability for acquiring a correct answer markedly increases.

In addition, the present disclosure provides the Ising model quantum computation device further including adjacent spin direction fixing units that are arranged in the master-to-oscillator optical path units and fix the directions of pseudo spins of two coherent oscillators to be different from each other when the sign of pseudo Ising interaction between the two coherent oscillators is positive and fix the directions of the pseudo spins of two coherent oscillators to be the same when the sign of the pseudo Ising interaction between the two coherent oscillators is negative by controlling the intensity, the polarization, and the phase of light injected to the two coherent oscillators when the polarization of light generated by the two coherent oscillators performing the pseudo Ising interaction through the inter-oscillator optical path units is not significantly measured as left-handed circular polarization or right-handed circular polarization.

In addition, the present disclosure provides the Ising model quantum computation method in which, in the interaction implementing step, the directions of pseudo spins of two coherent oscillators are fixed to be different from each other when the sign of pseudo Ising interaction between the two coherent oscillators is positive, and the directions of the pseudo spins of two coherent oscillators are fixed to be the same when the sign of the pseudo Ising interaction between the two coherent oscillators is negative by controlling the intensity, the polarization, and the phase of light injected to the two coherent oscillators when the polarization of light generated by the two coherent oscillators performing the pseudo Ising interaction is not significantly measured as left-handed circular polarization or right-handed circular polarization.

According to such a configuration, the frustration of the pseudo spin between two coherent oscillators performing pseudo Ising interaction can be dissolved.

In addition, the present disclosure provides the Ising model quantum computation device further including peripheral spin direction fixing units that are arranged in the master-to-oscillator optical path units and fix a direction of a pseudo spin of an adjacent coherent oscillator to a direction of a current time point by controlling the intensity, the polarization and the phase of light injected to the adjacent coherent oscillator performing pseudo Ising interaction with the two coherent oscillators through the inter-oscillator optical path units when the polarization of light generated by the two coherent oscillators performing the pseudo Ising interaction through the inter-oscillator optical path units is not significantly measured as left-handed circular polarization or right-handed circular polarization.

In addition, the present disclosure provides the Ising model quantum computation method in which, in the interaction implementing step, a direction of a pseudo spin of an adjacent coherent oscillator is fixed to a direction of a current time point by controlling the intensity, the polarization and the phase of light injected to the adjacent coherent oscillator performing pseudo Ising interaction with two coherent oscillators when the polarization of light generated by the two coherent oscillators performing the pseudo Ising interaction is not significantly measured as left-handed circular polarization or right-handed circular polarization.

According to such a configuration, between two coherent oscillators performing pseudo Ising interaction, when the frustration of the pseudo spin is dissolved, unintentional flipping of the pseudo spin can be prevented in the coherent oscillators that are adjacent to the two coherent oscillators in a pseudo manner.

In addition, the present disclosure provides the Ising model quantum computation device in which a delay time of pseudo Ising interaction between two coherent oscillators performing the pseudo Ising interaction through the inter-oscillator optical path units is shorter than a reciprocal of an injection locking width in the master oscillator and the two coherent oscillators.

In addition, the present disclosure provides the Ising model quantum computation method in which a delay time of pseudo Ising interaction between two coherent oscillators performing the pseudo Ising interaction is shorter than a reciprocal of an injection locking width in the master oscillator and the two coherent oscillators.

According to such a configuration, the Ising model quantum computation device can be operated in a stable manner.

In addition, the present disclosure provides the Ising model quantum computation device in which the plurality of coherent oscillators is a plurality of slave lasers.

In addition, the present disclosure provides the Ising model quantum computation method in which the plurality of coherent oscillators is a plurality of slave lasers.

According to such a configuration, the whole system can be operated not at a low temperature but at a room temperature.

In addition, the present disclosure provides the Ising model quantum computation device in which the plurality of coherent oscillators is a plurality of Bose-Einstein condensates.

In addition, the present disclosure provides the Ising model quantum computation method in which the plurality of coherent oscillators is a plurality of Bose-Einstein condensates.

According to such a configuration, a quantum computation device and a quantum computation method of an Ising model can be realized using the Bose-Einstein condensates.

The present disclosure also provides the Ising model quantum computation method in which the master oscillator is a master laser.

The present disclosure also provides the Ising model quantum computation method in which the master oscillator is a master laser.

According to such a configuration, a quantum computation device and a quantum computation method of an Ising model can be realized using the master laser.

Effects of the Disclosure

The present disclosure can provide a computation device and a computation method suppressing exponential divergence of the computation time of an NP-complete problem or the like mapped into an Ising model.

BRIEF DESCRIPTION OF THE DRAWINGS

FIG. 29 is a diagram that illustrates a result of a simulation of the relation with the number of sites and the computation time according to the third embodiment.

FIG. 33 is a diagram that illustrates the accuracy of the injection locking between the master laser and the slave laser according to the fourth embodiment.

DETAILED DESCRIPTION OF THE PREFERRED EMBODIMENT

Figure 1:
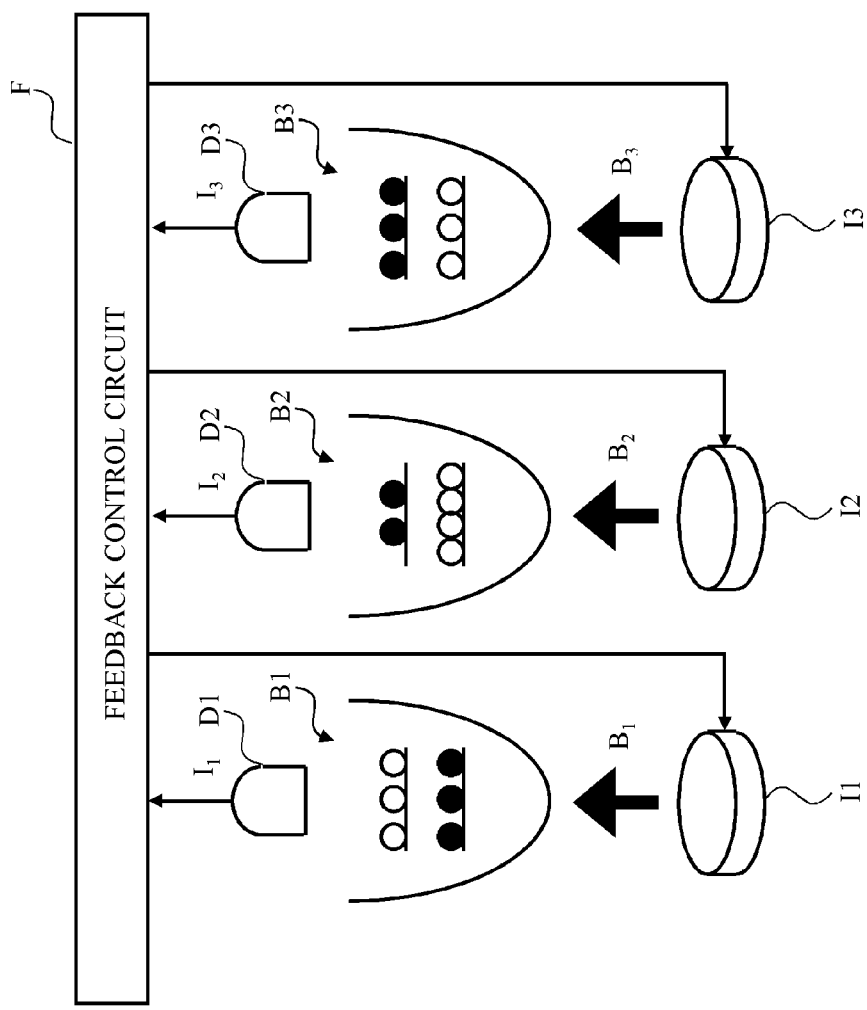
FIG. 1 is a diagram that illustrates the configuration of an Ising model computation device according to a conventional technology.

Embodiments of the present disclosure will be described with reference to the accompanying drawings. The embodiments to be described hereinafter are examples of embodiments of the present disclosure, and the present disclosure is not limited thereto. In this specification and the drawings, like reference numerals denote like elements.

First Embodiment

Figure 2:
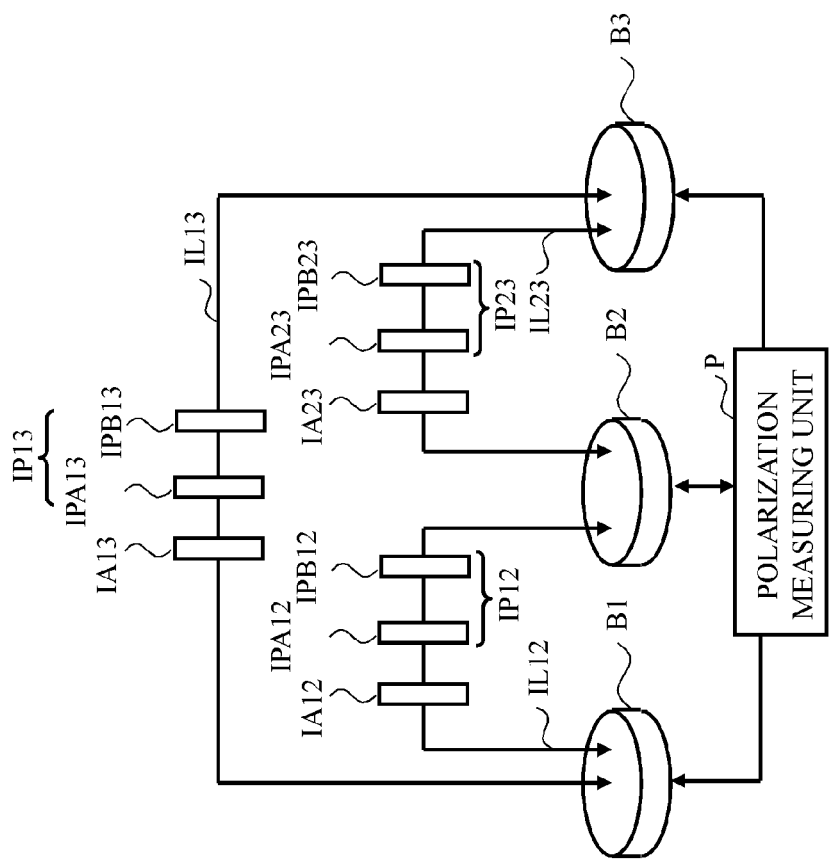
FIG. 2 is a diagram that illustrates the configuration of an Ising model quantum computation device according to a first embodiment.

The configuration of an Ising model quantum computation device according to a first embodiment is illustrated in FIG. 2. The Ising model quantum computation device according to the first embodiment is configured by slave lasers or Bose-Einstein condensates B1, B2, and B3, optical paths IL12, IL23, and IL13, attenuators IA12, IA23, and IA13, wave plates IP12, IP23, and IP13, and a polarization measuring unit P.

The slave lasers or the Bose-Einstein condensates B1, B2, and B3 generate light having left-handed circular polarization or right-handed circular polarization. Here, a photon or an exciton polariton is a Bose particle. As the slave lasers B1, B2, and B3 using photons, semiconductor surface-emitting lasers may be used. In addition, as the Bose-Einstein condensates B1, B2, and B3 using the exciton polaritons, semiconductor micro-cavities can be applied. Hereinafter, while the operations of the slave lasers B1, B2, and B3 using photons will be described, the operations of the Bose-Einstein condensates B1, B2, and B3 using exciton polaritons are similar thereto.

The optical paths IL12, IL23, and IL13 serve as inter-oscillator optical path units and, for each pair out of a plurality of coherent oscillators, are arranged between two coherent oscillators. Specifically, the optical path IL12 is arranged between slave lasers B1 and B2, the optical path IL23 is arranged between slave lasers B2 and B3, and the optical path IL13 is arranged between slave lasers B1 and B3.

The attenuators IA12, IA23, and IA13 serve as inter-oscillator intensity control units and are arranged in the inter-oscillators optical path units for each pair out of the plurality of coherent oscillators, and, by controlling the intensity of light exchanged between two coherent oscillators, the magnitude of the pseudo Ising interaction between two coherent oscillators is implemented. Specifically, the attenuator IA12 is arranged in the optical path IL12 and controls the intensity of light exchanged between the slave lasers B1 and B2, thereby implementing the magnitude of the pseudo Ising interaction between the slave lasers B1 and B2. The attenuator IA23 is arranged in the optical path IL23 and controls the intensity of light exchanged between the slave lasers B2 and B3, thereby implementing the magnitude of the pseudo Ising interaction between the slave lasers B2 and B3. The attenuator IA13 is arranged in the optical path IL13 and controls the intensity of light exchanged between the slave lasers B1 and B3, thereby implementing the magnitude of the pseudo Ising interaction between the slave lasers B1 and B3.

The wave plates IP12, IP23, and IP13 serve as inter-oscillator polarization control units and are arranged in the inter-oscillator optical path units for each pair out of the plurality of coherent oscillators, and, by controlling the polarization and the phase of light exchanged between two coherent oscillators, the sign of the pseudo Ising interaction between two coherent oscillators is implemented. Specifically, the wave plate IP12 is arranged in the optical path IL12 and controls the polarization and the phase of light exchanged between the slave lasers B1 and B2, thereby implementing the sign of the pseudo Ising interaction between the slave lasers B1 and B2. The wave plate IP23 is arranged in the optical path IL23 and controls the polarization and the phase of light exchanged between the slave lasers B2 and B3, thereby implementing the sign of the pseudo Ising interaction between the slave lasers B2 and B3. The wave plate IP13 is arranged in the optical path IL13 and controls the polarization and the phase of light exchanged between the slave lasers B1 and B3, thereby implementing the sign of the pseudo Ising interaction between the slave lasers B1 and B3.

The wave plate IP is configured by a polarizing plate IPA and a phase shifter IPB. The polarizing plate IPA passes only horizontally linearly polarized light and blocks vertically linearly polarized light. The phase shifter IPB does not reverse the phase when the Ising interaction coefficient $J_{ij}$ is positive but reverses the phase when the Ising interaction coefficient $J_{ij}$ is negative. As above, for the last term on the right hand side of Expressions 5 and 6 represented below, $\sqrt{n_{Rj}}-\sqrt{n_{Lj}}$ is generated using the polarizing plate IPA, an absolute value of the coefficient $\xi_{ij}$ is set using the attenuator IA, and the sign of the coefficient $\xi ij$ is implemented using the phase shifter IPB.

After a plurality of slave lasers B arrive at the steady state, the polarization measuring unit P measures the polarization of light generated by the plurality of slave lasers B with left-handed circular polarization and right-handed circular polarization used as a base, and thereby measuring the pseudo spins of the plurality of slave lasers B.

Next, the computational principle of the first embodiment will be described. First, in performing the computation, Ising Hamiltonian is defined as in Expression 4.

$$H = \sum_{i,j=1}^{M} J_{ij} S_i S_j \qquad \text{[Expression 4]}$$

Here, although the sign attached prior to $J_{ij}$ is "+", the value of $J_{ij}$ may be either positive or negative.

In each one of the slave lasers B1, B2, and B3, for the numbers $n_{Ri}$ and $n_{Li}$ of photons having right-handed circular polarization and left-handed circular polarization and an inverted distribution number difference $N_i$ of carriers, rate equations are represented as Expressions 5 to 8.

$$\frac{d}{dt}n_{Ri} = -\left(\frac{\omega}{Q} - E_{CVi}\right)n_{Ri} + E_{CVi} + 2\frac{\omega}{Q}\sqrt{n_{Ri}}\left[-\sum_{i\neq j}\frac{1}{2}\xi_{ij}\left(\sqrt{n_{Rj}} - \sqrt{n_{Lj}}\right)\right] \qquad \text{[Expression 5]}$$

$$\frac{d}{dt}n_{Li} = -\left(\frac{\omega}{Q} - E_{CVi}\right)n_{Li} + E_{CVi} + 2\frac{\omega}{Q}\sqrt{n_{Li}}\left[+\sum_{i\neq j}\frac{1}{2}\xi_{ij}\left(\sqrt{n_{Rj}} - \sqrt{n_{Lj}}\right)\right] \qquad \text{[Expression 6]}$$

$$\frac{d}{dt}N_i = P - \frac{N_i}{\tau_{sp}} - E_{CVi}(n_{Ri} + n_{Li} + 2) \qquad \text{[Expression 7]}$$

$$E_{CVi} = \beta_i \frac{N_i}{\tau_{sp}} \qquad \text{[Expression 8]}$$

Here, $\omega$ is an oscillation frequency, and Q is a Q factor of resonator. P is the number of electrons injected per second to the slave laser B, that is, a pumping rate so as to realize an inverted distribution. $-(\omega/Q)n_{Ri}$ represented in Expression 5 and $-(\omega/Q)n_{Li}$ represented in Expression 6 represent rates at which the number $n_{Ri}$ of photons having right-handed circular polarization and the number $n_{Li}$ of photons having left-handed circular polarization decrease due to resonator loss in accordance with an elapse of time.

$\tau_{sp}$ is an electron lifetime due to spontaneous emission toward a mode other than a laser oscillation mode. $\beta_i$ is a coupling constant of all the light that is spontaneously emitted for the laser oscillation mode and is about $10^{-4}$ to $10^{-5}$ in the case of a semiconductor surface-emitting laser. $E_{CVi}n_{Ri}$ represented in Expression 5 and $E_{CVi}n_{Li}$ represented in Expression 6 represent rates at which the number $n_{Ri}$ of photons having right-handed circular polarization and the number $n_{Li}$ of photons having left-handed circular polarization increase due to stimulated emission in accordance with an elapse of time. $E_{CVi}$ represented in Expressions 5 and 6 represents a rate at which the number $n_{Ri}$ of photons having right-handed circular polarization and the number $n_{Li}$ of photons having left-handed circular polarization increase due to spontaneous emission in accordance with an elapse of time.

A term to which $\xi_{ij}$ represented in Expression 5 relates is a term relating to mutual injection light between slave lasers B used for implementing Ising interaction. $2(\omega/Q) \sqrt{n_{Ri}}[-\Sigma½\xi_{ij}\sqrt{n_{Rj}}]$ represented in Expression 5 represents a rate at which, when light of the j-th site having right-handed circular polarization is injected to the i-th site as horizontally linearly polarized light, the number $n_{Ri}$ of photons having right-handed circular polarization in the i-th site changes in accordance with an elapse of time. $2(\omega/Q)\sqrt{n_{Ri}}[+\Sigma½\xi_{ij}\sqrt{n_{Lj}}]$ represented in Expression 5 represents a rate at which, when light of the j-th site having left-handed circular polarization is injected to the i-th site as horizontally linearly polarized light, the number $n_{Ri}$ of photons having right-handed circular polarization in the i-th site changes in accordance with an elapse of time.

A term to which $\xi_{ij}$ represented in Expression 6 relates is a term relating to mutual injection light between slave lasers B used for implementing Ising interaction. $2(\omega/Q) \sqrt{n_{Li}}[+\Sigma½\xi ij\sqrt{n_{Ri}}]$ represented in Expression 6 represents a rate at which, when light of the j-th site having right-handed circular polarization is injected to the i-th site as horizontally linearly polarized light, the number $n_{Li}$ of photons having left-handed circular polarization in the i-th site changes in accordance with an elapse of time. $2(\omega/Q)\sqrt{n_{Li}}[-\Sigma½\xi_{ij}\sqrt{n_{Lj}}]$ represented in Expression 6 represents a rate at which, when light of the j-th site having left-handed circular polarization is injected to the i-th site as horizontally linearly polarized light, the number $n_{Li}$ of photons having left-handed circular polarization in the i-th site changes in accordance with an elapse of time.

In the steady state, Expressions 5 and 6 become Expressions 9 and 10, respectively.

$$\frac{d}{dt}n_{Ri} = 0 \qquad \text{[Expression 9]}$$

$$\frac{d}{dt}n_{Li} = 0 \qquad \text{[Expression 10]}$$

By adding Numerical Equations 9 and 10, Expression 11 is acquired.

$$\frac{\omega}{Q} = E_{CVi}\frac{n_{Ri}+n_{Li}+2}{n_{Ri}+n_{Li}} + 2\frac{\omega}{Q}\frac{\sqrt{n_{Ri}}-\sqrt{n_{Li}}}{\sqrt{n_{Ri}+n_{Li}}}\left[-\sum_{i\neq j}\frac{1}{2}\xi_{ij}\frac{\sqrt{n_{Rj}}-\sqrt{n_{Lj}}}{\sqrt{n_{Ri}+n_{Li}}}\right] \qquad \text{[Equation 11]}$$

By setting $n_{Ri}+n_{Li}=n_T$ and considering $n_T \gg 1$, Expression 12 is acquired.

$$\frac{\omega}{Q} = E_{CVi} + 2\frac{\omega}{Q}\frac{\sqrt{n_{Ri}}-\sqrt{n_{Li}}}{\sqrt{n_T}}\left[-\sum_{i\neq j}\frac{1}{2}\xi_{ij}\frac{\sqrt{n_{Rj}}-\sqrt{n_{Lj}}}{\sqrt{n_T}}\right] \qquad \text{[Equation 12]}$$

By setting $(\sqrt{n_{Ri}}-\sqrt{n_{Li}})/\sqrt{n_T}=\sigma_{iz}$, Expression 13 is acquired.

$$\frac{\omega}{Q} = E_{CVi} + 2\frac{\omega}{Q}\sigma_{iz}\left[-\sum_{i\neq j}\frac{1}{2}\xi_{ij}\sigma_{jz}\right] \qquad \text{[Expression 13]}$$

Here, $\sigma_{iz}$ is 1 in a case where there is only light having right-handed circular polarization in the i-th site and is −1 in a case where there is only light having left-handed circular polarization in the i-th site.

By adding Expression 13 for all the sites, Expression 14 is acquired and is represented as a sum of threshold gains.

$$\sum_i E_{CVi} = \frac{\omega}{Q}\times M + 2\frac{\omega}{Q}\sum_{i<j}\xi_{ij}\sigma_{iz}\sigma_{jz} \qquad \text{[Expression 14]}$$

Here, when the slave lasers B1, B2, and B3 have a uniform medium, a circular polarization state $\{\sigma_{iz}\}$ is selected, in which a minimum threshold gain $\Sigma E_{CVi}$ is realized for the slave lasers B1, B2, and B3 as a whole. In other words, one specific laser oscillation mode is selected for the slave lasers B1, B2, and B3 as a whole. Then, the one specific laser oscillation mode suppresses other laser oscillation modes due to contention among laser oscillation modes. In other words, $\Sigma E_{CVi}$ represented in Expression 14 is minimized for the slave lasers B1, B2, and B3 as a whole. Meanwhile, $(\omega/Q)\times M$ represented in Expression 14 is constant for the slave lasers B1, B2, and B3 as a whole. Accordingly, $\Sigma\xi_{ij}\sigma_{iz}\sigma_{jz}$ represented in Expression 14 is minimized for the slave lasers B1, B2, and B3 as a whole.

By setting $\xi_{ij}=J_{ij}$, when $\Sigma\xi_{ij}\sigma_{iz}\sigma_{jz}$ is minimized for the slave lasers B1, B2, and B3 as a whole, $\Sigma J_{ij}\sigma_{iz}\sigma_{jz}$ is minimized as well. In other words, a ground state in which Hamiltonian of the Ising interaction is minimized is realized. As will be described later, when an NP-complete problem or the like is mapped into the Ising model, $J_{ij}$ is determined, and, in a case where the Ising model is further physically implemented, the magnitude and the sign of $\xi_{ij}$ are implemented using the attenuators IA12, IA23, and IA13 and the wave plates IP12, IP23, and IP13 based on $J_{ij}$.

Next, a computation method according to the first embodiment will be described. Here, as illustrated in FIG. 2, for a case where the number of sites is three, a method of physically implementing the Ising model will be described.

First, when the NP-complete problem or the like is mapped into the Ising model, $J_{12}$, $J_{23}$, and $J_{13}$ are determined, and, when the Ising model is physically implemented, $\xi_{12}$, $\xi_{23}$, and $\xi_{13}$ are determined Next, the attenuator IA12 and the wave plate IP12 are controlled in accordance with the magnitude and the sign of $\xi_{12}$, the attenuator IA23 and the wave plate IP23 are controlled in accordance with the magnitude and the sign of $\xi_{23}$, and the attenuator IA13 and the wave plate IP13 are controlled in accordance with the magnitude and the sign of $\xi_{13}$.

The higher $\xi$ is, the less the attenuation factor of the attenuator IA is set to be, whereby the intensity of light exchanged between sites is increased. The lower $\xi$ is, the more the attenuation factor of the attenuator IA is set to be, whereby the intensity of light exchanged between sites is decreased.

When $\xi_{ij}$ is positive, in a case where light is injected from the site j to the site i, control of the wave plate IP is performed such that the phase of light emitted from the site j is reversed at the time of passing the wave plate IP.

When $\xi_{ij}$ is negative, in a case where light is injected from the site j to the site i, the wave plate IP is controlled such that the phase of light emitted from the site j is maintained at the time of passing the wave plate IP.

Next, after the slave lasers B1, B2, and B3 arrive at the steady state, the polarization of light generated by the slave lasers B1, B2, and B3 is measured by using the polarization measuring unit P with the left-handed circular polarization and the right-handed circular polarization used as the base, whereby pseudo spins of the slave lasers B1, B2, and B3 are measured. Finally, the ground state of the acquired Ising model is mapped again into a solution of the NP-complete problem or the like.

Next, the computation accuracy according to the first embodiment will be described. In order to improve the computation accuracy, in the laser oscillation mode for the slave lasers B1, B2, and B3 as a whole, a difference between a least threshold gain and a second least threshold gain needs to be sufficiently larger than $\beta(\omega/Q)(1/R)$ that is a difference between a saturated gain $E_{CV}$, which is determined based on a spontaneous emission rate, and a photon attenuation factor $\omega/Q$. Here, $R=I/I_{th}-1$ is a normalized pump rate, and I and $I_{th}$ are an injection current and a laser oscillation threshold. Accordingly, by decreasing $\beta$ and increasing R, the computation accuracy can be improved.

For the circular polarization of a plurality of photons included in each slave laser B, the polarization measuring unit P determines whether one of the right-handed circulation and the left-handed circulation is more than the other based on the rule of majority. For example, for each slave laser B, when a ratio between the number $n_R$ of photons having right-handed circular polarization corresponding to a correct solution and the number $n_L$ of photons having left-handed circular polarization corresponding to an incorrect solution is set as $r=n_L/n_R<1$, signal power and noise power are as represented in Expressions 15 and 16.

$$\langle n_R - n_L \rangle^2 = \left(\frac{1-r}{1+r}\right)^2 \left(\frac{R}{\beta} \cdot \frac{T}{\tau_p}\right)^2 \quad \text{[Expression 15]}$$

$$\langle \Delta n_R^2 \rangle + \langle \Delta n_L^2 \rangle = \langle n_R \rangle + \langle n_L \rangle = \frac{R}{\beta} \cdot \frac{T}{\tau_p} \quad \text{[Expression 16]}$$

Here, $R/\beta$ is an average number of photons included in each slave laser B, T is an observation time, and $\tau_p=(\omega/Q)^{-1}$ is a photon lifetime due to a resonator loss. In addition, a distribution of the number of photons that follows the Poisson distribution is used.

A signal-to-noise ratio S/N is as represented in Expression 17.

$$\frac{S}{N} = \left(\frac{1-r}{1+r}\right)^2 \cdot \frac{T}{\tau_p} \cdot \frac{R}{\beta} \quad \text{[Expression 17]}$$

In order to improve the computation accuracy by suppressing the error rate to $10^{-9}$, it is necessary that S/N>$10^2$. When T=100 nsec, $\tau_p$=10 psec, R=10, and $\beta=10^{-5}$ are substituted in Expression 17 as exemplary values, it can be understood that it is sufficient that $r=n_L/n_R<0.9998$ in order to improve the computation accuracy. The achievement of such a slight difference between $n_L$ and $n_R$ can be checked by numeric analysis of an injection locking laser system.

In the first embodiment, the polarization direction of light emitted from the slave laser B is in correspondence with the pseudo spin direction of the slave laser B, and the pseudo spin state of the whole system is measured. Until the pseudo spin state of the whole system is settled to the ground state, the quantum coherence of the whole system is not broken, and accordingly, the problem of exponentially increasing of the computation time in accordance with the number of all the sites is solved, whereby the computation time can be shortened to a large extent.

In the first embodiment, when the number of sites is M, only the arrangement of M(M−1)/2 optical paths IL, M(M−1)/2 attenuators IA, and M(M−1)/2 wave plates IP is sufficient. Accordingly, for the number M of sites, the number of necessary optical devices does not increase by $2^M$, but is scaled in $M^2/2$. In the first embodiment, instead of the Bose-Einstein condensates, the slave lasers B are applied. Accordingly, the whole system can be operated not at a low temperature but at a room temperature.

Thus, for any pair out of M sites, through light exchanged between two sites, not only Ising interaction between sites physically located close to each other but also Ising interaction between sites physically located far from each other can be implemented. Accordingly, regardless of a physical distance between sites, an Ising model in which any NP-complete problem or the like can be mapped can be solved.

In addition, for a plurality of pseudo spins in each site, it is determined whether one type of upward and downward spins is more than the other type based on the rule of majority. Accordingly, even when there is a pseudo spin that is leaked from the ground state to the excited state, the probability of acquiring a correct solution is markedly higher in a case where there are a plurality of pseudo spins than that in a case where there is one pseudo spin in each site.

Second Embodiment

Figure 3:
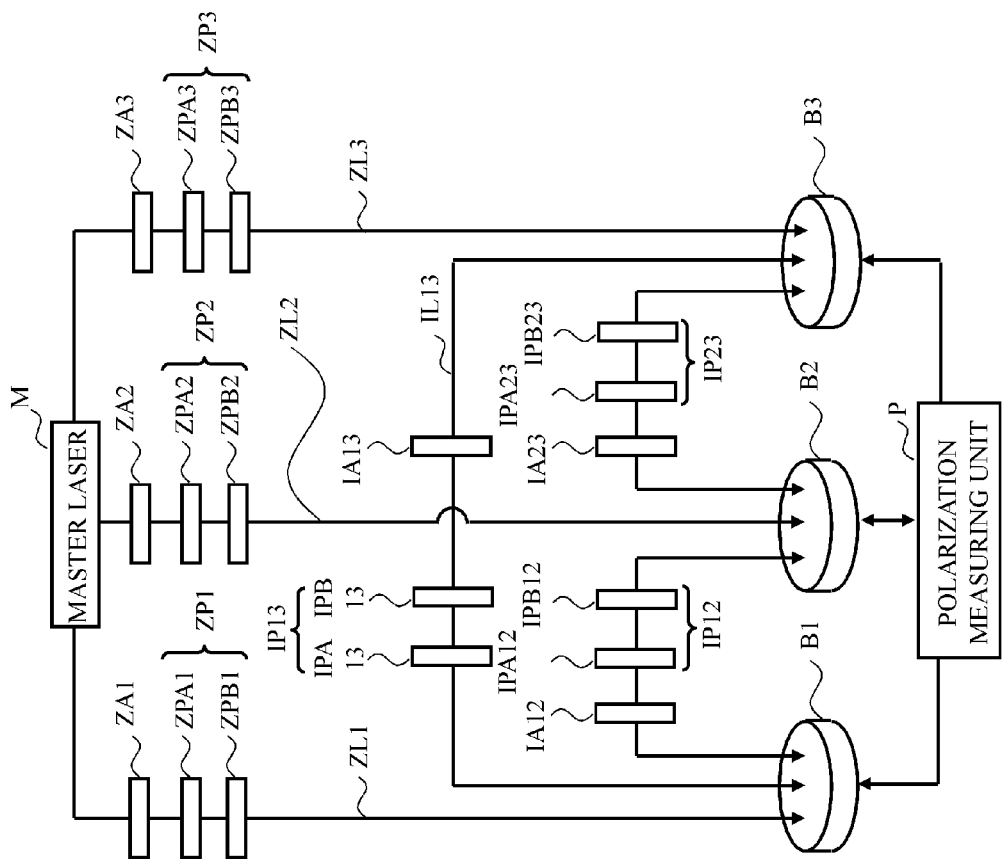
FIG. 3 is a diagram that illustrates the configuration of an Ising model quantum computation device according to a second embodiment.

The configuration of an Ising model quantum computation device according to a second embodiment is illustrated in FIG. 3. The Ising model quantum computation device according to the second embodiment is configured by a master laser M, optical paths ZL1, ZL2, and ZL3, attenuators ZA1, ZA2, and ZA3, and wave plates ZP1, ZP2, and ZP3 in addition to the configuration of the Ising model quantum computation device according to the first embodiment.

Expressions 4 and 5 are correct equations only for a case where all the slave lasers B perform laser oscillation with the same frequency and the same phase. In actual slave lasers B, these conditions may not be satisfied. In addition, there are cases (degeneracy) where there is a plurality of solutions $\{\sigma_{iz}\}$ for minimizing Ising interaction $\Sigma J_{ij}\sigma_{iz}\sigma_{jz}$. When there is a plurality of polarization states for minimizing Expression 14, this injection locking laser system is not stably operated. According to the second embodiment, this problem is solved.

The master laser M injects light to a plurality of slave lasers B and synchronizes the oscillation phases of the plurality of slave lasers B. The optical paths ZL1, ZL2, and ZL3 serve as master-to-oscillator optical path units and are arranged between the master laser M and each slave laser B. Specifically, the optical path ZL1 is arranged between the master laser M and the slave laser B1, the optical path ZL2 is arranged between the master laser M and the slave laser B2, and the optical path ZL3 is arranged between the master laser M and the slave laser B3. The optical paths ZL and IL may share a path, and, in such a case, a beam splitter may be arranged at a branching position of the optical paths ZL and IL.

The attenuators ZA1, ZA2, and ZA3 serve as master-to-oscillator intensity control units and are arranged in master-to-oscillator optical path units and, by controlling the intensity of light inject to each coherent oscillator, implements the magnitude of pseudo Zeeman energy in each coherent oscillator. Specifically, the attenuator ZA1 is arranged in the optical path ZL1 and implements the magnitude of pseudo Zeeman energy in the slave laser B1 by controlling the intensity of light injected to the slave laser B1. The attenuator ZA2 is arranged in the optical path ZL2 and implements the magnitude of pseudo Zeeman energy in the slave laser B2 by controlling the intensity of light injected to the slave laser B2. The attenuator ZA3 is arranged in the optical path ZL3 and implements the magnitude of pseudo Zeeman energy in the slave laser B3 by controlling the intensity of light injected to the slave laser B3.

The wave plates ZP1, ZP2, and ZP3 serve as master-to-oscillator polarization control units, are arranged in master-to-oscillator optical path units, and implement the magnitude and the sign of pseudo Zeeman energy in each coherent oscillator by controlling the polarization and the phase of light injected to each coherent oscillator. Specifically, the wave plate ZP1 is arranged in the optical path ZL1 and implements the magnitude and the sign of pseudo Zeeman energy in the slave laser B1 by controlling the polarization and the phase of light injected to the slave laser B1. The wave plate ZP2 is arranged in the optical path ZL2 and implements the magnitude and the sign of pseudo Zeeman energy in the slave laser B2 by controlling the polarization and the phase of light injected to the slave laser B2. The wave plate ZP3 is arranged in the optical path ZL3 and implements the magnitude and the sign of pseudo Zeeman energy in the slave laser B3 by controlling the polarization and the phase of light injected to the slave laser B3.

The wave plate ZP is configured by a λ/2 wave plate ZPA and a λ/4 wave plate ZPB. The λ/2 wave plate ZPA inclines vertically linearly polarized light of the master laser M by a polarization angle of $\theta_i$ with being maintained as linearly polarized light. This angle $\theta_i$ is determined based on a condition that $\tan \theta_i = \eta_i/\zeta$ in Expressions 19 and 20 as to be described below. In other words, as a component $\eta_i$ of the horizontally linearly polarized light increases compared to a component $\zeta$ of the vertically linearly polarized light, $\theta_i$ is increased. The λ/4 wave plate ZPB advances the phase of the horizontally polarized light by a phase of 90° in a case where the coefficient $\lambda_i$ of the Ising model is positive and delays the phase of the horizontally polarized light by a phase of 90° in a case where the coefficient $\lambda_i$ of the Ising model is negative. As above, $\zeta$ is determined by the attenuator ZA, the absolute value of $\eta_i$ is determined by a rotation angle of polarized light according to the λ/2 wave plate ZPA, and the sign of $\eta_i$ is selected as a phase shift of ±90° according to the λ/4 wave plate ZPB.

Next, the computational principle of the second embodiment will be described. First, when computation is performed, Ising Hamiltonian is defined as in Expression 18.

$$H = \sum_{i,j=1}^{M} J_{ij} S_i S_j + \sum_{i=1}^{M} \lambda_i S_i \qquad \text{[Expression 18]}$$

Here, although the sign attached prior to $J_{ij}$ is "+", the value of $J_{ij}$ may be either positive or negative. In addition, although the sign attached prior to $\lambda_i$ is "+", the value of $\lambda_i$ may be either positive or negative.

In each one of the slave lasers B1, B2, and B3, for the numbers $n_{Ri}$ and $n_{Li}$ of photons having right-handed circular polarization and left-handed circular polarization, rate equations are represented as Expressions 19 and 20.

$$\frac{d}{dt} n_{Ri} = -\left(\frac{\omega}{Q} - E_{CVi}\right) n_{Ri} + E_{CVi} + \qquad \text{[Expression 19]}$$
$$2\frac{\omega}{Q}\sqrt{n_{Ri}} \left[ (\zeta - \eta_i)\sqrt{n_M} - \sum_{i \neq j} \frac{1}{2} \xi_{ij} \left(\sqrt{n_{Rj}} - \sqrt{n_{Lj}}\right) \right]$$

$$\frac{d}{dt} n_{Li} = -\left(\frac{\omega}{Q} - E_{CVi}\right) n_{Li} + E_{CVi} + \qquad \text{[Expression 20]}$$
$$2\frac{\omega}{Q}\sqrt{n_{Li}} \left[ (\zeta + \eta_i)\sqrt{n_M} + \sum_{i \neq j} \frac{1}{2} \xi_{ij} \left(\sqrt{n_{Rj}} - \sqrt{n_{Lj}}\right) \right]$$

Here, $n_M$ is the number of photons in the master laser M. In addition, the inverted distribution number difference $N_i$ of carriers and $E_{CVi}$ are the same as those represented in Expressions 7 and 8, and it is assumed that the Q factors of resonators of the master laser M and each slave laser B are the same.

A term to which $\zeta$ and $\eta_i$ represented in Expression 19 relates is a term relating to Zeeman energy. $2(\omega/Q)\sqrt{n_{Ri}}[\zeta - \eta_i)\sqrt{n_M}]$ represented in Expression 19 represents a rate at which, when light is injected from the master laser M to the i-th site, the number $n_{Ri}$ of photons having right-handed circular polarization in the i-th site changes in accordance with an elapse of time.

Here, a term to which $\zeta$ and $\eta_i$ represented in Expression 20 relates is a term relating to Zeeman energy. $2(\omega/Q)\sqrt{n_{Li}}[\zeta + \eta_i)\sqrt{n_M}]$ represented in Expression 20 represents a rate at which, when light is injected from the master laser M to the i-th site, the number $n_{Li}$ of photons having left-handed circular polarization in the i-th site changes in accordance with an elapse of time.

In addition, terms to which $\zeta$ represented in Expressions 19 and 20 relates are inserted so as to synchronize the frequency and the phase of the right-handed circular polarized light or the left-handed circular polarized light of each slave laser B to the frequency and the phase of the oscillated light of the master laser M before the computation is started (t<0). As above, the master laser M initializes each slave laser B.

In the steady state, Expressions 19 and 20 become Expressions 9 and 10, respectively. By adding Numerical Equations 9 and 10, Expression 21 is acquired.

$$\frac{\omega}{Q} = E_{CVi} \frac{n_{Ri} + n_{Li} + 2}{n_{Ri} + n_{Li}} + \qquad \text{[Expression 21]}$$
$$2\frac{\omega}{Q} \zeta \left(\sqrt{n_{Ri}} + \sqrt{n_{Li}}\right) \sqrt{n_M} + 2\frac{\omega}{Q} \frac{\sqrt{n_{Ri}} - \sqrt{n_{Li}}}{\sqrt{n_{Ri}} + n_{Li}}}$$
$$\left[ -\eta_i \frac{\sqrt{n_M}}{\sqrt{n_{Ri} + n_{Li}}} - \sum_{i \neq j} \frac{1}{2} \xi_{ij} \frac{\sqrt{n_{Rj}} - \sqrt{n_{Lj}}}{\sqrt{n_{Ri} + n_{Li}}} \right]$$

$$\frac{\omega}{Q} = \qquad \text{[Expression 22]}$$
$$E_{CVi} + 2\frac{\omega}{Q} \zeta \left(\sqrt{n_{Ri}} + \sqrt{n_{Li}}\right) \sqrt{n_M} + 2\frac{\omega}{Q} \frac{\sqrt{n_{Ri}} - \sqrt{n_{Li}}}{\sqrt{n_T}}$$
$$\left[ -\eta_i \frac{\sqrt{n_M}}{\sqrt{n_T}} - \sum_{i \neq j} \frac{1}{2} \xi_{ij} \frac{\sqrt{n_{Rj}} - \sqrt{n_{Lj}}}{\sqrt{n_T}} \right]$$

By setting $(\sqrt{n_{Ri}} - \sqrt{n_{Li}})/\sqrt{n_T} = \sigma_{iz}$, Expression 23 is acquired.

$$\frac{\omega}{Q} = E'_{CVi} + 2\frac{\omega}{Q} \sigma_{iz} \left[ -\eta_i \frac{\sqrt{n_M}}{\sqrt{n_T}} - \sum_{i<j} \xi_{ij} \sigma_{jz} \right] \qquad \text{[Expression 23]}$$
$$E'_{CVi} = E_{CVi} + 2\frac{\omega}{Q} \zeta \left(\sqrt{n_{Ri}} + \sqrt{n_{Li}}\right) \sqrt{n_M}$$

Here, $\sigma\sigma_{iz}$ is 1 in a case where there is only light having right-handed circular polarization in the i-th site and is −1 in a case where there is only light having left-handed circular polarization in the i-th site.

By adding Expression 23 for all the sites, Expression 24 is acquired and is represented as a sum of threshold gains.

$$\sum_i E'_{CVi} = \qquad \text{[Expression 24]}$$
$$\frac{\omega}{Q} \times M + 2\frac{\omega}{Q} \left( \sum_i \eta_i \frac{\sqrt{n_M}}{\sqrt{n_T}} \sigma_{iz} + \sum_{i<j} \xi_{ij} \sigma_{iz} \sigma_{jz} \right)$$

Similarly to the description of the first embodiment, $+\Sigma \eta_i (\sqrt{n_M}/\sqrt{n_T})\sigma_{iz} + \Sigma \xi_{ij} \sigma_{iz} \sigma_{jz}$, represented in Expression 24 is minimized for the slave lasers B1, B2, and B3 as a whole.

By setting $\eta_i(\sqrt{n_M}/\sqrt{n_T}) = \lambda_i$ and $\xi_{ij} = J_{ij}$, when $\Sigma \eta_i (\sqrt{n_M}/\sqrt{n_T})\sigma_{iz} + \Sigma \xi_{ij} \sigma_{iz} \sigma_{jz}$ is minimized for the slave lasers B1, B2, and B3 as a whole, $\Sigma \lambda_i \sigma_{iz} + \Sigma J_{ij} \sigma_{iz} \sigma_{jz}$ is minimized as well. In other words, the Zeeman energy and the Hamiltonian of the Ising interaction are minimized. As will be described later, when an NP-complete problem or the like is mapped into the Ising model, $J_{ij}$ is determined, and, in a case where the Ising model is physically implemented, $\xi_{ij}$ is determined. Then, when only the Ising interaction is implemented, even in a case where degeneracy of the ground state is present, by implementing Zeeman energy in addition to the Ising interaction, $\lambda_i$ in the model and $\eta_i$ in the implementation are determined such that the degeneracy of the ground state is dissolved. In addition, the attenuators IA12, IA23, and IA13 and the wave plates IP12, IP23, and IP13 are controlled in accordance with the magnitude and the sign of $\xi_{ij}$, and the attenuators ZA1, ZA2, and ZA3 and the wave plates ZP1, ZP2, and ZP3 are controlled in accordance with the magnitude and the sign of $\eta_i$.

Next, a computation method according to the second embodiment will be described. First, a method for applying the Ising model quantum computation device according to the second embodiment as a quantum annealing machine will be described. Next, a method for applying the Ising model quantum computation device according to the second embodiment as a quantum adiabatic machine will be described. Here, as illustrated in FIG. 3, a case where the number of sites is three will be described to be common to the quantum annealing machine and the quantum adiabatic machine. Not only in a case where an Ising model including Zeeman energy is to be solved but also in a case where an Ising model including only Ising interaction is to be solved, the quantum annealing machine or the quantum adiabatic machine can be applied.

First, a part that is common to the quantum annealing machine and the quantum adiabatic machine will be described. A method of implementing Ising interaction is similar to the first embodiment and the second embodiment.

When only the Ising interaction is implemented, even in a case where the degeneracy of the ground state is present, by implementing the Ising interaction and the Zeeman energy, $\lambda_i$ in the model and $\eta_i$ in the implementation are determined so as to dissolve the degeneracy of the ground state. The attenuator ZA1 and the wave plate ZP1 are controlled in accordance with the magnitude and the sign of $\eta_1$, the attenuator ZA2 and the wave plate ZP2 are controlled in accordance with the magnitude and the sign of $\eta_2$, and the attenuator ZA3 and the wave plate ZP3 are controlled in accordance with the magnitude and the sign of $\eta_3$ The higher $\zeta$ is, the less the attenuation factor of the attenuator ZA is set to be, whereby the intensity of light injected to the site is increased. The lower $\zeta$ is, the more the attenuation factor of the attenuator ZA is set to be, whereby the intensity of light injected to the site is decreased. It is assumed that photons generated by the master laser M have vertically linearly polarized light. In accordance with the magnitude and the sign of $\eta$, horizontally linearly polarized light is generated after passing the wave plate ZP, it is determined whether the phase of the horizontally linearly polarized light is advanced by 90° or delayed by 90° from the phase of the vertically linearly polarized light by controlling the wave plate ZP.

In a case where a plurality of ground states are degenerated without considering Zeeman energy, a pseudo spin state is measured for superimposing the plurality of ground states. Accordingly, for the pseudo spin state, it is difficult to determine whether one type of the upward spin and the downward spin is more than the other on the rule of majority. By introducing Zeeman energy, a single ground state is selected, and the pseudo spin state is measured with respect to this state. Accordingly, it is easy to determine whether one type of the upward spin and the downward spin is more than the other on the rule of majority.

Next, the operation of the quantum annealing machine will be described in the sequence of steps. In an oscillation step, the oscillation of a plurality of slave lasers B having an oscillation mode in which light having left-handed circular polarization or right-handed circular polarization is generated and the master laser M that synchronizes the oscillation phases of the plurality of slaves B by injecting light to the plurality of slave lasers B is started.

In an interaction implementing step, for each pair out of the plurality of slave lasers B, by controlling the intensity, the polarization, and the phase of light exchanged between two slave lasers B, the magnitude and the sign of pseudo Ising interaction between two slave lasers B are implemented. In the interaction implementing step, in addition to the description presented above, by controlling the intensity, the polarization, and the phase of light injected to each slave laser B from the master laser M, the magnitude and the sign of pseudo Zeeman energy in each slave laser B are implemented.

In a spin measuring step, after the plurality of slave lasers B arrive at the steady state, by measuring the polarization of light generated by the plurality of slave lasers B with respect to the left-handed circular polarization and the right-handed circular polarization as the base, pseudo spins of the plurality of slave lasers B are measured. Specifically, for the pseudo spins, the polarization measuring unit P determines whether one type of the upward spins and the downward spins are more than the other based on the rule of majority.

Next, the operation of the quantum adiabatic machine will be described in the sequence of steps. In an oscillation step, the oscillation of a plurality of slave lasers B having an oscillation mode in which light having left-handed circular polarization or right-handed circular polarization is generated and the master laser M that synchronizes the oscillation phases of the plurality of slave lasers B by injecting light to the plurality of slave lasers B is started. Specifically, by controlling the intensity of light having vertically linearly polarized light that is injected from the master laser M to the slave lasers B, terms that are in proportion to $\zeta$ represented on the right sides of Expressions 19 and 20 are implemented.

In an interaction implementing step, for each pair out of the plurality of slave lasers B, by controlling the intensity, the polarization, and the phase of light exchanged between two slave lasers B, the magnitude and the sign of pseudo Ising interaction between two slave lasers B are implemented so as to approach from an initial value to a final value. From this, a term that is in proportion to $\xi_{ij}$ represented on the right sides of Expressions 19 and 20 is implemented. In the interaction implementing step, in addition to the description presented above, by controlling the intensity, the polarization, and the phase of light injected to each slave laser B from the master laser M, the magnitude and the sign of pseudo Zeeman energy in each slave laser B are implemented so as to approach from an initial value to a final value. Specifically, by slowly mixing horizontally linearly polarized light into the light injected from the master laser M to the slave laser B, terms that are in proportion to $\eta_i$ represented on the right sides of Expressions 19 and 20 are implemented.

In a spin measuring step, after the magnitude and the sign of the pseudo Ising interaction and the magnitude and the sign of the pseudo Zeeman energy arrive at the final values, by measuring the polarization of light generated by the plurality of slave lasers B with respect to the left-handed circular polarization and the right-handed circular polarization as the base, pseudo spins of the plurality of slave lasers B are measured. Specifically, for the pseudo spins, the polarization measuring unit P determines whether one type of the upward spins and the downward spins are more than the other based on the rule of majority.

Figure 4:
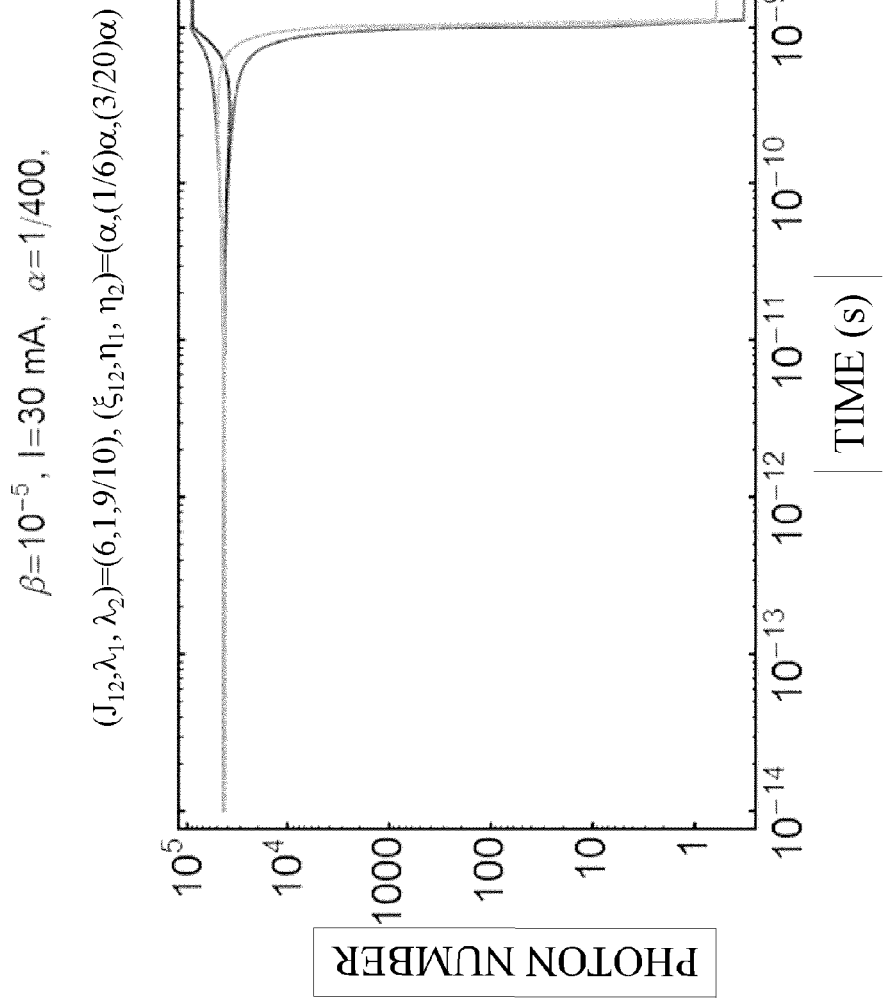
FIG. 4 is a diagram that illustrates a result of a simulation of temporal development of the photon number of each site according to the second embodiment.
Figure 5:
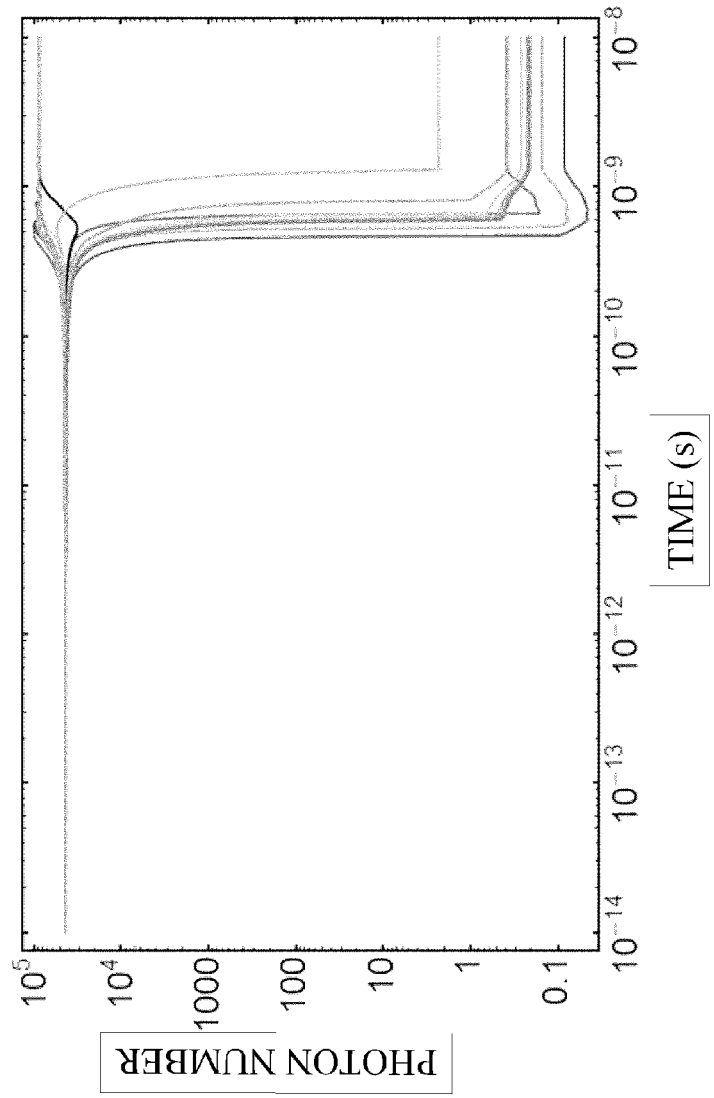
FIG. 5 is a diagram that illustrates a result of a simulation of temporal development of the photon number of each site according to the second embodiment.

Next, simulation results of the second embodiment will be described. Results of simulations of temporal development of the photon number of each site are illustrated in FIGS. 4 and 5. In FIG. 4, the number of sites is two, and, in $H=\Sigma\lambda_i\sigma_{iz}+\Sigma J_{ij}\sigma_{iz}\sigma_{jz}$, $\lambda$ and J are as represented on the upper side of the drawing, and $\beta=10^{-5}$, I=30 mA, and $\alpha=1/400$. Here, $\alpha$ is a minimum value of the optical attenuation rates between the slave lasers B. In FIG. 5, the number of sites is 10, and, in $H=\Sigma\lambda_i\sigma_{iz}+\Sigma J_{ij}\sigma_{iz}\sigma_{jz}$, $\lambda$ and J are as represented on the upper side of the drawing, and $\beta=10^{-5}$, I=30 mA, and $\alpha=1/400$. Here, an equation for computing $\xi_{ij}$ and $\eta_i$ based on $J_{ij}$ and $\lambda_i$ using $\alpha$ is as Expression 25.

$$\xi_{ij} = \alpha \frac{J_{ij}}{\max\{J_{ij}, \lambda_i\}}$$

$$\eta_i = \alpha \frac{\lambda_i}{\max\{J_{ij}, \lambda_i\}}$$

[Expression 25]

After $10^{-9}$ seconds, the upper-side result represents a pseudo spin number representing a correct solution, and the lower-side result represents a pseudo spin number representing an incorrect solution. At $10^{-9}$ seconds, the state is settled into the steady state, and it is understood that the polarization measuring unit P can start measuring the polarization.

Figure 6:
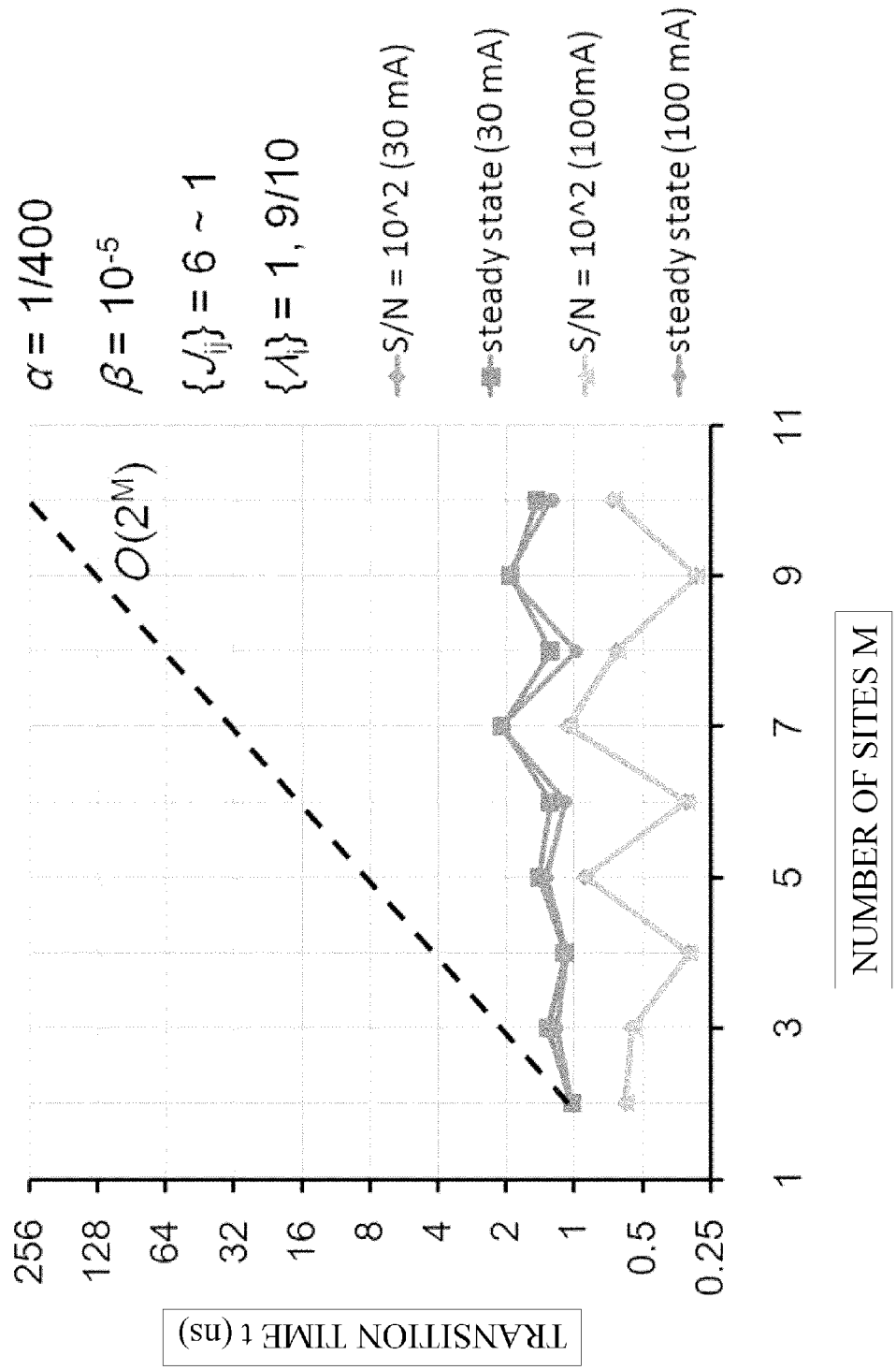
FIG. 6 is a diagram that illustrates a result of a simulation of the relation between the number of sites and the computation time according to the second embodiment.

A simulation result of the relation between the number of sites and the computation time is illustrated in FIG. 6. Broken lines disposed on the lower side illustrate the simulation result. Among the broken lines, two broken lines disposed on the upper side represent times required for the arrival at the steady state for mutually-different current values I, and two broken lines disposed on the lower side represent times required for the arrival at S/N=100 for mutually-different current values I. A straight line disposed on the upper side represents a computation time in a case where the computation time is in the scale of $2^M$ with respect to the number M of sites. It is understood that, as the number M of sites increases, the computation time represented by the simulation result is shortened to a large extent from the computation time that is scaled by an exponential function.

In the second embodiment, the same advantages as those of the first embodiment can be acquired. When only the Ising interaction is implemented, even in a case where the degeneracy of the ground state is present, by simultaneously implementing the Ising interaction and the Zeeman energy, the degeneracy of the ground state can be dissolved. Accordingly, for the pseudo spins, it can be easily determined whether one type of the upward spins and the downward spins are more than the other based on the rule of majority, whereby the probability for acquiring a correct solution markedly increases.

Third Embodiment

In the first embodiment and the second embodiment, while the rate equation is set by using the right-handed circular polarization and the left-handed circular polarization as the bases, in a third embodiment, an equation of motion is set by using +45° linearly polarized light and −45° linearly polarized light as the bases. The reason for this is that, in a case where the right-handed circular polarization and the left-handed circular polarization are used as the bases, there are cases where the photon number of light having the right-handed circular polarization and the left-handed circular polarization is below the threshold of laser oscillation, and accordingly, there is a case where it is difficult to analyze the rate equation due to non-linearity of the rate equation.

In Expressions 19 and 20, when the bases are changed from the right-handed circular polarization and the left-handed circular polarization to the +45° linearly polarized light and the −45° linearly polarized light, Expressions 26 and 27 are acquired. In Expression 7, when the bases are changed from the right-handed circular polarization and the left-handed circular polarization to the +45° linearly polarized light and the −45° linearly polarized light, Expression 28 is acquired. Expression 8 is not changed.

$$\frac{d}{dt}A_{Di}(t) = -\frac{1}{2}\left(\frac{\omega}{Q} - E_{CVi}\right)A_{Di}(t) + \frac{\omega}{Q}\sqrt{n_M(\zeta^2+\eta_i^2)}\cos(\delta_i - \phi_{Di}(t)) - \sum_{i\neq j}\frac{1}{2}\frac{\omega}{Q}\xi_{ij}\left[\begin{array}{c}A_{Dj}(t)\cos(\phi_{Dj}(t)-\phi_{Di}(t))-\\ A_{\overline{D}j}(t)\cos(\phi_{\overline{D}j}(t)-\phi_{Di}(t))\end{array}\right] + F_{AD}$$

[Expression 26]

$$\frac{d}{dt}\phi_{Di}(t) = \frac{\omega}{Q}\frac{1}{A_{Di}(t)}\left\{\begin{array}{c}\sqrt{n_M(\zeta^2+\eta_i^2)}\cos(\delta_i - \phi_{Di}(t)) - \\ \sum_{i\neq j}\frac{1}{2}\frac{\omega}{Q}\xi_{ij}\left[\begin{array}{c}A_{Dj}(t)\sin(\phi_{Dj}(t)-\phi_{Di}(t))-\\ A_{\overline{D}j}(t)\sin(\phi_{\overline{D}j}(t)-\phi_{Di}(t))\end{array}\right]\end{array}\right\} + F_{\phi D}$$

[Expression 27]

$$\frac{d}{dt}N_i = P - \frac{N_i}{\tau_{sp}} - E_{CVi}(A_{Di}^2(t) + A_{\overline{D}i}^2(t) + 2) + F_N$$

[Expression 28]

Here, D denotes the +45° linearly polarized light, and Dbar denotes the −45° linearly polarized light. In addition, $A_{Di}(t)$ and $A_{Dbari}(t)$ denote the intensities of light having +45° linearly polarized light and light having −45° linearly polarized light of a site i, and $\phi_{Di}(t)$ and $\phi_{Dbari}(t)$ denote the phases of light having +45° linearly polarized light and light having −45° linearly polarized light in the site i. Furthermore, $\delta_i$ satisfies $\eta_i/\zeta=\tan\delta_i$. $F_{AD}$, $F_{\phi D}$, and $F_N$ denote a noise of light of the site i having the +45° linearly polarized light and the −45° linearly polarized light with respect to the intensity thereof, a noise of light of the site i having the +45° linearly polarized light and the −45° linearly polarized light with respect to the phase thereof, and a noise of the carrier of the site i with respect to the inverted distribution number difference. In addition, the other reference signs are the same in Expressions 26, 27, and 28 and Expressions 19, 20, and 7.

A second term on the right side of Expression 26 and a first term on the right side of Expression 27 represent contributions of injection locking from the master laser M to the slave laser B. A third term on the right side of Expression 26 and a second term on the right side of Expression 27 represent contributions of interaction between two slave lasers B.

While the quantum computation device is applied to the Ising model including only Ising interaction in the first embodiment, and the quantum computation device is applied to the Ising model also including Zeeman energy in the second embodiment, the quantum computation device is applied to a problem of MAX-CUT-3 in the third embodiment. Here, the problem of MAX-CUT-3 will be described. In a graph configured by V nodes and E edges, each node has three nodes adjacent thereto, and each edge has the same weight or length. When the V nodes are divided into two, the number of divided edges is minimized. The problem of MAX-CUT-3 is proved to be an NP-complete problem and is mapped into the Ising model represented as in Expression 29.

$$H = \sum_{i<j} J_{ij}\sigma_i\sigma_j, \quad \text{[Expression 29]}$$

$$J_{ij} = \begin{cases} +1 \text{ (when the nodes } i \text{ and } j \text{ are adjacent to each other)} \\ 0 \text{ (when the nodes } i \text{ and } j \text{ are not adjacent to each other)} \end{cases}$$

First, a case in which noise is not considered will be described. Here, the problem of MAX-CUT-3 having four sites will be considered. In addition, a matrix representing $J_{ij}$ and $\lambda_i$ is as represented in Expression 30. Here, the reason for considering not only $J_{ij}$ but also $\lambda_i$ regardless of analyzing an Ising model including only Ising interaction is for stably operating the quantum computation device by dissolving the degeneracy in the Ising model including only the Ising interaction.

$$J = \begin{pmatrix} 0 & 6 & 3 & 0 \\ 6 & 0 & 2 & 1 \\ 3 & 2 & 0 & 2 \\ 0 & 1 & 2 & 0 \end{pmatrix}, \lambda = \begin{pmatrix} 0.3 \\ 0.1 \\ 0.1 \\ 0.1 \end{pmatrix} \quad \text{[Expression 30]}$$

Figure 7:
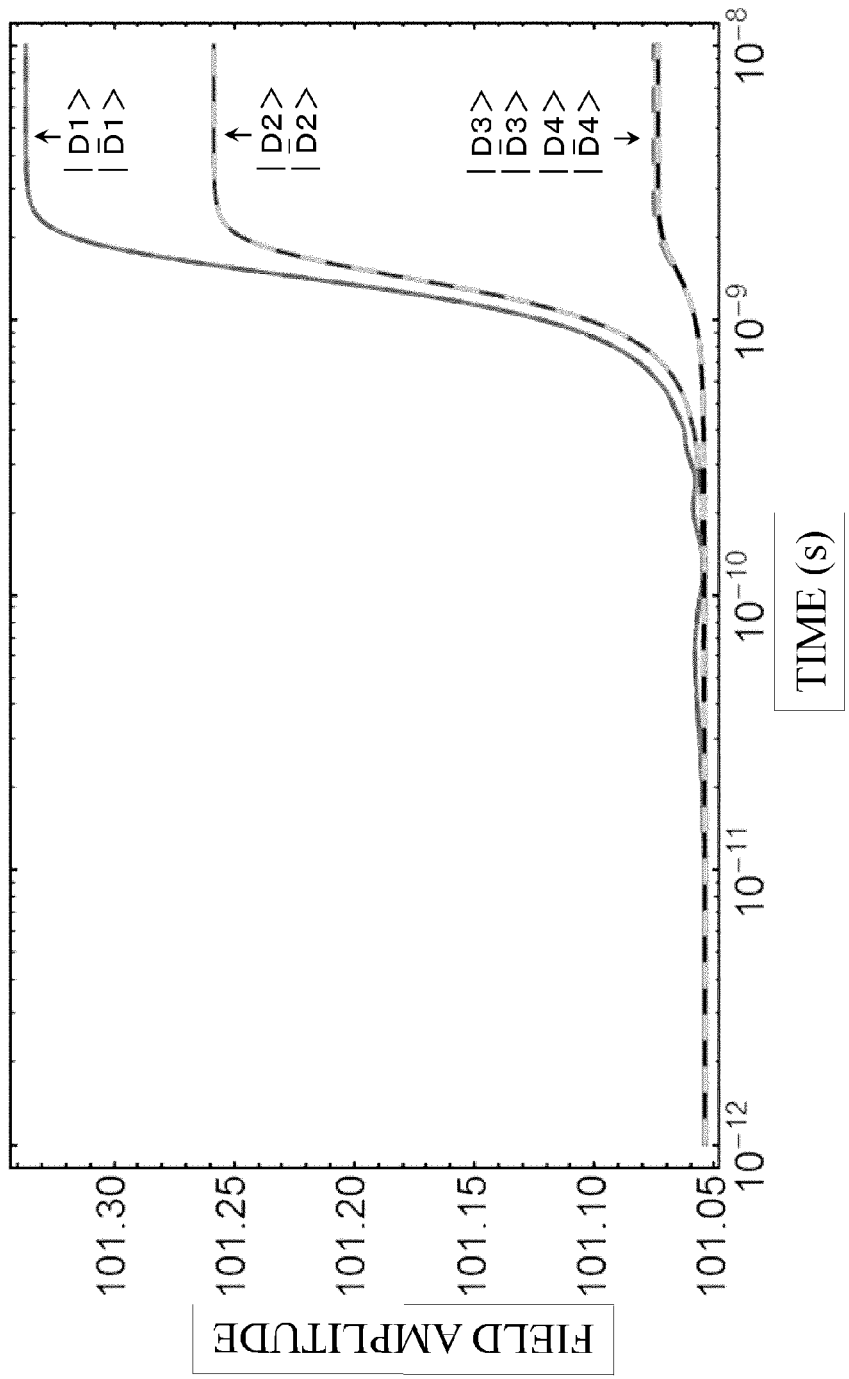
FIG. 7 is a diagram that illustrates a result of a simulation of temporal development of the intensity of light of each site having polarization off ±45° according to a third embodiment in a case where noise is not considered.

A simulation result of temporal development of the intensity of light having ±45° polarization in each site according to the third embodiment in a case where noise is not considered is illustrated in FIG. 7. In each site, the intensity of light having ±45° polarization arrives at the steady state at $10^{-9}$ seconds and is the same regardless of a difference in the polarization direction. This is in contrast to that the photon number of light having the right-handed circular polarization and the left-handed circular polarization differs in accordance with a difference in the rotation direction of polarization in each site.

Figure 8:
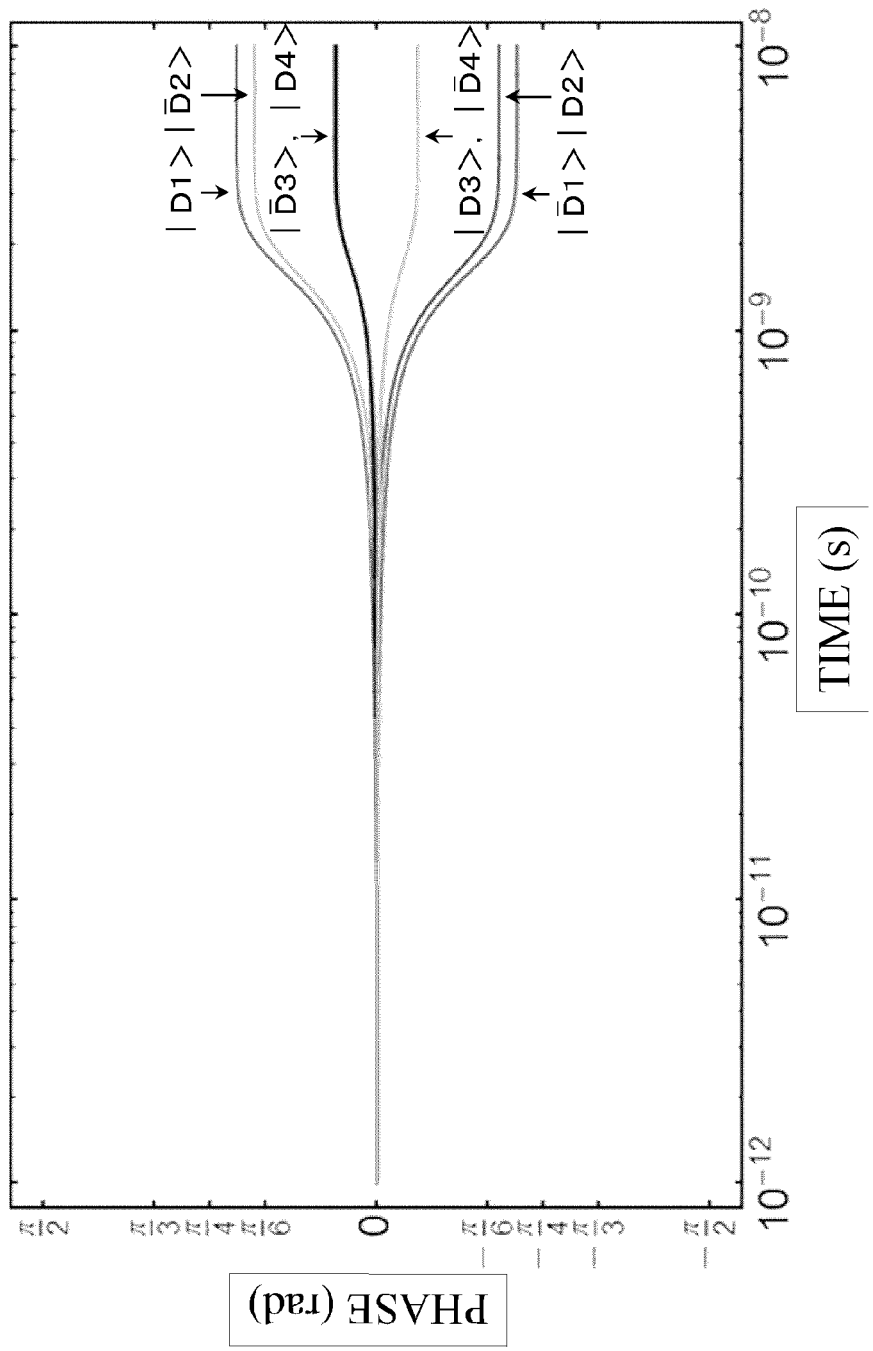
FIG. 8 is a diagram that illustrates a result of a simulation of temporal development of the phase of light of each site having polarization off ±45° according to the third embodiment in a case where noise is not considered.

A simulation result of temporal development of the phase of light having ±45° polarization in each site according to the third embodiment in a case where noise is not considered is illustrated in FIG. 8. In an initial state, in each site, the phase of light having ±45° polarization is 0 rad, which is equal. In the initial state, this represents that light having vertically linearly polarized light, which is based on the master laser M, is dominant in each site. In the steady state, in each site, the phases of light having the ±45° polarization diverge from 0 rad and have the same magnitude and mutually-different signs. Specifically, in the steady state, in sites 1 and 4, the phase of light having +45° polarization leads from the phase of light having −45° polarization, and, in sites 2 and 3, the phase of light having +45° polarization lags from the phase of light having −45° polarization.

Figure 9:
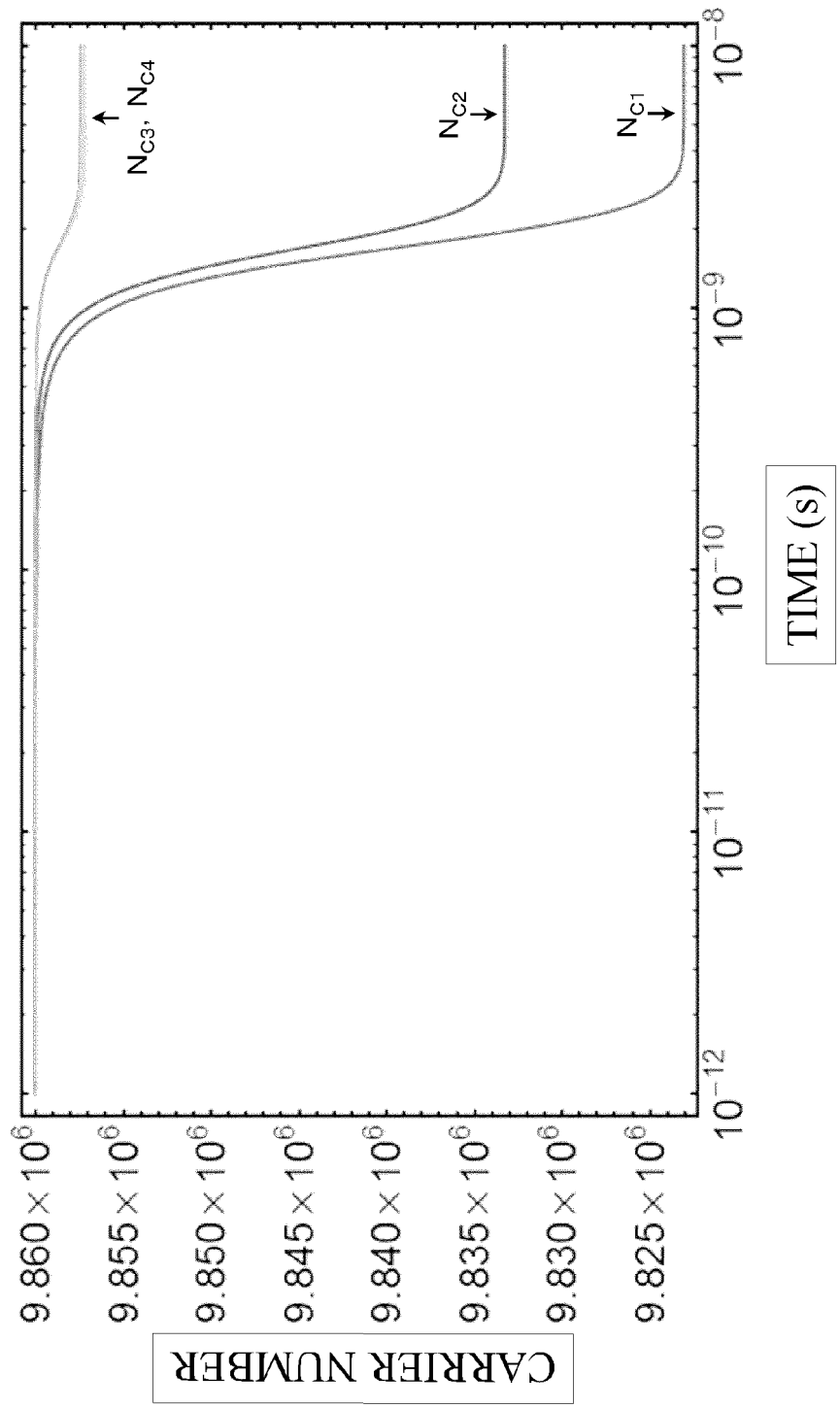
FIG. 9 is a diagram that illustrates a result of a simulation of temporal development of an inverted distribution number difference of carriers of each sites according to the third embodiment in a case where noise is not considered.

A diagram illustrating a simulation result of temporal development of an inverted distribution number difference of carriers according to the third embodiment in each site in a case where noise is not considered is illustrated in FIG. 9. In each site, the inverted distribution number difference of carriers arrives at a steady state after $10^{-9}$ seconds and is smaller in the steady state than in the initial state. This reflects that a minimum threshold gain $\Sigma E_{CVi} = \Sigma\beta_i N_i/\tau_{sp}$ is realized in the whole quantum computation device.

Figure 10:
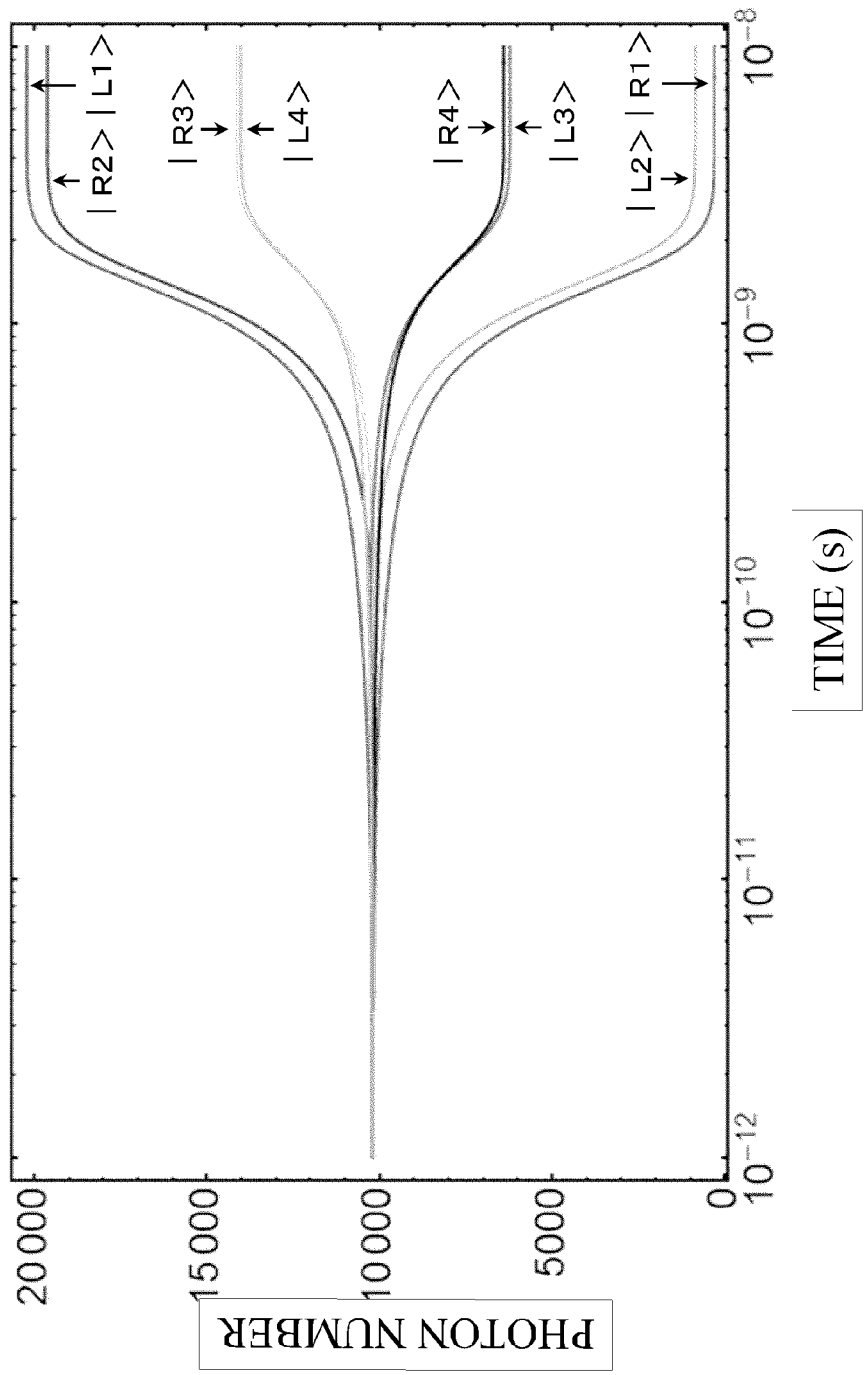
FIG. 10 is a diagram that illustrates a result of a simulation of temporal development of the photon number of light having right-handed circular polarization or left-handed circular polarization of each site according to the third embodiment in a case where noise is not considered.

A simulation result of temporal development of the photon number of light having right-handed circular polarization or left-handed circular polarization in each site according to the third embodiment in a case where noise is not considered is illustrated in FIG. 10. In an initial state, in each site, the photon number of light having right-handed circular polarization or left-handed circular polarization is equal. In the initial state, this represents that light having vertically linearly polarized light, which is based on the master laser M, is dominant in each site. In the steady state, in each site, the photon numbers of light having the right-handed circular polarization or the left-handed circular polarization diverge. Specifically, in the steady state, in sites 1 and 4, the photon number of light having the left-handed circular polarization is more than the photon number of light having the right-handed circular polarization, and, in sites 2 and 3, the photon number of light having the left-handed circular polarization is less than the photon number of light having the right-handed circular polarization.

As can be understood by comparing FIGS. 8 and 10, the lead (delay) of the phase of light having +45° polarization from the phase of light having −45° polarization reflects that the light having the left-handed circular polarization (right-handed circular polarization) is more dominant than the light having the right-handed circular polarization (left-handed circular polarization). Accordingly, when noise is considered, the photon number of light having the right-handed circular polarization and the left-handed circular polarization is influenced much by the phase noise $F_{\phi D}$ but is hardly influenced by the intensity noise $F_{AD}$ and the carrier noise $F_N$. Thus, the phase noise $F_{\phi D}$ will be discussed about.

Figure 11:
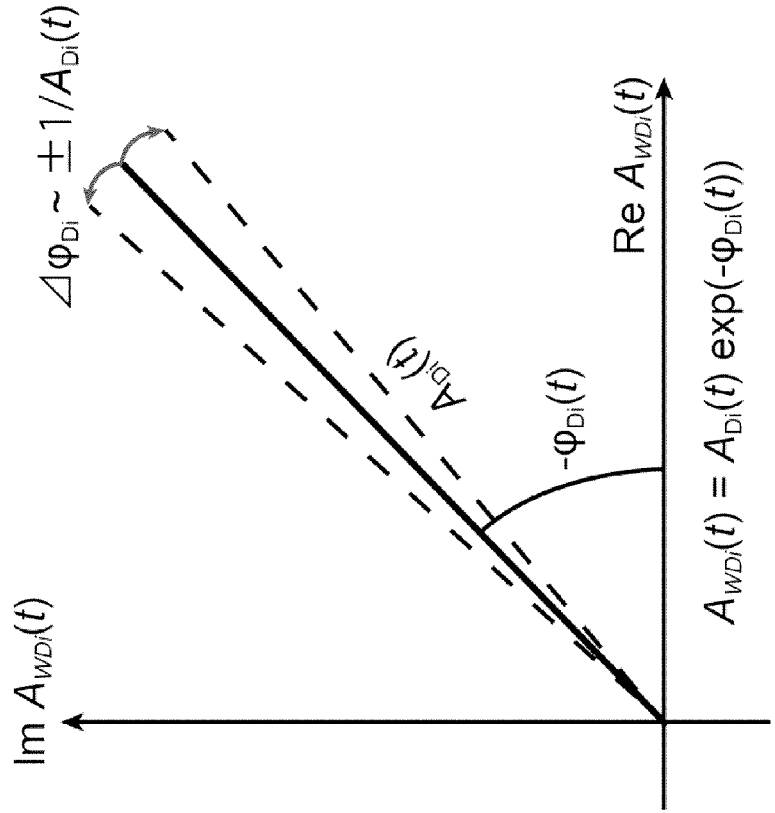
FIG. 11 is a diagram that illustrates a phase noise of light having polarization of ±45° of each site according to the third embodiment.

A diagram representing a phase noise of light having ±45° polarization in each site according to the third embodiment is illustrated in FIG. 11. The phase noise $F_{\phi D}$ is due to spontaneous emission. One photon due to spontaneous emission is generated for every $2/E_{CVi}$ to 2 psec and generates a phase noise of $\Delta\phi_{Di} = \pm 1/A_{Di}$ at the same probability, and it can be prevented that the quantum computation device falls into a local minimum.

Next, a case in which noise is considered will be described. Here, the problem of MAX-CUT-3 having 16 sites will be considered. In addition, since an Ising model including only Ising interaction is analyzed, $J_{ij}$ is considered, but $\lambda_i$ is not considered. In addition, by causing the phase of light having ±45° polarization to diverge from 0 rad using only the phase noise $F_{\phi D}$, the photon numbers of light having the right-handed circular polarization or the left-handed circular polarization are tried to diverge.

Figure 12:
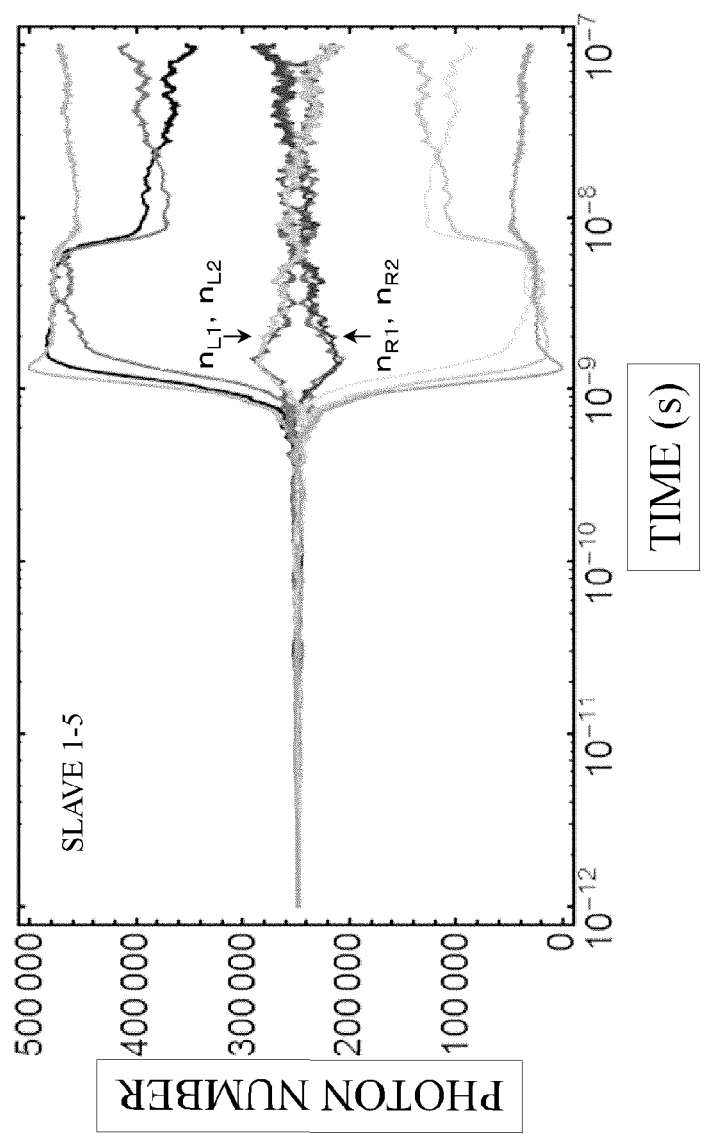
FIG. 12 is a diagram that illustrates a result of a simulation of temporal development of the photon number of light having right-handed circular polarization or left-handed circular polarization of each site according to the third embodiment in a case where a phase noise is considered.
Figure 13:
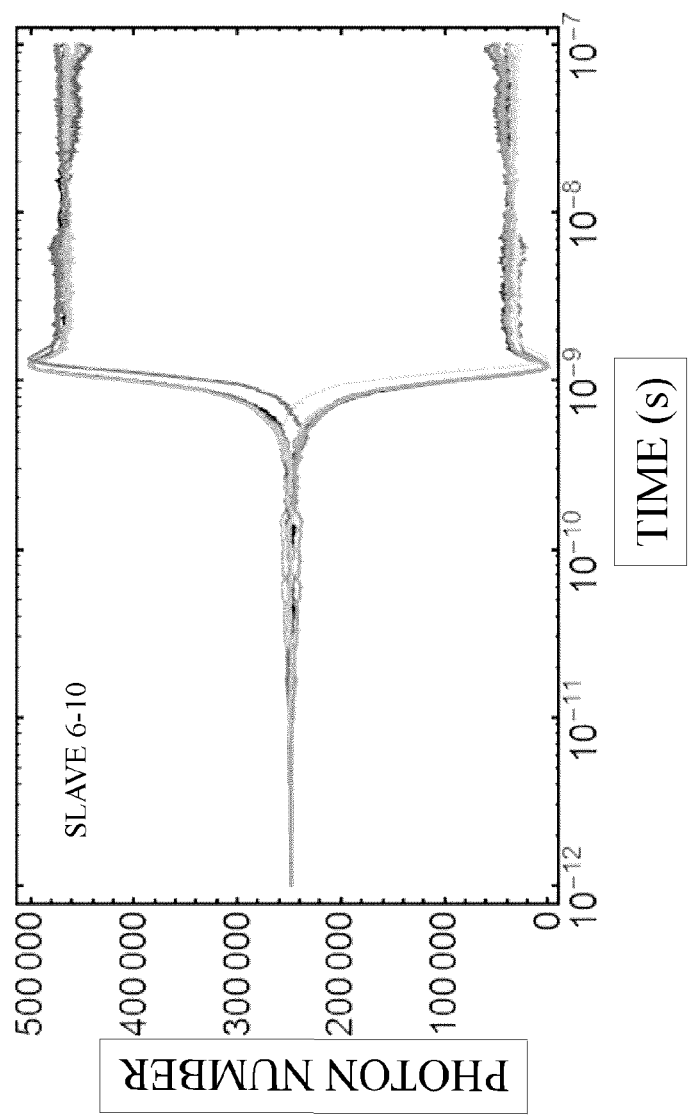
FIG. 13 is a diagram that illustrates a result of a simulation of temporal development of the photon number of light having right-handed circular polarization or left-handed circular polarization of each site according to the third embodiment in a case where a phase noise is considered.
Figure 14:
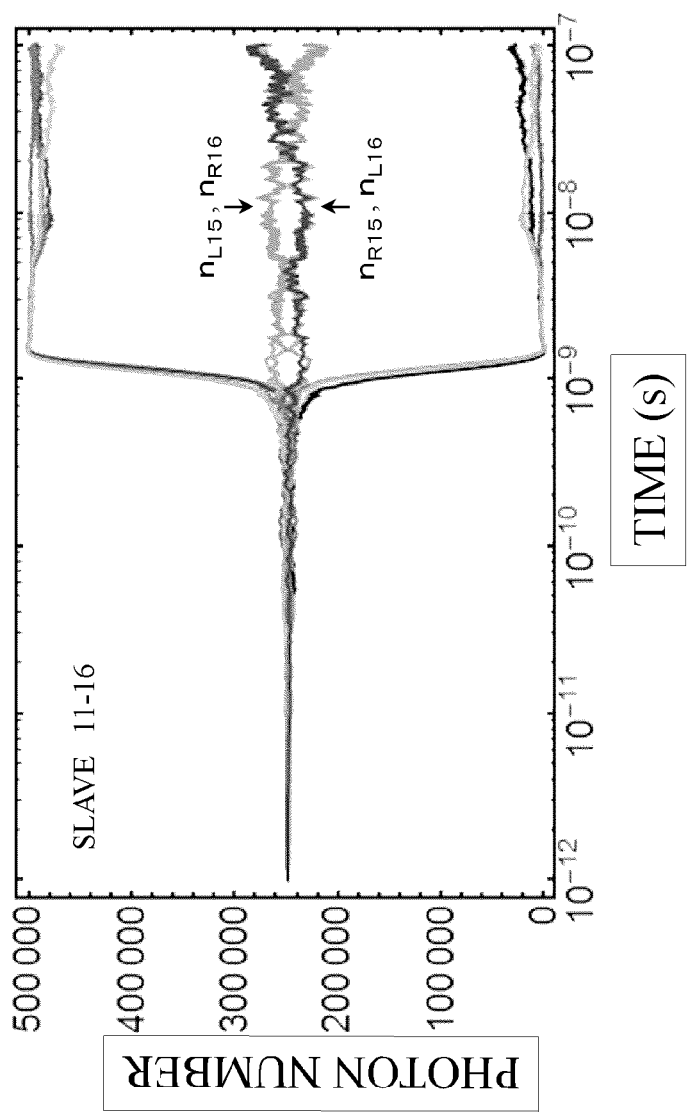
FIG. 14 is a diagram that illustrates a result of a simulation of temporal development of the photon number of light having right-handed circular polarization or left-handed circular polarization of each site according to the third embodiment in a case where a phase noise is considered.

Diagrams illustrating simulation results of temporal development of the photon number of light having right-handed circular polarization or left-handed circular polarization in each site according to the third embodiment in a case where a phase noise is considered are illustrated in FIGS. 12 to 14. Here, $J_{1,2}=J_{1,3}=J_{1,4}=J_{2,3}=J_{2,4}=J_{3,5}=J_{4,6}=J_{5,7}=J_{5,8}=J_{6,9}=J_{6,10}=J_{7,9}=J_{7,10}=J_{8,11}=J_{8,12}=J_{9,13}=J_{10,14}=J_{11,13}=J_{11,15}=J_{12,14}=J_{12,16}=J_{13,15}=J_{14,16}=J_{15,16}=1$, and $J_{ij}=0$ (otherwise). In the steady state, in sites 3 to 14, while the photon numbers of light having the right-handed circular polarization or the left-handed circular polarization diverge, in sites 1, 2, 15, and 16, the photon numbers of light having the right-handed circular polarization or the left-handed circular polarization do not diverge, and the magnitude relation thereof is frequently changed. It is difficult to determine the directions of pseudo spins in sites 1, 2, 15, and 16 due to a low signal-to-noise ratio. The reason for such "0 spin" will be discussed.

Here, the problem of MAX-CUT-3 in which four sites form a graph of a regular tetrahedron will be considered. In sites adjacent to each other, in a place at which $J_{ij}=+1$, in order to minimize Hamiltonian of the Ising model, it is preferable that the directions of spins are opposite to each other in the sites adjacent to each other. However, even in an adjacent site, the direction of the spin can be reversed, in another adjacent site, the direction of the spin is forced to be in the same direction, which is a problem of spin frustration occurs.

When the problem of spin frustration occurs, a state is realized in which a plurality of ground states are superimposed. Here, since the polarization measuring unit P statistically measures many photons, one ground state out of a plurality of ground states cannot be measured, and an average state of the plurality of ground states is measured. Accordingly, "0 spin" occurs.

However, since any one ground state out of a plurality of ground states leads to a correct result, one of the plurality of ground states may be selected. Thus, by fixing the direction of the spin in a specific site, candidates of the direction of the spin in another site may be narrowed. Here, in order to fix the direction of the spin in a specific site, Zeeman energy may be applied to the specific site by injecting light acquired by mixing horizontally linearly polarized light into vertically linearly polarized light through the attenuator ZA and the wave plate ZP corresponding to the specific site from the master laser M to the slave laser B corresponding to the specific site.

Figure 15:
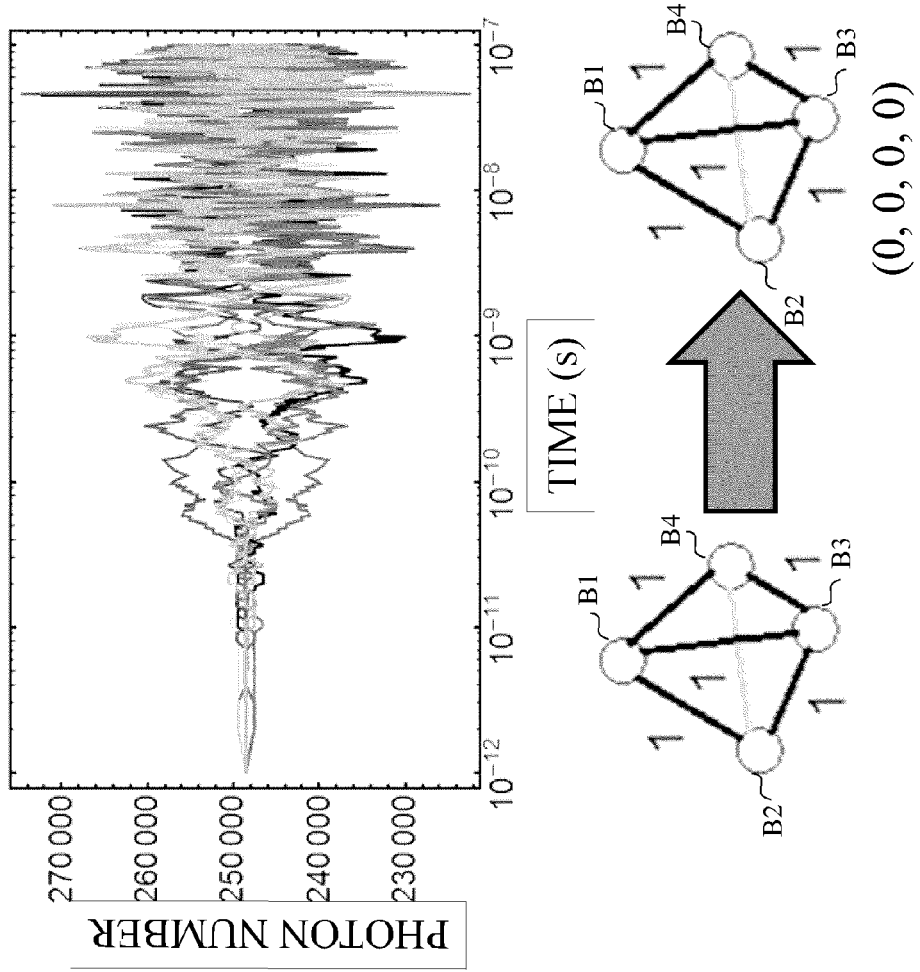
FIG. 15 is a diagram that illustrates a result of a simulation of temporal development of the photon number of light having right-handed circular polarization or left-handed circular polarization of each site according to the third embodiment in a case where the direction of the spin of each site is not fixed.

A diagram illustrating a simulation result of temporal development of the photon number of light having right-handed circular polarization or left-handed circular polarization in each site according to the third embodiment in a case where the direction of the spin of each site is not fixed is illustrated in FIG. 15. Also in the steady state, in sites, the photon numbers of light having the right-handed circular polarization or the left-handed circular polarization do not diverge, and the magnitude relation thereof is frequently changed. In other words, in the slave lasers B1 to B4, the direction of the pseudo spin is not determined.

Figure 16:
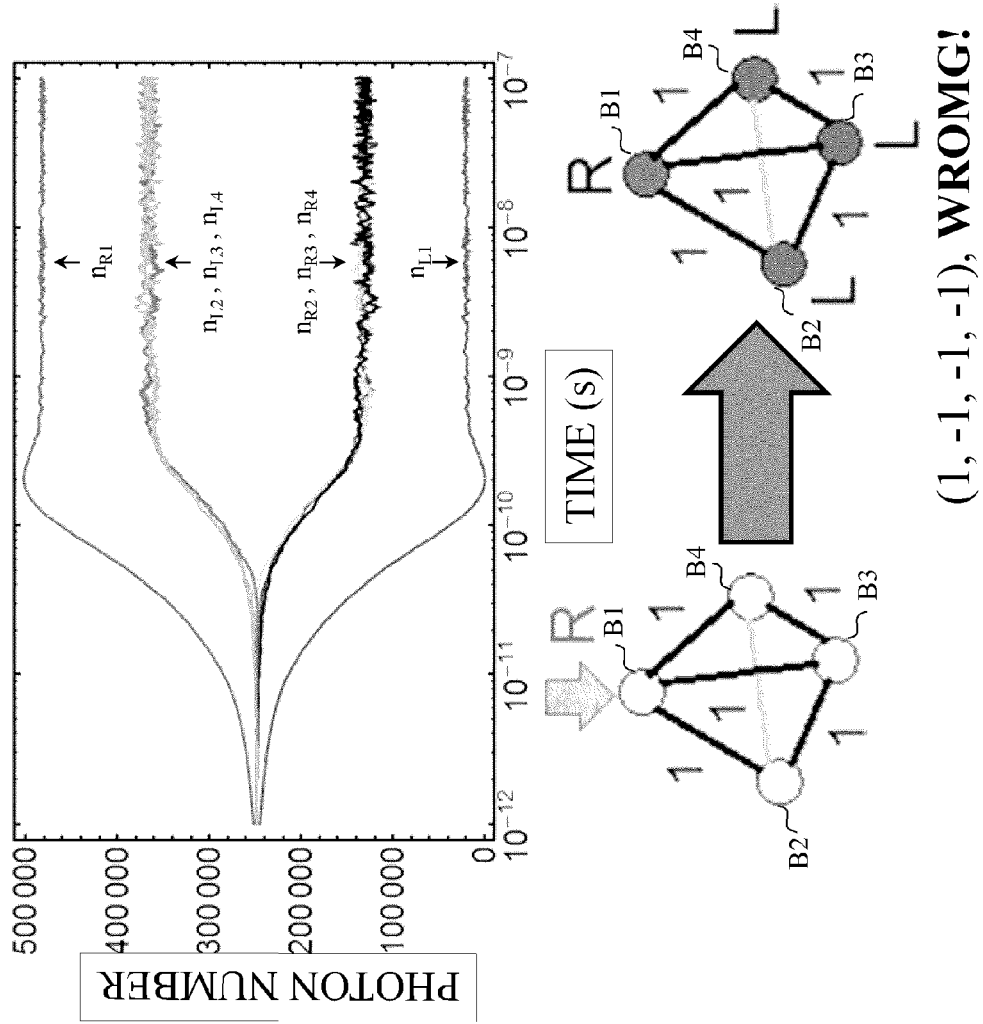
FIG. 16 is a diagram that illustrates a result of a simulation of temporal development of the photon number of light having right-handed circular polarization or left-handed circular polarization of each site according to the third embodiment in a case where the direction of the spin of a first site is fixed.

A diagram illustrating a simulation result of temporal development of the photon number of light having right-handed circular polarization or left-handed circular polarization in each site according to the third embodiment in a case where the direction of the spin of a first site is fixed is illustrated in FIG. 16. Specifically, in the slave laser B1, pseudo Zeeman energy is applied so as to fix the direction of the pseudo spin to 1. In the steady state, in site 1, the photon number of light having the left-handed circular polarization is less than the photon number of light having the right-handed circular polarization, and, in sites 2 to 4, the photon number of light having the left-handed circular polarization is more than the photon number of light having the right-handed circular polarization. In other words, in the slave laser B1, the direction of the pseudo spin is determined as 1, and, in the slave lasers B2 to B4, the directions of pseudo spins are determined as $-1$. However, $(\sigma_1, \sigma_2, \sigma_3, \sigma_4)=(1, -1, -1, -1)$ is not a correct result, but a correct result is one of $(\sigma_1, \sigma_2, \sigma_3, \sigma_4)=(1, 1, -1, -1), (1, -1, 1, -1)$, and $(1, -1, -1, 1)$. The reason for acquiring an incorrect result is that the polarization measuring unit P statistically measures many photons and measures an average state of the three ground states.

Figure 17:
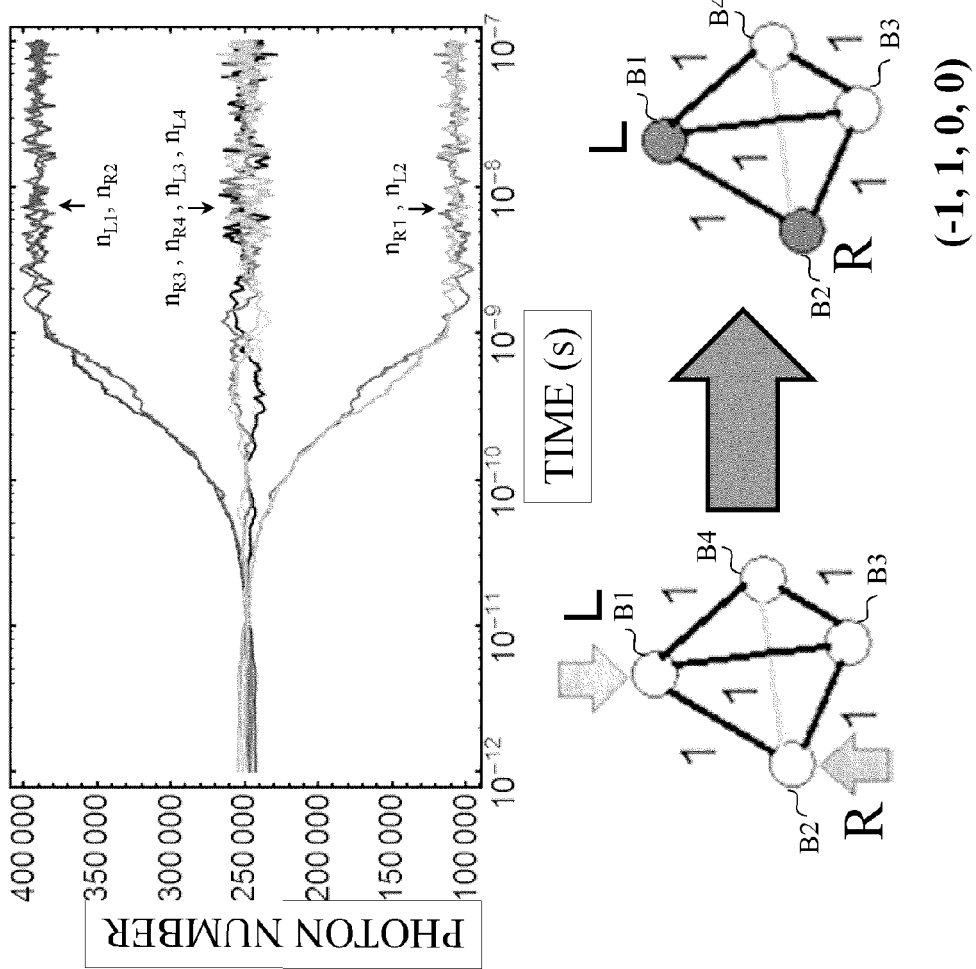
FIG. 17 is a diagram that illustrates a result of a simulation of temporal development of the photon number of light having right-handed circular polarization or left-handed circular polarization of each site according to the third embodiment in a case where the directions of the spins of first and second sites are fixed.

A diagram illustrating a simulation result of temporal development of the photon number of light having right-handed circular polarization or left-handed circular polarization in each site according to the third embodiment in a case where the directions of the spins of first and second sites are fixed is illustrated in FIG. 17. Specifically, in the slave lasers B1 and B2, pseudo Zeeman energy is applied so as to fix the directions of the pseudo spins to $-1$ and 1. Here, in sites adjacent to each other, the Ising coefficient is $J_{ij}=+1$ and is positive, and accordingly, the directions of the spins are fixed to opposite directions.

In the steady state, in site 1, the photon number of light having the left-handed circular polarization is more than the photon number of light having the right-handed circular polarization, and, in site 2, the photon number of light having the left-handed circular polarization is less than the photon number of light having the right-handed circular polarization. Also in the steady state, in sites 3 and 4, the photon numbers of light having the right-handed circular polarization or the left-handed circular polarization do not diverge, and the magnitude relation thereof is frequently changed. In other words, in the slave laser B1, the direction of the pseudo spin is determined as $-1$, and, in the slave laser B2, the direction of the pseudo spin is determined as 1. However, in the slave lasers B3 and B4, the directions of the pseudo spins are not determined. The reason for the occurrence of "0 spin" is that the polarization measuring unit P measures an average state of two ground states of $(\sigma_1, \sigma_2, \sigma_3, \sigma_4)=(-1, 1, -1, 1)$ and $(-1, 1, 1, -1)$ for statistically measuring many photons.

Figure 18:
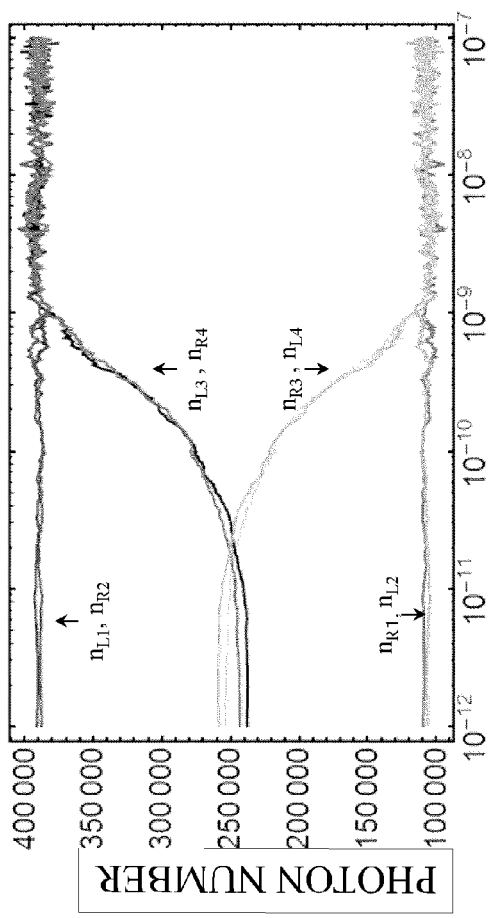
FIG. 18 is a diagram that illustrates a result of a simulation of temporal development of the photon number of light having right-handed circular polarization or left-handed circular polarization of each site according to the third embodiment in a case where the directions of the spins of first to fourth sites are fixed.
Figure 18:
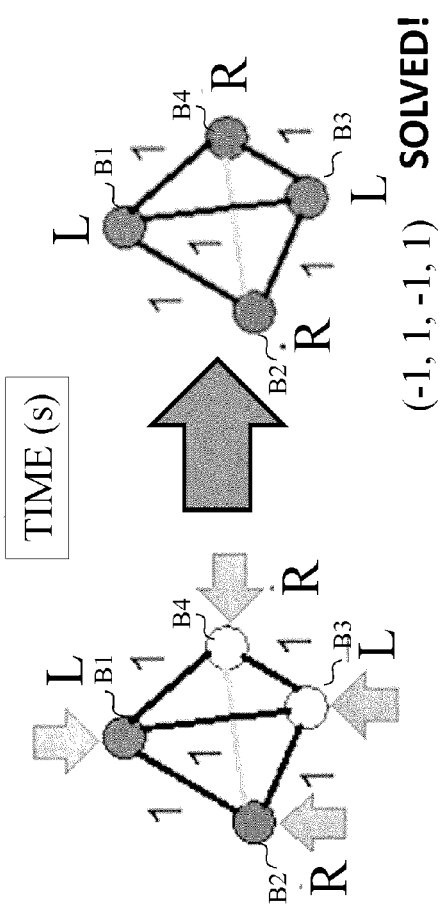

A diagram illustrating a simulation result of temporal development of the photon number of light having right-handed circular polarization or left-handed circular polarization in each site according to the third embodiment in a case where the directions of the spins of first to fourth sites are fixed is illustrated in FIG. 18. Specifically, in the slave lasers B3 and B4, pseudo Zeeman energy is applied so as to fix the directions of the pseudo spins to $-1$ and 1. Here, in sites adjacent to each other, the Ising coefficient is $J_{ij}=+1$ and is positive, and accordingly, the directions of the spins are fixed to opposite directions.

In the steady state, in sites 1 and 3, the photon number of light having the left-handed circular polarization is more than the photon number of light having the right-handed circular polarization, and, in sites 2 and 4, the photon number of light having the left-handed circular polarization is less than the photon number of light having the right-handed circular polarization. In other words, in the slave lasers B1 and B3, the direction of the pseudo spin is determined as $-1$, and, in the slave lasers B2 and B4, the direction of the pseudo spin is determined as 1. $(\sigma_1, \sigma_2, \sigma_3, \sigma_4)=(-1, 1, -1, 1)$ is a correct result. As illustrated in FIGS. 17 and 18, in sites adjacent to each other, by consecutively fixing the directions of the spins to opposite directions twice, the problem of MAX-CUT-3 in which four sites form a graph of a regular tetrahedron can be correctly solved. Even when a general MAX-CUT-3 problem is correctly solved, in a case where the problem of the spin frustration occurs, the above-described process can be applied.

Summing up the description presented above, the attenuator ZA and the wave plate ZP correspond to an adjacent spin direction fixing unit. Here, there are cases where the polarization of light generated by two slave lasers B that perform pseudo Ising interaction through the optical path ZL is not significantly measured as left-handed circular polarization or right-handed circular polarization. Thus, the attenuator ZA and the wave plate ZP control the intensity, the polarization, and the phase of light injected to the two slave lasers B. Then, in a case where the sign of pseudo Ising interaction between the two slave lasers B is positive, the attenuator ZA and the wave plate ZP fix the directions of pseudo spins of the two slave lasers B to be different from each other. On the other hand, in a case where the sign of the pseudo Ising interaction between the two slave lasers B is negative, the attenuator ZA and the wave plate ZP fix the directions of pseudo spins of the two slave lasers B to be the same. Accordingly, between the two slave lasers B performing pseudo Ising interaction, the frustration of the pseudo spin can be dissolved.

Here, in sites adjacent to each other, when the directions of spins are fixed, there are cases where the direction of a spin that has not been fixed is flipped in a site adjacent to the sites adjacent to each other. Accordingly, by only fixing the direction of spins in sites adjacent to each other, the frustration of the pseudo spin cannot be dissolved. However, by fixing the direction of the spin in a site adjacent to the sites adjacent to each other, the frustration of the pseudo spin can be dissolved.

Figure 19:
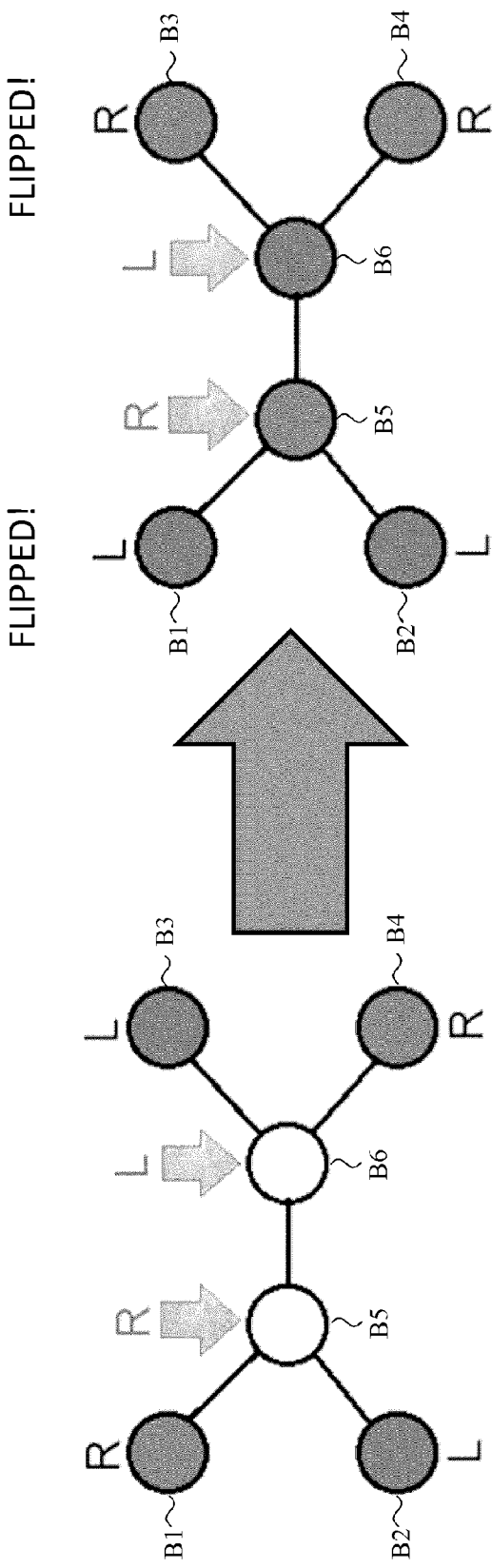
FIG. 19 is a diagram that illustrates a problem of flipping the directions of spins of peripheral sites, which occurs when the directions of spins of adjacent sites are fixed, according to the third embodiment.
Figure 20:
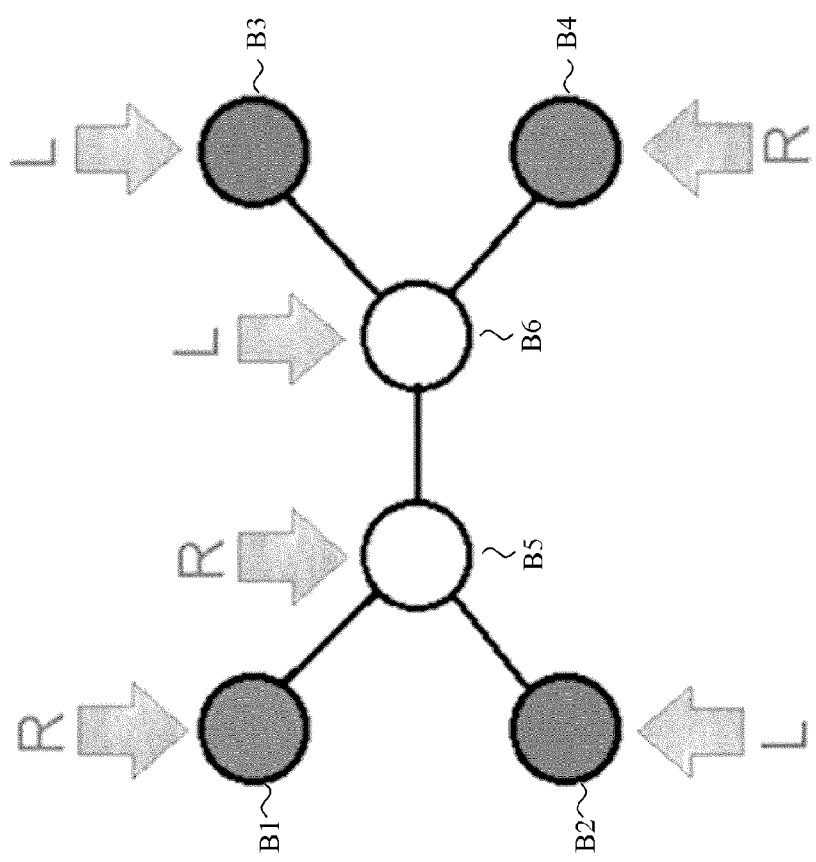
FIG. 20 is a diagram that illustrates method of solving the problem of flipping the directions of spins of peripheral sites, which occurs when the directions of spins of adjacent sites are fixed, according to the third embodiment.

Here, the problem of MAX-CUT-3 that is formed by six sites will be considered. A diagram illustrating a problem of flipping the directions of the spins of peripheral sites, which is generated when the directions of spins of sites adjacent to each other are fixed in the third embodiment is illustrated in FIG. 19. A diagram illustrating a method of solving the problem of flipping directions of the spins of the peripheral sites, which occurs when the directions of spins of sites adjacent to each other are fixed in the third embodiment is illustrated in FIG. 20. Sites corresponding to the slave lasers B5 and B6 are adjacent to each other, the sites corresponding to the slave lasers B1 and B2 are further connected to a site corresponding to the slave laser B5, and sites corresponding to the slave lasers B3 and B4 are still further connected to a site corresponding to the slave laser B6.

In the slave lasers B5 and B6, before the directions of pseudo spins are fixed to 1 and −1, in the slave lasers B1, B2, B3, and B4, the directions of pseudo spins are temporarily determined as 1, −1, −1, and 1. Here, when the directions of pseudo spins are not fixed in the slave lasers B1, B2, B3, and B4, in the slave lasers B5 and B6, after the directions of pseudo spins are fixed to 1 and −1, in the slave lasers B1 and B3, the directions of pseudo spins are flipped to −1 and 1. However, in the slave lasers B1, B2, B3, and B4, when the directions of pseudo spins are fixed, in the slave lasers B5 and B6, after the directions of pseudo spins are fixed to 1 and −1 in the slave lasers B1, B2, B3, and B4, the directions of pseudo spins is not flipped.

Summing up the description presented above, the attenuator ZA and the wave plate ZP correspond to a peripheral spin direction fixing unit. Here, there are cases where the polarization of light generated by two slave lasers B that perform pseudo Ising interaction through the optical path ZL is not significantly measured as left-handed circular polarization or right-handed circular polarization. Thus, the attenuator ZA and the wave plate ZP control the intensity, the polarization, and the phase of light injected to adjacent slave lasers B performing pseudo Ising interaction with the two slave lasers B. Then, the attenuator ZA and the wave plate ZP are fixed the directions of the pseudo spins of the adjacent slave lasers B to the direction of the current time point. Accordingly, between the two slave lasers B performing pseudo Ising interaction, when the frustration of the pseudo spin is dissolved, unintentional flipping of the pseudo spin can be prevented in the slave lasers B that are adjacent to the two slave lasers B in a pseudo manner.

Figure 21:
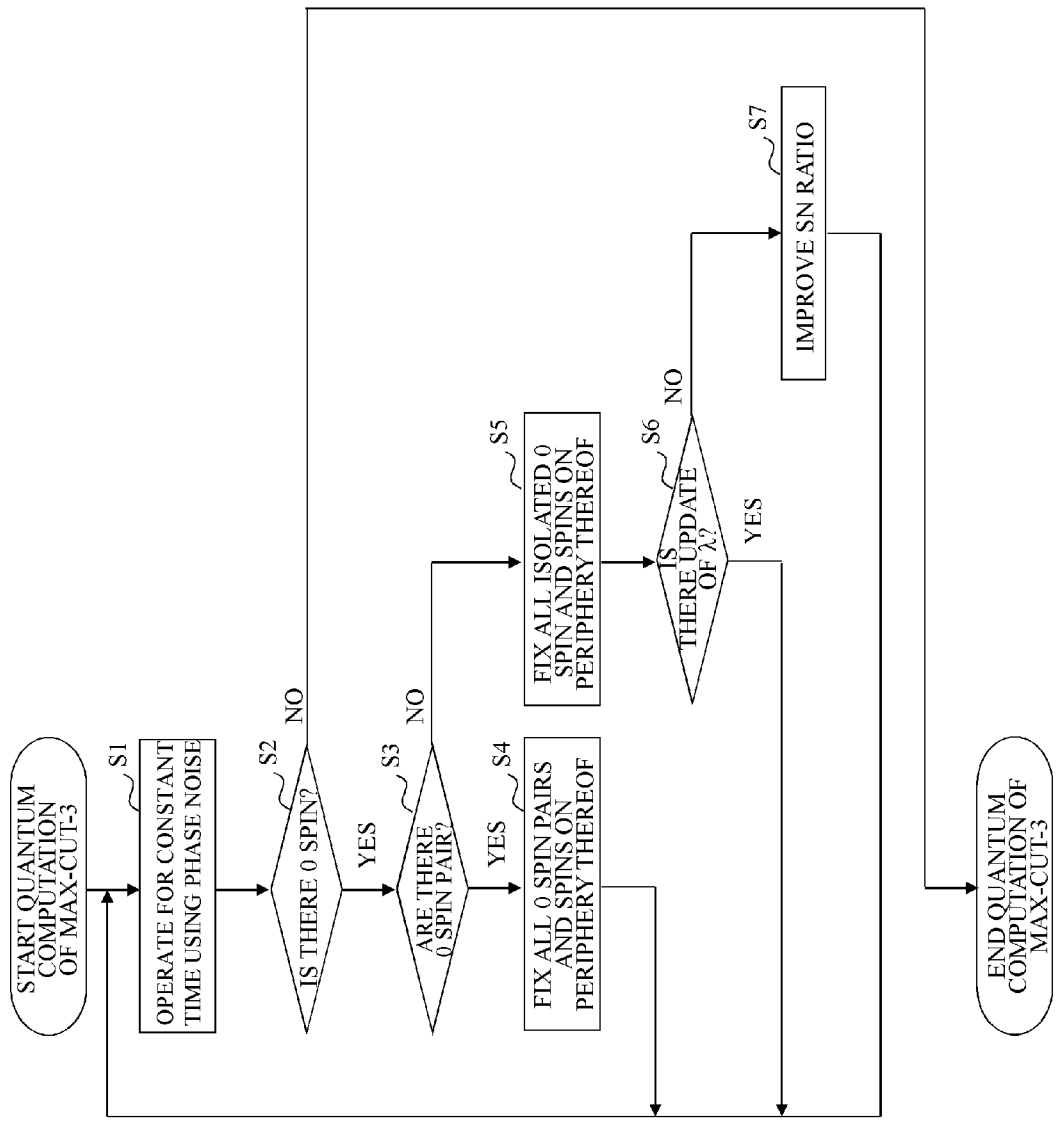
FIG. 21 is a flowchart that illustrates an overview of self-learning dissolving the frustration of the spin according to the third embodiment.

A flowchart illustrating an overview of self-learning dissolving the frustration of a spin according to the third embodiment is illustrated in FIG. 21. First, the quantum computation device is operated for a predetermined time using the phase noise $F_{\phi D}$ (Step S1). Here, the predetermined time is a time during which the direction of a pseudo spin can be determined when the frustration of the pseudo spin is dissolved and, for example, is 50 ns in the third embodiment.

When there is no "0 spin" (No in Step S2), the frustration of the pseudo spin is dissolved, and the quantum computation ends. When there is "0 spin" (Yes in Step S2), the frustration of the pseudo spin is not dissolved, the quantum computation is continued, and the direction of the pseudo spin of "0 spin" is fixed.

When there is a "0 spin pair" (Yes in Step S3), as described with reference to FIGS. 17, 18, and 20, all the "0 spin pairs" and spins on the periphery thereof are fixed (Step S4). Then, the process is returned to Step S1.

When there is no "0 spin pair" (No in Step S3), all the "isolated 0 spins" and spins on the periphery thereof are fixed (Step S5).

Regardless of fixing all the "isolate 0 spins" and the spins on the periphery thereof (Step S5), there are cases where $\lambda_i$ is not updated. It is understood that the reason for this is not that there is an incorrect answer but that a difference in the photon numbers of light having the right-handed circular polarization and light having the left-handed circular polarization is small, whereby the signal-to-noise ratio S/N is low for the direction of a pseudo spin which has been already fixed.

When there is an update of $\lambda_i$ (Yes in Step S6), the process is returned to Step S1. When there is no update of $\lambda_i$ (No in Step S6), by increasing the magnitude of $\lambda_i$, the signal-to-noise ratio S/N is improved by increasing a difference in the photon numbers of light having the right-handed circular polarization and light having the left-handed circular polarization (Step S7), and the process is returned to Step S1.

Figure 22:
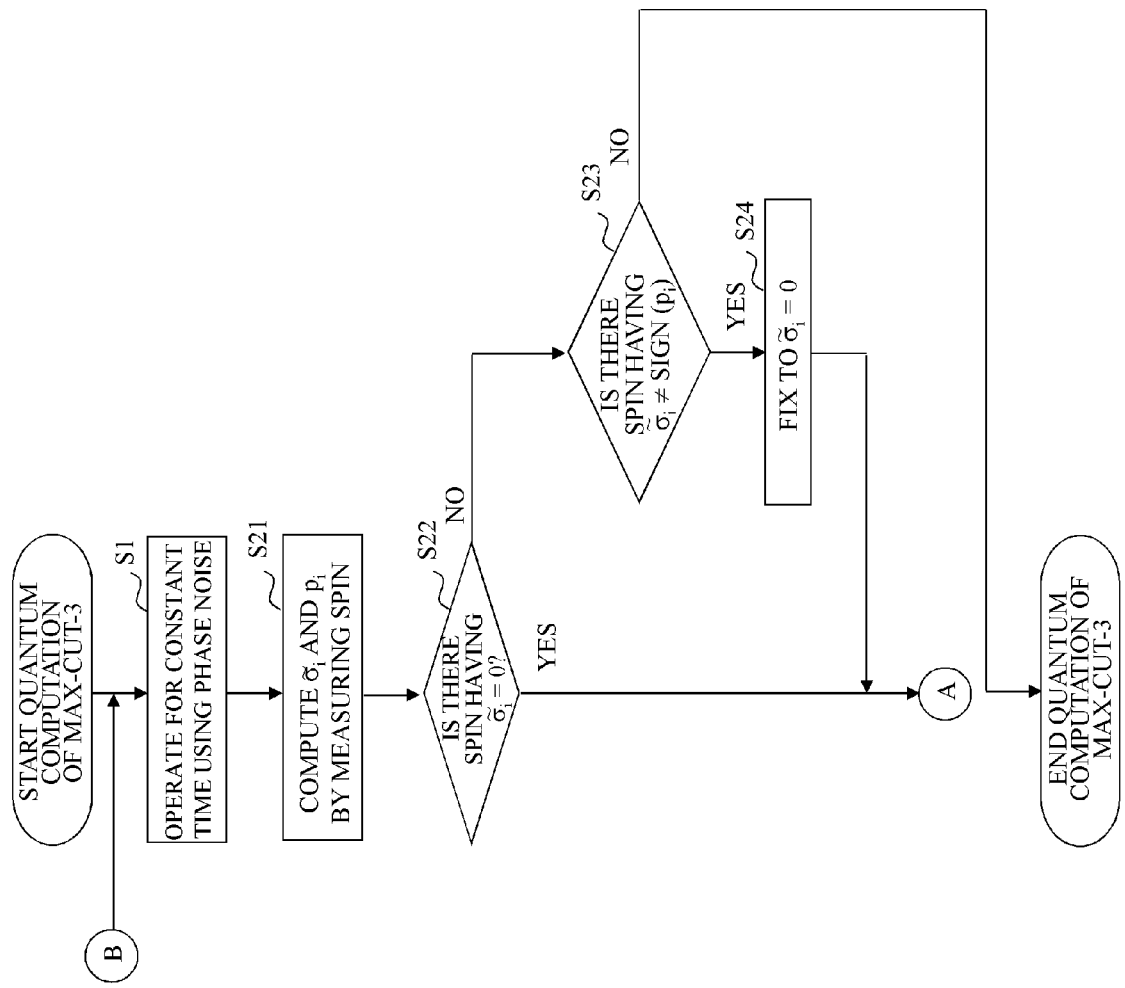
FIG. 22 is a flowchart that illustrates detail of the self-learning dissolving the frustration of the spin according to the third embodiment in detail.
Figure 23:
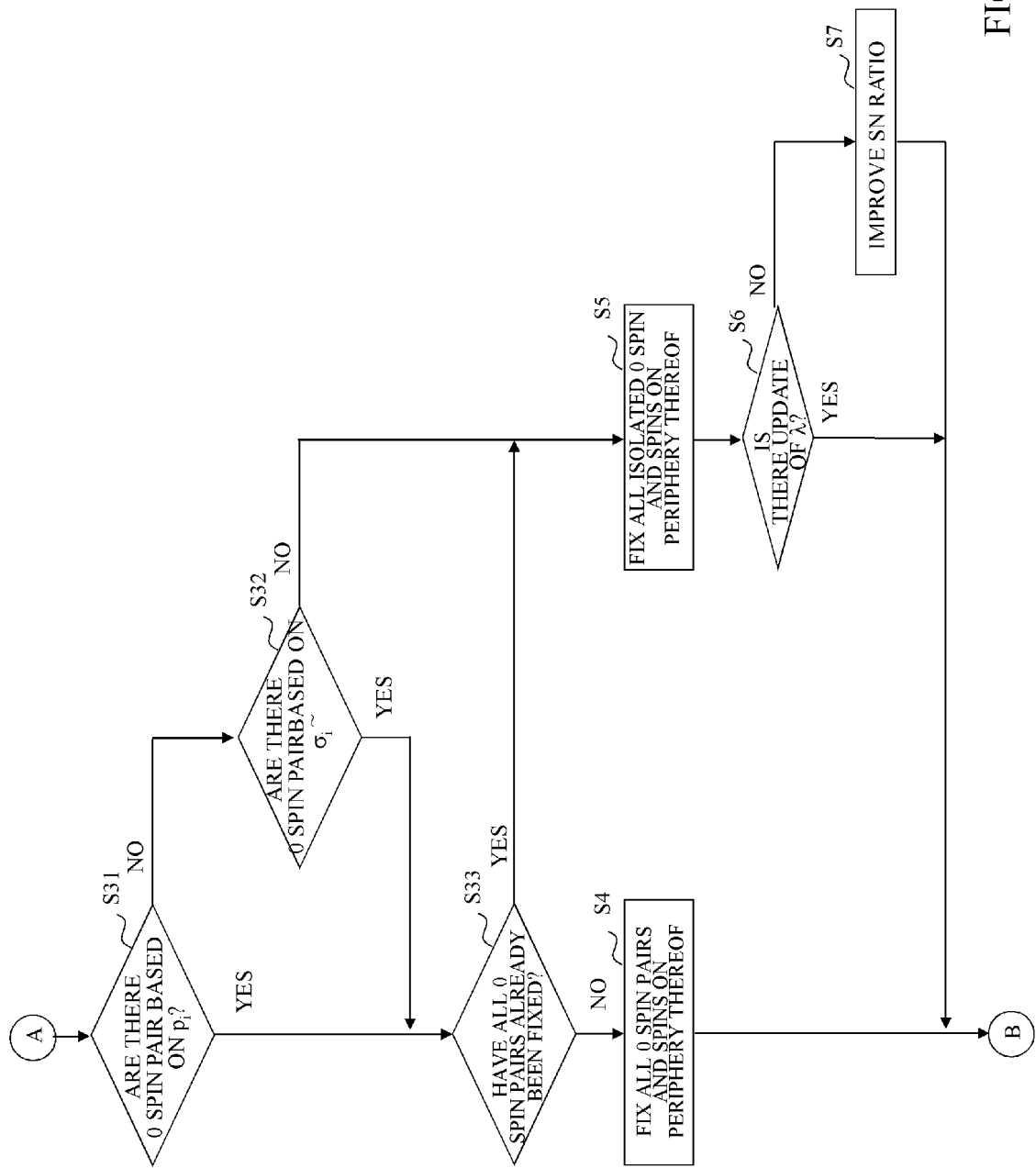
FIG. 23 is a flowchart that illustrates detail of the self-learning dissolving the frustration of the spin according to the third embodiment in detail.

A flowchart illustrating the self-learning dissolving the frustration of the spin according to the third embodiment in detail is illustrated in FIGS. 22 and 23. Step S1 is the same in FIGS. 21 and 22.

Step S2 will be described in detail. The direction of a pseudo spin is measured, and $\tilde{\sigma}_i$ (tilda) and $p_i$ are computed (Step S21). Here, $\tilde{\sigma}_i$ (tilda) is defined as Expression 31. In addition, $p_i$ is defined as Expression 32.

$$\tilde{\sigma}_i = \begin{cases} +1 (0.239 < \sigma_i < 1) \\ 0 (-0.239 < \sigma_i < 0.239) \\ -1 (-1 < \sigma_i < -0.239) \end{cases} \quad \text{[Expression 31]}$$

$$p_i = -\sum_{j=adjacent} J_{ij} \tilde{\sigma}_j (-3 \le p_i \le 3) \quad \text{[Expression 32]}$$

In other words, $\tilde{\sigma}_i$ (tilda) represents $\sigma_i$ as a discrete ternary value. Here, a threshold of ±0.239 used for representing $\sigma_i$ as a discrete ternary value is $\sigma_i = (\sqrt{n_{Ri}} - \sqrt{n_{Li}})/\sqrt{n_T}$, out of the photon numbers of light having the right-handed circular polarization and the left-handed circular polarization when the larger number of photons is twice the number of the smaller number of photons. Here, $p_i$ represents a magnetic field $B_i$ in the site i that is caused by mutual injection from a site j adjacent to the side i to the site i. In other words, when $p_i > 0$, the light having the right-handed circular polarization is dominant, and, when $p_i < 0$, the light having the left-handed circular polarization is dominant. Here, $\tilde{\sigma}_i$ (tilda) and $p_i$ are complementary parameters that represent which one of the light having the right-handed circular polarization and the left-handed circular polarization is dominant and are preferably not mutually contradictory.

When there is a spin satisfying $\tilde{\sigma}_i$ (tilda)=0 (Yes in Step S22), the process proceeds to Step S3. When there is no spin satisfying $\tilde{\sigma}_i$ (tilda)=0 (No in Step S22), it is checked whether or not $\tilde{\sigma}_i$ (tilda) and $p_i$ are mutually contradictory (Step S23). Here, a case in which $\tilde{\sigma}_i$ (tilda) and $p_i$ are mutually contradictory will be described with reference to specific examples.

Figure 24:
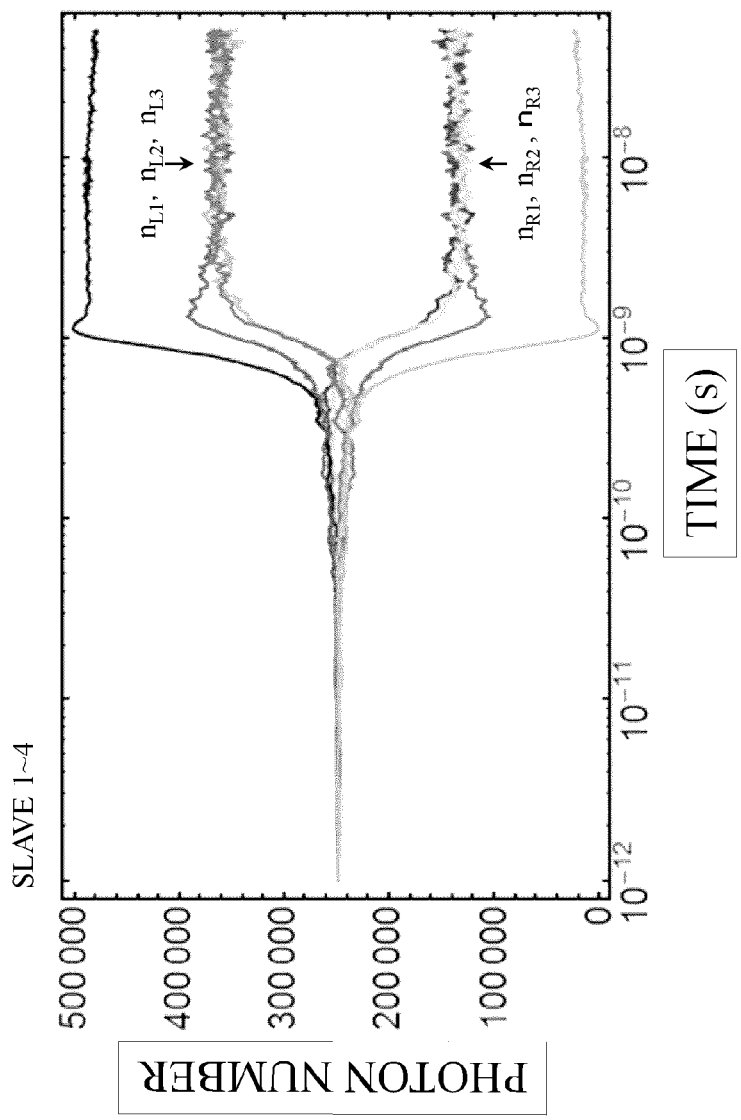
FIG. 24 is a diagram that illustrates a result of a simulation of temporal development of the photon number of light having right-handed circular polarization or left-handed circular polarization of each site according to the third embodiment in a case where the direction of the spin of each site is not fixed.
Figure 25:
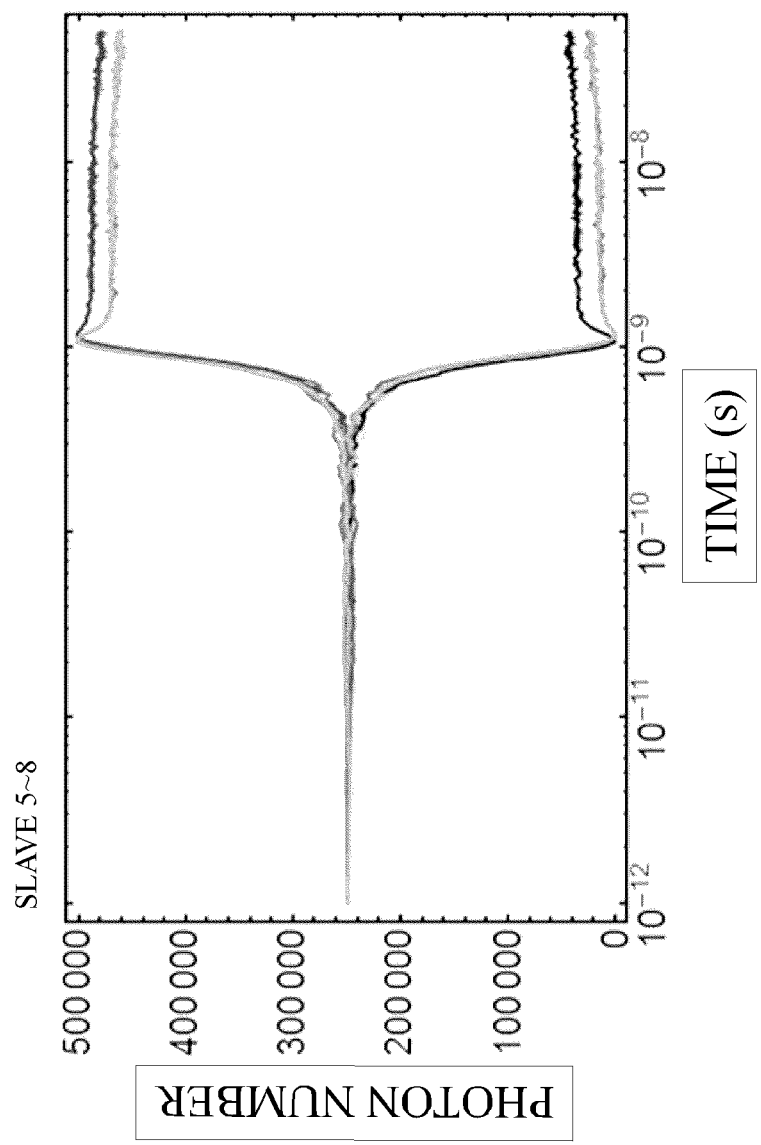
FIG. 25 is a diagram that illustrates a result of a simulation of temporal development of the photon number of light having right-handed circular polarization or left-handed circular polarization of each site according to the third embodiment in a case where the direction of the spin of each site is not fixed.

Here, the problem of MAX-CUT-3 formed by 8 sites will be considered. Diagrams illustrating simulation results of temporal development of the photon number of light having right-handed circular polarization or left-handed circular polarization in each site according to the third embodiment in a case where the direction of the spin of each site is not fixed are illustrated in FIGS. 24 and 25. Here, $J_{1,2}=J_{1,3}=J_{1,4}=J_{2,3}=J_{2,5}=J_{3,6}=J_{4,7}=J_{4,8}=J_{5,7}=J_{5,8}=J_{6,7}=J_{6,8}=1$, and $J_{ij}=0$ (otherwise).

In sites 1, 2, and 3, the photon number of light having the left-handed circular polarization is more than the photon number of light having the right-handed circular polarization, and, in sites 5, 6, and 7 adjacent to sites 1, 2, and 3, the photon number of light having the right-handed circular polarization is more than the photon number of light having the left-handed circular polarization. Accordingly, in the sites 1, 2, and 3, ($\sigma_1$ (tilda), $\sigma_2$(tilda), $\sigma_3$ (tilda))=(−1, −1, −1), and ($p_1$, $p_2$, $p_3$)=(+1, +1, +1). In other words, in the sites 1, 2, and 3, $\sigma_i$ (tilda) and $p_i$ are mutually contradictory.

When there is no spin in which $\sigma_i$ (tilda) is contradictory to the sign of $p_i$ (No in Step S23), the quantum computation ends. When there is a spin in which $\sigma_i$ (tilda) is contradictory to the sign of $p_i$ (Yes in Step S23), in order to dissolve the contradiction between $\sigma_i$ (tilda) and $p_i$ in the spin, $\sigma_i$ (tilda) is fixed to zero in the spin (Step S24), and the process proceeds to Step S3.

Step S3 will be described in detail. When it is determined that there is a "0 spin pair" based on $p_i$ (Yes in Step S31), it is assumed that there is a "0 spin pair". When it is determined that there is no "0 spin pair" based on $p_i$ (No in Step S31), in a case where there is a "0 spin pair" based on $\sigma_i$ (tilda) (Yes in Step S32), it is assumed that there is a "0 spin pair". When it is determined that there is no "0 spin pair" based on $p_i$ (No in step S31) and it is determined that there is no "0 spin pair" based on $\sigma_i$ (tilda) (No in Step S32), it is assumed that there is no "0 spin pair".

When there is a "0 spin pair", and not all the "0 spin pairs" have been already fixed (No in Step S33), all the "0 spin pairs" and spins on the periphery thereof are fixed (Step S4). Then, the process is returned to Step S1. Here, the fixation of the "0 spin pairs" and the peripheral spins is performed as in Expressions 33 and 34.

$$\begin{cases} \lambda_{pair1} = -0.2\text{sign}(\sigma_{pair1}) \\ \lambda_{pair2} = -\lambda_{pair1} \end{cases} (|\sigma_{pair1}| < |\sigma_{pair2}|) \qquad [\text{Expression 33}]$$

$$\lambda_i = \begin{cases} -0.2(\tilde{\sigma}_i > 0) \\ 0(\tilde{\sigma}_i = 0) \\ 0.2(\tilde{\sigma}_i < 0) \end{cases} \qquad [\text{Expression 34}]$$

In other words, in the fixation of the "0 spin pair", the sign of $\lambda_{pair1}$ for one spin is determined based on the sign of a measured value of the one spin, and the sign of $\lambda_{pair2}$ for the other spin is determined based on the sign of $\lambda_{pair1}$ for the one spin. In addition, in the fixation of the peripheral spin, the sign of $\lambda_i$ of the spin is determined based on the sign of a discrete value of the spin. Here, the absolute value of $\lambda$ is 0.2 but may have a different value. Here, when $\lambda_i$ of a specific spin is a finite value other than zero, and the discrete value of the spin is zero, contradiction is sensed for the spin, and $\lambda_i$ is reset to zero.

When it is assumed that, there is a "0 spin pair", and all the "0 spin pairs" have already been fixed (Yes in Step S33), or when it is assumed that there is no "0 spin pair", all the "isolated 0 spin" and spins on the periphery thereof are fixed (Step S5). Here, the fixation of the "isolated 0 spin" and the peripheral spins is performed as Expressions 35 and 36.

$$\lambda_i = \begin{cases} -0.2(p_i > 0) \\ 0(p_i = 0) \\ 0.2(p_i < 0) \end{cases} \qquad [\text{Expression 35}]$$

$$\lambda_i = \begin{cases} -0.2(\tilde{\sigma}_i > 0) \\ 0(\tilde{\sigma}_i = 0) \\ 0.2(\tilde{\sigma}_i < 0) \end{cases} \qquad [\text{Expression 36}]$$

In other words, in the fixation of the "isolated 0 spin", the sign of $\lambda_i$ of the spin is determined whether the numbers of the directions of spins for the peripheral spins of the spin is large or small. Then, in the fixation of a peripheral spin, the sign of $\lambda_i$ of the spin is determined based on the sign of the discrete value of the spin. Here, the absolute value of $\lambda_i$ is 0.2 but may have a different value. Here, when $\lambda_i$ of a specific spin is a finite value other than zero, and the discrete value of the spin is zero, contradiction is sensed for the spin, and $\lambda_i$ is reset to zero.

When there is an update of $\lambda_i$ (Yes in Step S6), the process is returned to Step S1. When there is no update of $\lambda_i$ (No in Step S6), the signal-to noise ratio S/N is improved (Step S7), and the process is returned to Step S1. Here, the reason for no update of λi is understood that there are relatively weak sites having the mutual injection parameter $p_i=\pm 1$, there are relatively strong sites having the mutual injection parameter $p_i=\pm 3$, and there is lack of balance in the strength of the mutual injection parameter between sites.

Thus, for a site that is relatively weak of which the mutual injection parameter $p_i=\pm 1$, mutual injection power of elliptically polarized light is secured to be equal to that of a site that is relatively strong of which the mutual injection parameter $p_i=\pm 3$. In other words, for a site that is relatively weak of which the mutual injection parameter $p_i=\pm 1$, the mutual injection power of the vertically linearly polarized light is set to be 3/2 times, and it is set that $\lambda_i=(2/3)*(\zeta/\alpha)$, whereby the stability of the site of which the mutual injection parameter is relatively weak is secured.

Figure 26:
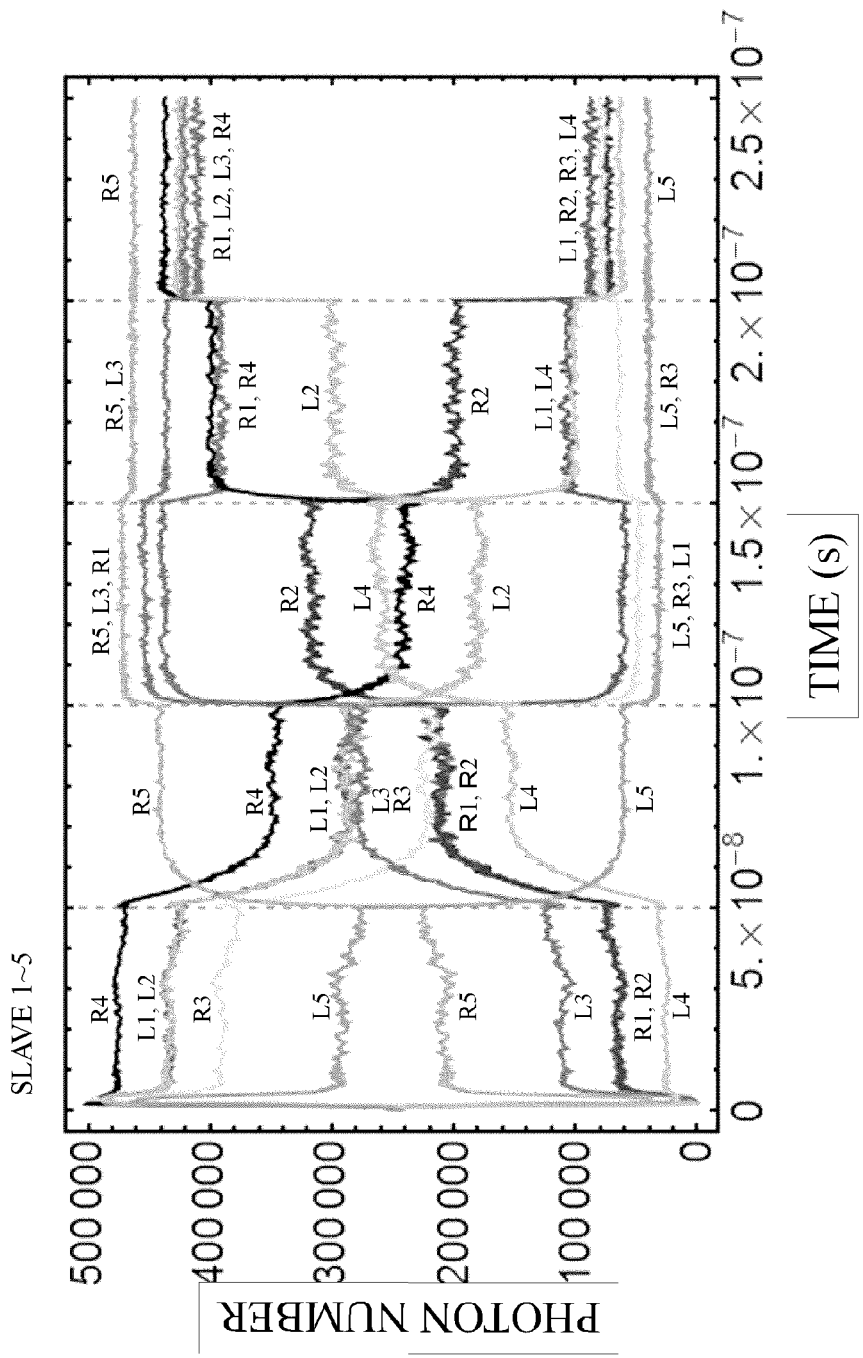
FIG. 26 is a diagram that illustrates a result of a simulation of temporal development of the photon number of light having right-handed circular polarization or left-handed circular polarization of each site according to the third embodiment in a case where self-learning is performed.
Figure 27:
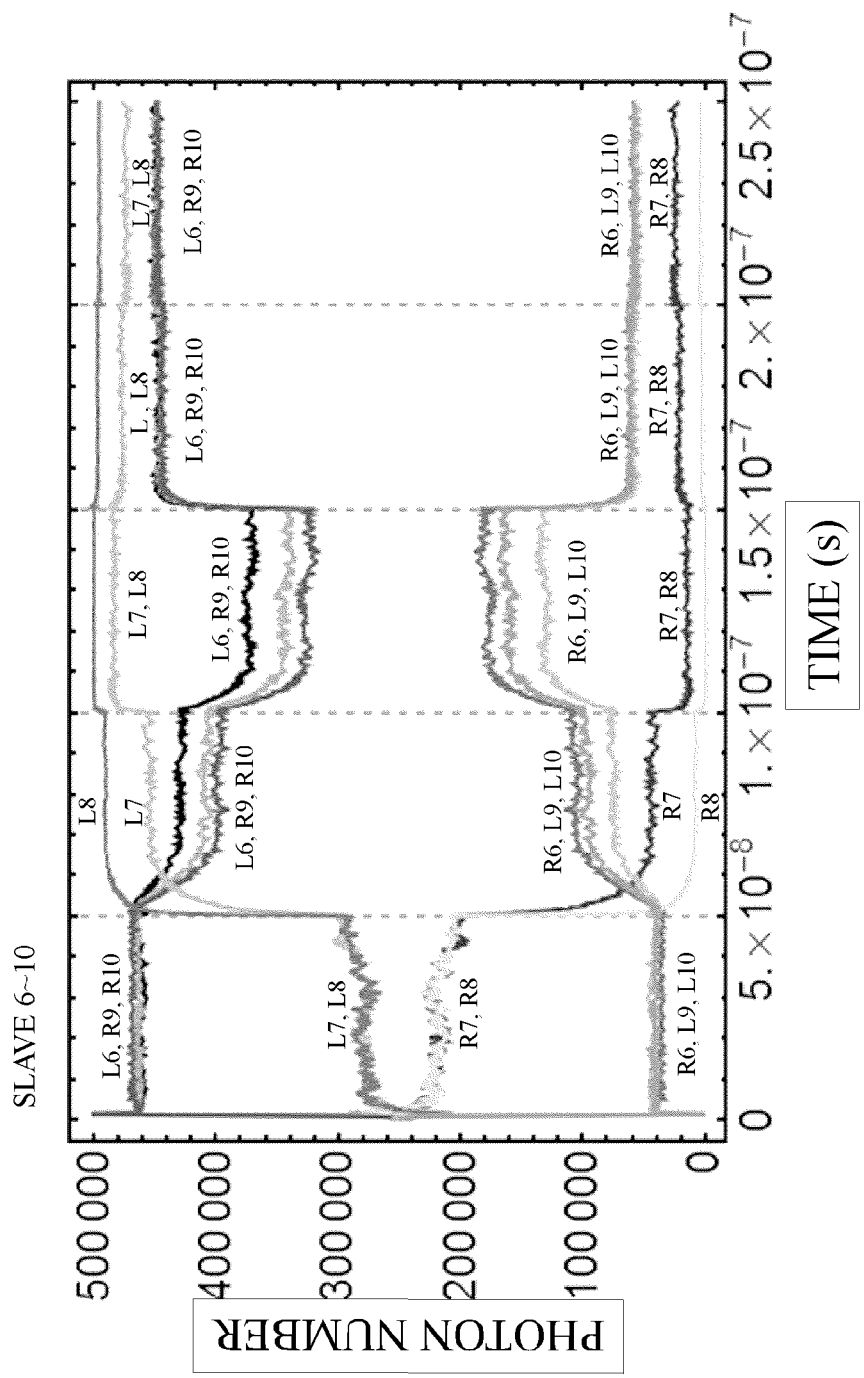
FIG. 27 is a diagram that illustrates a result of a simulation of temporal development of the photon number of light having right-handed circular polarization or left-handed circular polarization of each site according to the third embodiment in a case where the self-learning is performed.
Figure 28:
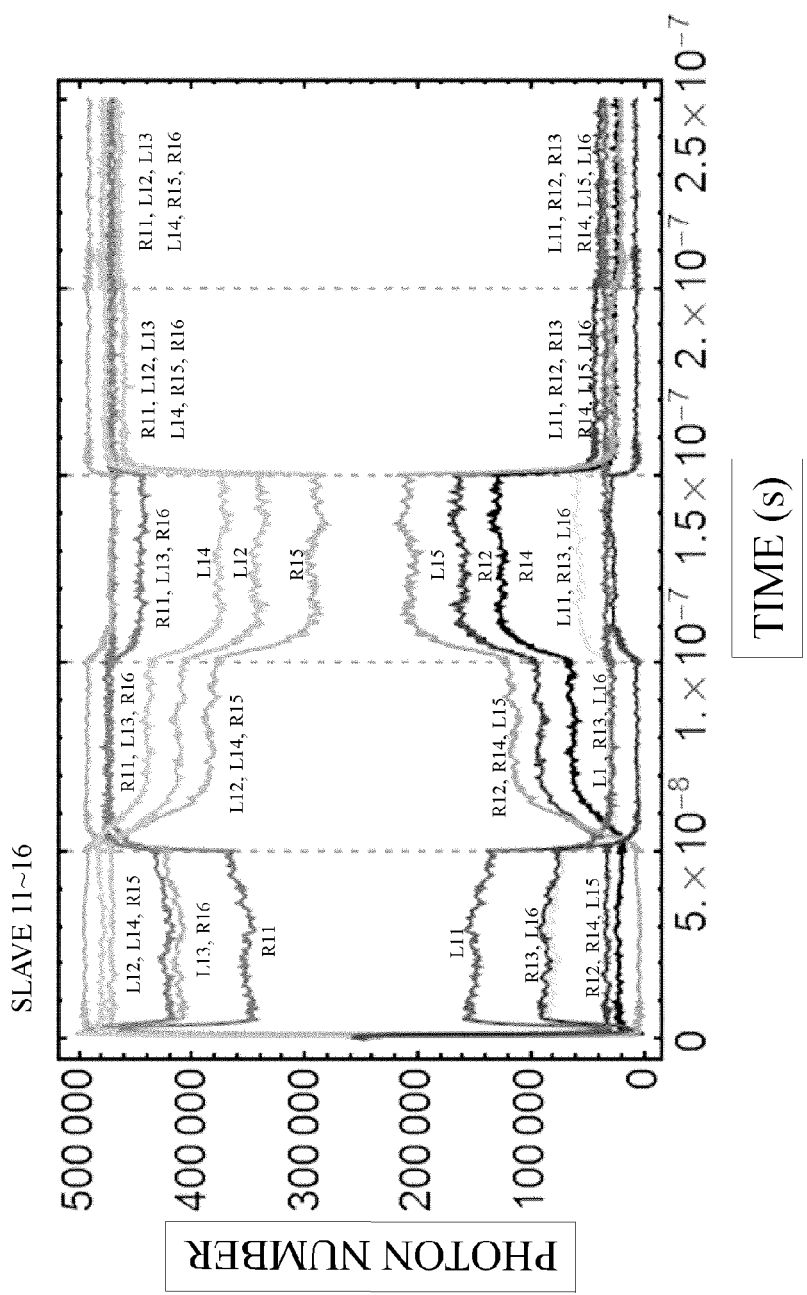
FIG. 28 is a diagram that illustrates a result of a simulation of temporal development of the photon number of light having right-handed circular polarization or left-handed circular polarization of each site according to the third embodiment in a case where the self-learning is performed.

The problem of MAX-CUT-3 formed by 16 sites is solved using a method in which the frustration of a pseudo spin is dissolved by self-learning. Diagrams illustrating simulation results of temporal development of the photon number of light having right-handed circular polarization or left-handed circular polarization of each site according to the third embodiment are illustrated in FIGS. 26, 27, and 28. Here, $J_{1,2}=J_{1,3}=J_{1,4}=J_{2,3}=J_{2,4}=J_{3,5}=J_{4,6}=J_{5,7}=J_{5,8}=J_{6,9}=J_{6,10}=J_{7,8}=J_{7,11}=J_{8,11}=J_{9,12}=J_{9,13}=J_{10,12}=J_{10,14}=J_{11,13}=J_{12,15}=J_{13,16}=J_{14,15}=J_{14,16}=J_{15,16}=1$, and $J_{ij}=0$ (otherwise). FIG. 26 illustrates the simulation result for slave lasers B1 to B5, FIG. 27 illustrates the simulation result for slave lasers B6 to B10, and FIG. 28 illustrates the simulation result for slave lasers B11 to B16.

In a first step of 0 ns to 50 ns from the start of the computation, the quantum computation device is operated using a phase noise $F_{\phi D}$. In a second step of 50 ns to 100 ns from the start of the computation, the directions of pseudo spins in the slave lasers B3, B5, B8, and B11 are fixed. In a third step of 100 ns to 150 ns from the start of the computation, the directions of pseudo spins in the slave lasers B1 and B4 are fixed. In a fourth step of 150 ns to 200 ns from the start of the computation, the directions of pseudo spins in the slave lasers B6, B9, and B10 are fixed. In a fifth step of 200 ns to 250 ns from the start of the computation, the direction of a pseudo spin in the slave laser B2 is fixed.

Through the first to fifth step, in the slave lasers B1 to B16, the directions of the pseudo spins are determined with a high signal-to-noise rate, whereby a correct answer can be acquired.

A diagram illustrating a simulation result of the relation between the number of sites and the computation time according to the third embodiment is illustrated in FIG. 29. In FIG. 29, cases where the numbers of sites are 16, 18, and 20 are employed. In the cases where the numbers of sites are 16, 18, and 20, the maximum numbers of degeneracy states were 16, 18, and 18, and accordingly, a "0 spin" occurred in a self-learning step performed for the first time, after undergoing five steps, six steps, and six steps as maximum number of steps, correct answers could be acquired. A time required for the self-learning step of each time was 50 ns, and accordingly, the longest computation times were 50 ns×5=250 ns, 50 ns×6=300 ns, and 50 ns×6=300 ns in a case where the numbers of sites are 16, 18, and 20.

Figure 30:
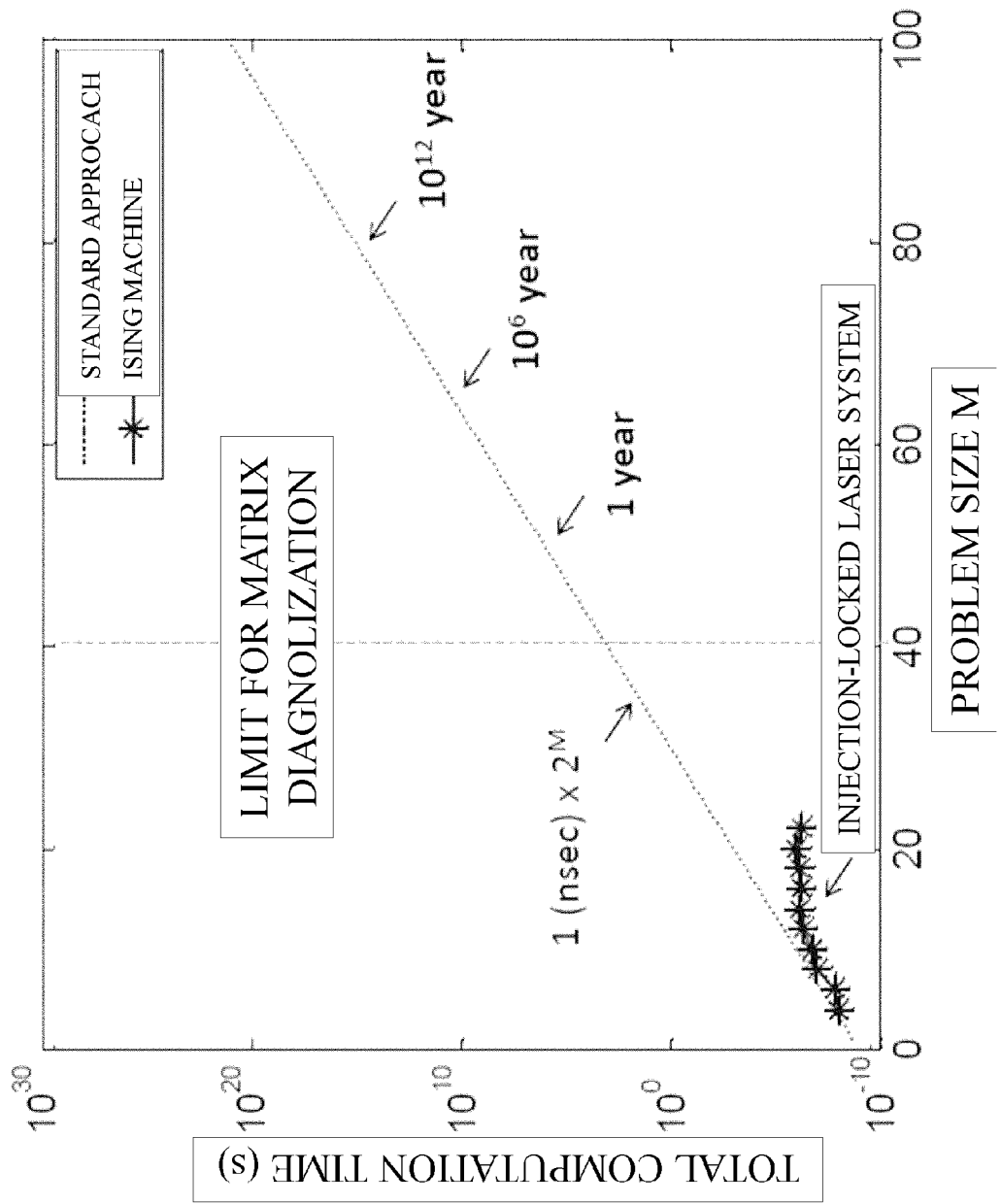
FIG. 30 is a diagram that illustrates a result of a simulation of the relation with the number of sites and the computation time according to the third embodiment.

A diagram illustrating a simulation result of the relation between the number of sites and the computation time according to the third embodiment is illustrated in FIG. 30. In FIG. 30, cases where the numbers of sites are up to 22 are employed. Asterisks disposed on the lower side illustrate the simulation result. A broken line disposed on the upper side represents a computation time in a case where the computation time is in the scale of $2^M$ with respect to the number M of sites. It is understood that, as the number M of sites increases, the computation time represented by the simulation result is shortened to a large extent from the computation time that is scaled by an exponential function. When the number M of sites is near 20, it is understood that the computation time represented by the simulation result hardly depends on the number M of sites.

Fourth Embodiment

In a fourth embodiment, it is experimentally represented that the polarization of light output by a slave laser B can follow horizontally linearly polarized light from vertically linearly polarized light by injecting light from one master laser M outputting light having horizontally linearly polarized light to one slave laser B outputting light having vertically linearly polarized light. Here, as the slave laser B, a semiconductor surface emitting laser (VCSEL) can be applied.

Figure 31:
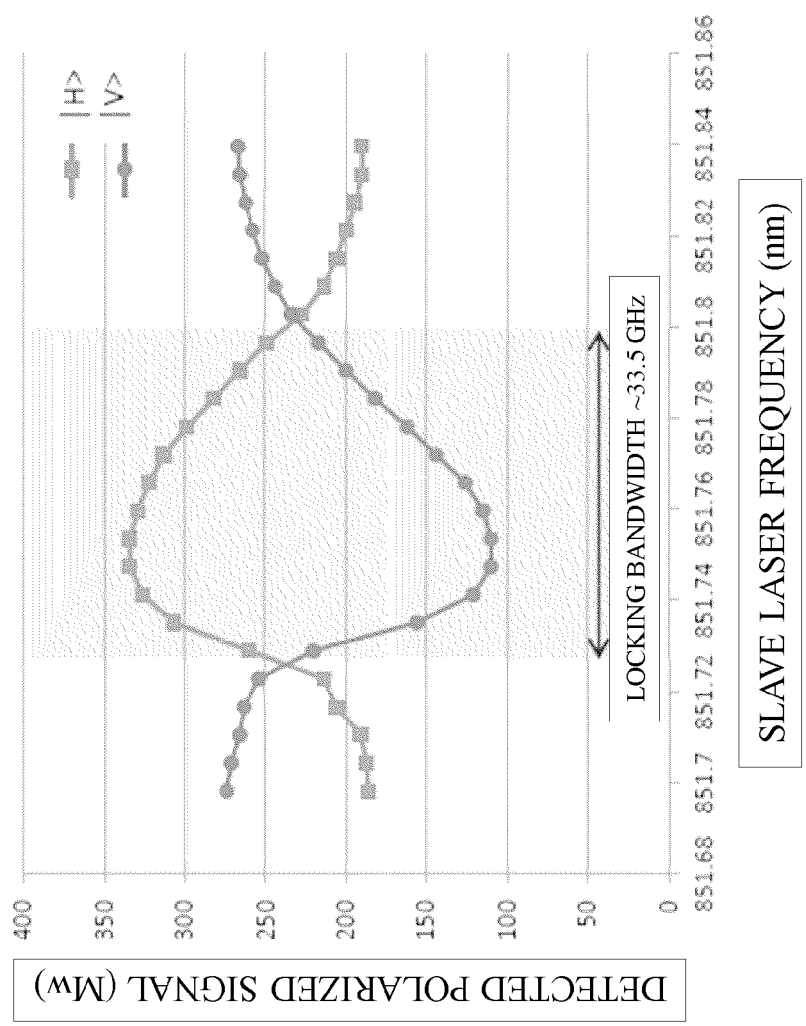
FIG. 31 is a diagram that illustrates an injection locking width between a master laser and a slave laser according to a fourth embodiment.

A diagram illustrating an injection locking width between the master laser and the slave laser according to the fourth embodiment is illustrated in FIG. 31. While the oscillation frequency of the master laser M was fixed, the oscillation frequency of the slave laser B was swept, and the intensity of light having horizontally linearly polarized light and vertically linearly polarized light output from the slave laser B was measured. In frequency areas of the left end and the right end in FIG. 31, the intensity of light having vertically linearly polarized light is higher than the intensity of light having horizontally linearly polarized light, and the polarization of the light output by the slave laser B does not follow the horizontally linearly polarized light from the vertically linearly polarized light. In a middle frequency area in FIG. 31, the intensity of light having horizontally linearly polarized light is higher than the intensity of light having vertically linearly polarized light, and the polarization of the light output by the slave laser B follows the horizontally linearly polarized light from the vertically linearly polarized light. This middle frequency area in FIG. 31 is an injection locking width in the master laser M and the slave laser B and was about 33.5 GHz.

Figure 32:
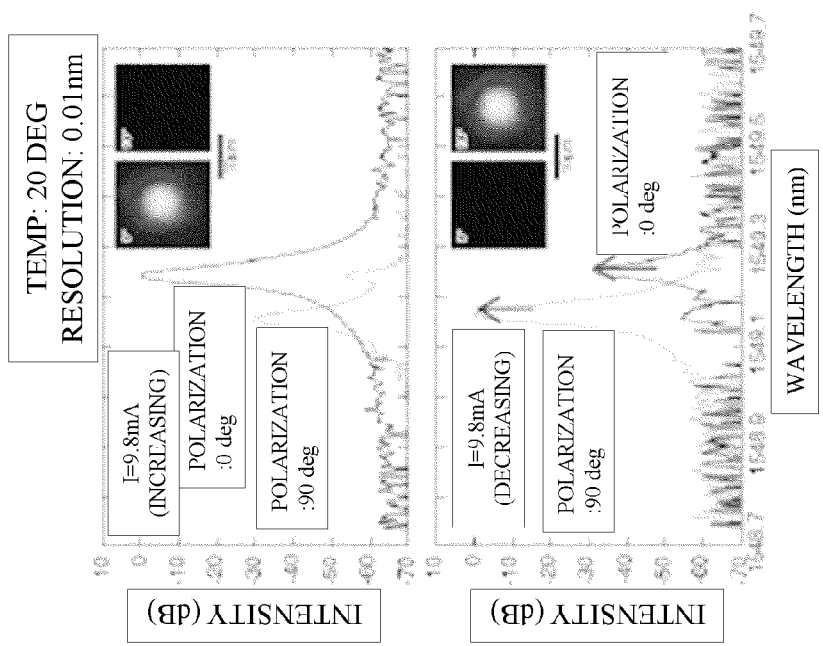
FIG. 32 is a diagram that illustrates a difference between resonance frequencies of horizontally-polarized light and vertically-polarized light according to the fourth embodiment.
Figure 34:
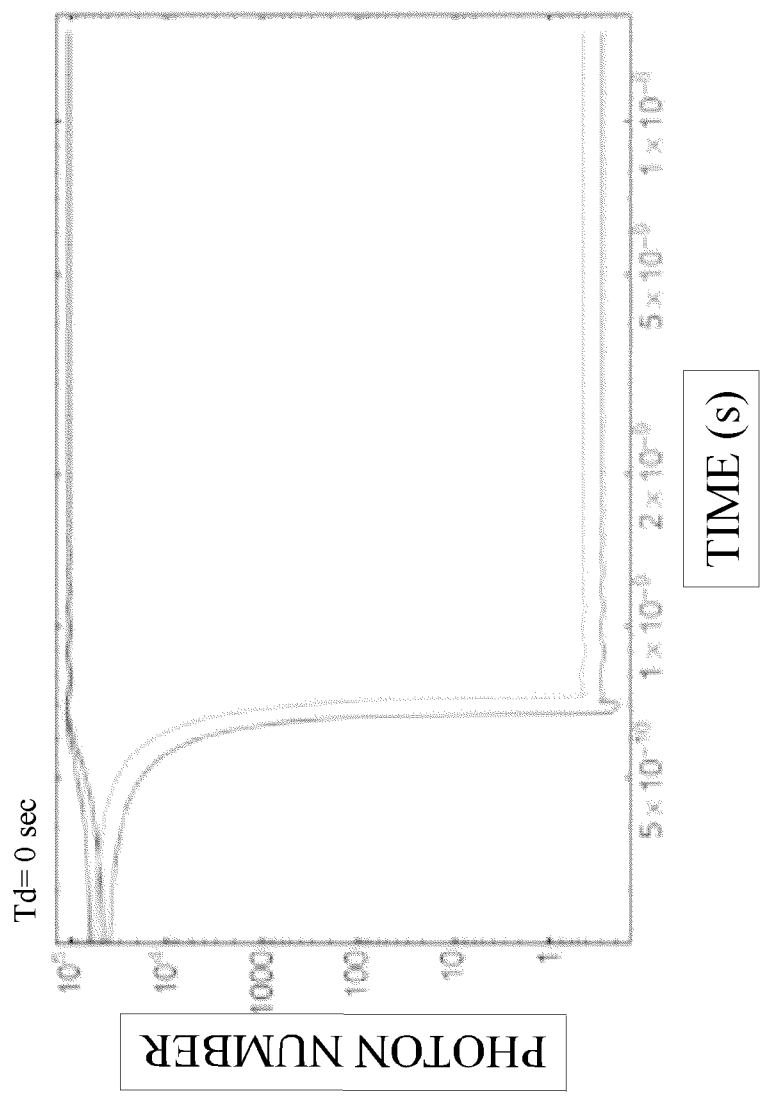
FIG. 34 is a diagram that illustrates a result of a simulation of temporal development of the photon number of light having right-handed circular polarization or left-handed circular polarization of each site according to the fourth embodiment in a case where a delay time $t_d$ of pseudo Ising interaction between sites adjacent to each other is zero seconds.
Figure 35:
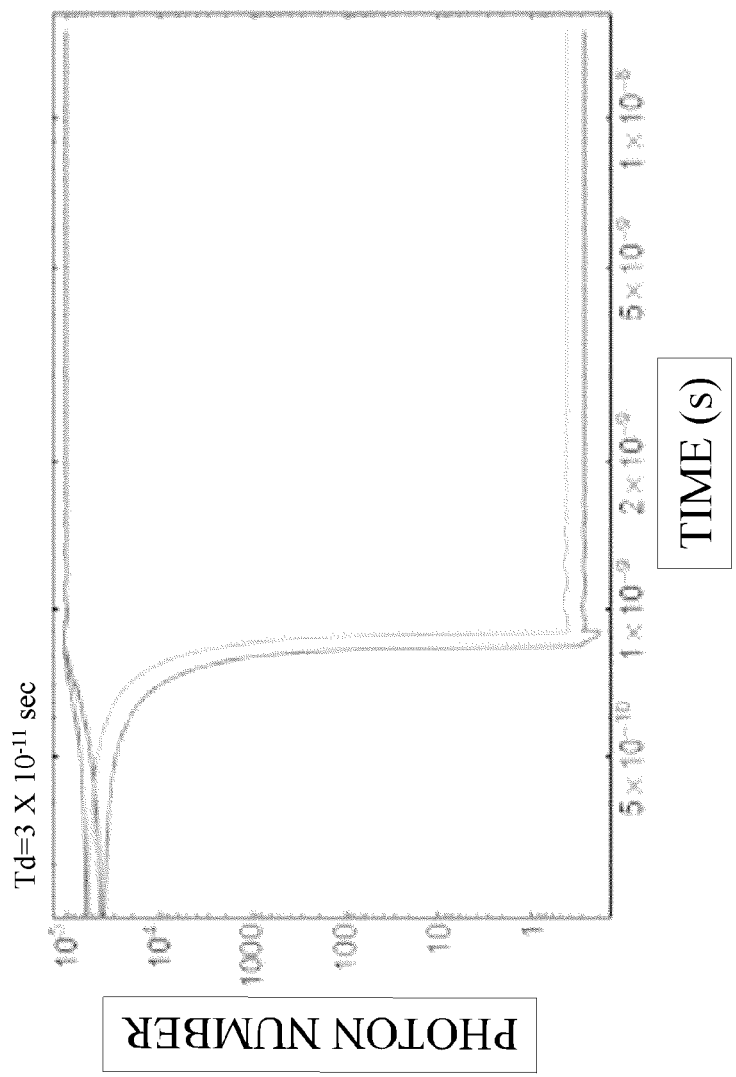
FIG. 35 is a diagram that illustrates a result of a simulation of temporal development of the photon number of light having right-handed circular polarization or left-handed circular polarization of each site according to the fourth embodiment in a case where a delay time $t_d$ of pseudo Ising interaction between sites adjacent to each other is $3 \times 10^{-11}$ seconds.
Figure 36:
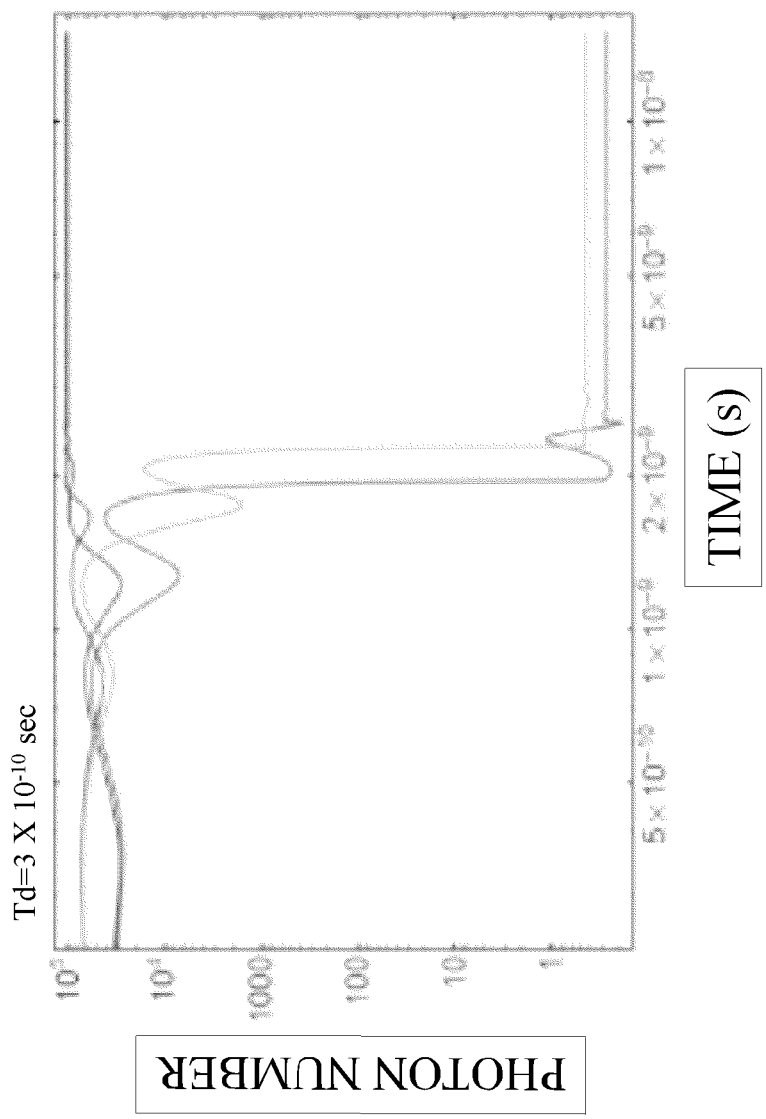
FIG. 36 is a diagram that illustrates a result of a simulation of temporal development of the photon number of light having right-handed circular polarization or left-handed circular polarization of each site according to the fourth embodiment in a case where a delay time $t_d$ of pseudo Ising interaction between sites adjacent to each other is $3 \times 10^{-10}$ seconds.
Figure 37:
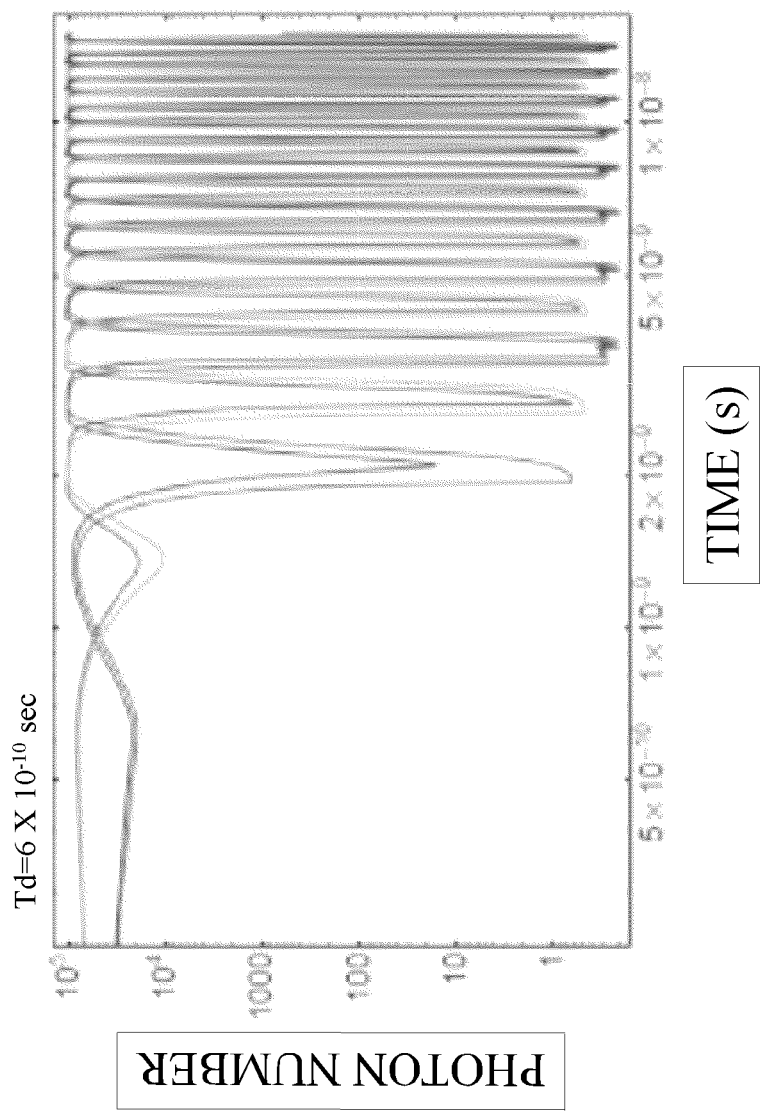
FIG. 37 is a diagram that illustrates a result of a simulation of temporal development of the photon number of light having right-handed circular polarization or left-handed circular polarization of each site according to the fourth embodiment in a case where a delay time $t_d$ of pseudo Ising interaction between sites adjacent to each other is $6 \times 10^{-10}$ seconds.
Figure 38:
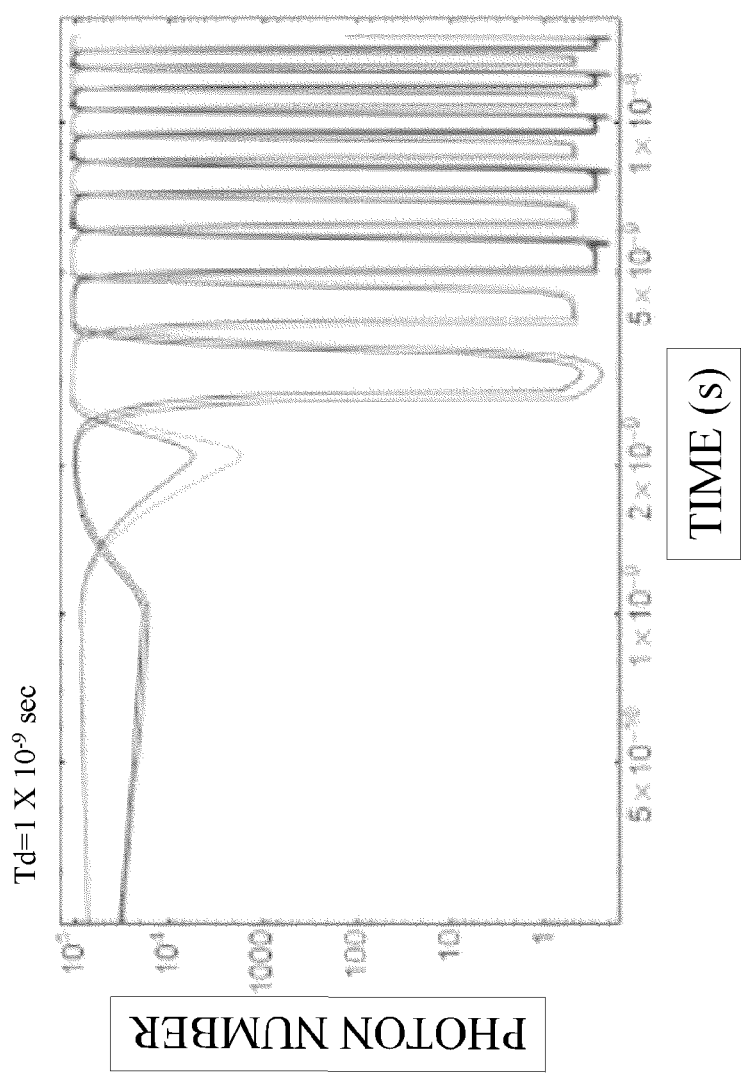
FIG. 38 is a diagram that illustrates a result of a simulation of temporal development of the photon number of light having right-handed circular polarization or left-handed circular polarization of each site according to the fourth embodiment in a case where a delay time $t_d$ of pseudo Ising interaction between sites adjacent to each other is $1 \times 10^{-9}$ seconds.
Figure 39:
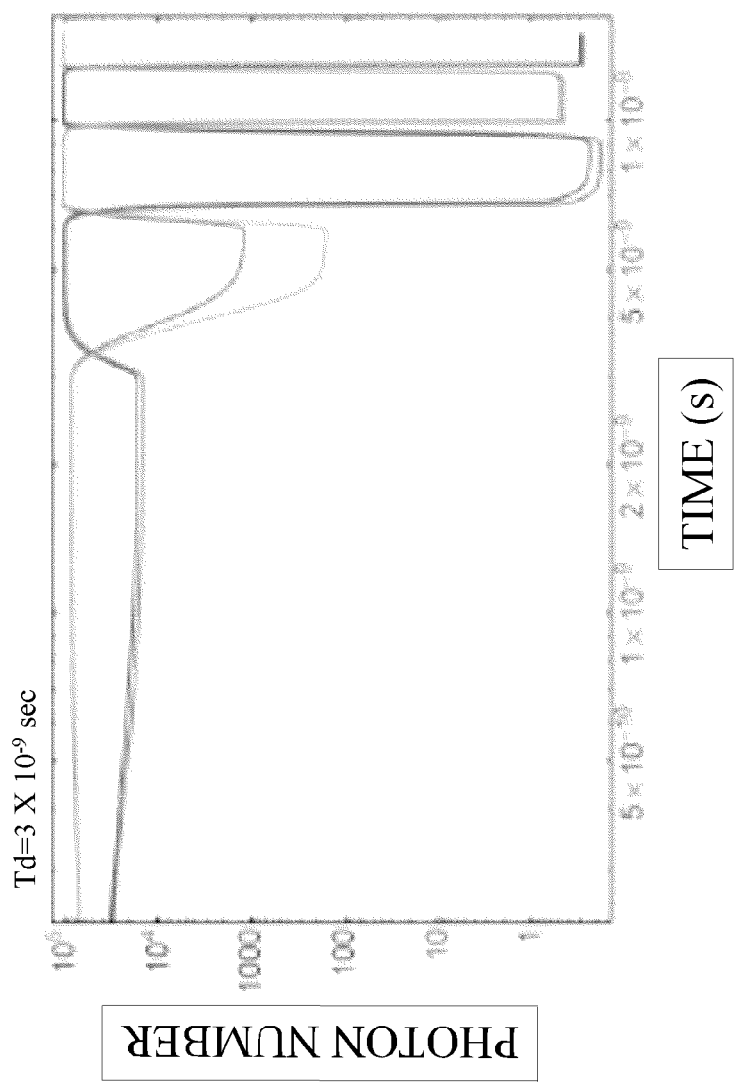
FIG. 39 is a diagram that illustrates a result of a simulation of temporal development of the photon number of light having right-handed circular polarization or left-handed circular polarization of each site according to the fourth embodiment in a case where a delay time $t_d$ of pseudo Ising interaction between sites adjacent to each other is $3 \times 10^{-9}$ seconds.

A diagram illustrating a difference between the resonance frequencies of the horizontally polarized light and the vertically polarized light according to the fourth embodiment is illustrated in FIG. 32. The oscillation frequency of the slave laser B was swept, and the intensities of light having horizontally linearly polarized light and light having the vertically linearly polarized light output by the slave laser B were measured. The oscillation frequencies at which intensities of the light having the horizontally linearly polarized light and the vertically linearly polarized light form peaks are different from each other. A difference between the resonance frequencies of the horizontally polarized light and the vertically polarized light was about 6 GHz. The difference between the resonance frequencies of the horizontally polarized light and the vertically polarized light is about ⅙ of the injection locking width of the master laser M and the slave laser B.

Accordingly, in the semiconductor surface-emitting laser, even in a case where anisotropy is present between horizontally linearly polarized light and vertically linearly polarized light, when both the resonance frequencies of the horizontally linearly polarized light and the vertically linearly polarized light are located in the injection locking width of the master laser M and the slave laser B, the polarization of light output by the slave laser B follows horizontally linearly polarized light from the vertically linearly polarized light.

A diagram illustrating the accuracy of injection locking between the master laser and the slave laser according to the fourth embodiment is illustrated in FIG. 33. Here, an injection mode represents the polarization of light output by the master laser M. Fidelity represents the degree at which the polarization of the light output by the slave laser B follow the polarization of light output by the master laser M. Purity represents the purity at which the polarization of the light output by the slave laser B has the polarization of the light output by the master laser M.

The fidelity is defined as Expression 37.

$$F = Tr[\hat{\rho}_M \otimes \hat{\rho}_S]$$

$$= Tr\left\{\frac{1}{2}[\hat{I} + S_{M1}\hat{\sigma}_x + S_{M2}\hat{\sigma}_y + S_{M3}\hat{\sigma}_z] \otimes [\hat{I} + S_{S1}\hat{\sigma}_x + S_{S2}\hat{\sigma}_y + S_{S3}\hat{\sigma}_z]\right\}$$

$$= \frac{1}{2}[1 + S_{M1}S_{S1} + S_{M2}S_{S2} + S_{M3}S_{S3}]$$

[Expression 37]

Here, I is a unit matrix, σ is a spin matrix, $S_M$ is a strokes parameter of the light output by the master laser M, $S_S$ is a strokes parameter of light output by the slave laser B, and the strokes parameter is defined as Expression 38.

$$S_1 = (I_H - I_V)/(I_H + I_V)$$

$$S_2 = (I_D - I_A)/(I_D + I_A)$$

$$S_3 = (I_R - I_L)/(I_R + I_L)$$

[Expression 38]

Here, $I_H$ and $I_V$ are intensities of light having the horizontally linearly polarized light and the vertically linearly polarized light, $I_D$ and $I_A$ are intensities of light having −45° polarization and +45° polarization, respectively, and $I_R$ and $I_L$ are intensities of light having right-handed circular polarization and left-handed circular polarization.

Purity is defined as Expression 39.

$$S_S^2 = S_{S1}^2 + S_{S2}^2 + S_{S3}^2$$

[Expression 39]

The fidelity is 0.5 when the polarization direction is not followed at all and is 1 when the polarization direction is fully followed. The purity is zero when the polarization direction is not followed at all and is 1 when the polarization direction is fully followed. In any injection mode, it is understood that the polarization direction is followed to some degrees. The reason for not fully following of the polarization direction is that there is anisotropy between the horizontally linearly polarized light and the vertically linearly polarized light in the semiconductor surface-emitting laser.

In addition, in the fourth embodiment, the influence of a delay time of pseudo Ising interaction between two slave lasers B performing pseudo Ising interaction on the stability of the quantum computation device is represented by a simulation result.

Diagrams illustrating simulation results of temporal development of the photon number of light having right-handed circular polarization or left-handed circular polarization in each site according to the fourth embodiment for various delay times of the pseudo Ising interaction between sites adjacent to each other are illustrated in FIGS. 34 to 39. In FIGS. 34 to 39, the delay times $t_d$ of the pseudo Ising interaction between sites adjacent to each other are 0 seconds, $3\times10^{-11}$ seconds, $3\times10^{-10}$ seconds, $6\times10^{-10}$ seconds, $1\times10^{-9}$ seconds, and $3\times10^{-9}$ seconds. The number of sites is two, $\beta=10^{-5}$, $I/I_{th}\sim 2$, $\alpha=\frac{1}{200}$, $\zeta=\frac{1}{500}$, $J_{12}=6$, $\lambda_1=1$, and $\lambda_2=\frac{9}{10}$.

When $t_d=0$ seconds, $3\times10^{-11}$ seconds, and $3\times10^{-19}$ seconds, the photon number of light having the right-handed circular polarization or the left-handed circular polarization of each site arrives at the steady state at $10^{-9}$ seconds. When $t_d=6\times10^{-10}$ seconds, $1\times10^{-9}$ sec, and $3\times10^{-9}$ seconds, the photon number of light having the right-handed circular polarization or the left-handed circular polarization of each site arrives at a chaos state without arriving at the steady state at $10^{-9}$ seconds.

This, in order to stably operate the quantum computation device, it is necessary to set $t_d<6\times10^{-10}$ seconds. In other words, it is necessary to set the length of the optical path IL of two slave lasers B performing pseudo Ising interaction to be shorter than $3\times10^8$ m/s$\times 6\times 10^{-10}$ s to 10 cm. In addition, it is necessary that the delay time of the pseudo Ising interaction between two slave lasers B performing pseudo Ising interaction is shorter than the reciprocal (1/33.5 GHz) of the injection locking width of the master laser M and the two slave lasers B.

Modified Example

In the first embodiment to the fourth embodiment, while the slave laser B is applied as a system having a pseudo spin, in this modified example, an exciton polariton included in a semiconductor micro cavity or the like may be applied. A ground state in which the kinetic energy of all the exciton polaritons of the whole system is the minimum is realized, and, by measuring the polarization of light generated by each exciton polariton, the pseudo spin of each exciton polariton is measured. In order to improve the computation accuracy, for the energy of all the exciton polaritons of the whole system, an energy difference between the ground state and the first excited state needs to be sufficiently larger than $k_B T$ (T is the temperature of the whole system).

As a Bose-Einstein condensate, even when other than the exciton polariton, for example, a Bose-Einstein condensate of a photon is applied, pseudo Ising interaction between sites may be implemented through exchange of photons between sites, and Pseudo Zeeman energy may be implemented by injecting photons into each site from the master laser M.

Advantageous Effects of Present Disclosure

The Ising model quantum computation device and the Ising model quantum computation method according to the present disclosure are appropriate for easily solving an NP-complete problem or the like mapped into an Ising model at high speed. For example, in a case where an Ising model having the number of sites M=140 is to be solved, in a general computer or a quantum computer, while the computation time is $10^{42}$ times longer than that of a case where M=2, according to the Ising model quantum computation device and the Ising model quantum computation method of the present disclosure, the computation time is only $10^4$ times longer than that of a case where M=2 in the worst case. In other words, the computation time is shortened by 38 digits.

EXPLANATIONS OF REFERENCE SIGNS

B, B1, B2, B3: Bose-Einstein condensates, slave laser
D1, D2, D3: spin measuring unit
F: feedback control circuit
I1, I2, I3: Ising interaction implementing unit
IL, IL12, IL23, IL13: optical path
IA, IA12, IA23, IA13: attenuator
IP, IP12, IP23, IP13: wave plate
IPA, IPA12, IPA23, IPA13: polarizing plate
IPB, IPB12, IPB23, IPB13: phase shifter
P: polarization measuring unit
M: master laser
ZL, ZL1, ZL2, ZL3: optical path
ZA, ZA1, ZA2, ZA3: attenuator
ZP, ZP1, ZP2, ZP3: wave plate
ZPA, ZPA1, ZPA2, ZPA3: $\lambda/2$ wave plate
ZPB, ZPB1, ZPB2, ZPB3: $\lambda/4$ wave plate

What is claimed is:

1. An Ising model quantum computation device comprising:
   a plurality of coherent oscillators that have an oscillation mode in which light having left-handed circular polarization or right-handed circular polarization is generated;
   inter-oscillator optical path units that are arranged between two coherent oscillators for each pair of the plurality of coherent oscillators;
   inter-oscillator intensity control units that, for each pair of the plurality of coherent oscillators, are arranged in the inter-oscillator optical path units and implement a magnitude of pseudo Ising interaction between two coherent oscillators by controlling an intensity of light exchanged between the two coherent oscillators;
   inter-oscillator polarization control units that, for each pair of the plurality of coherent oscillators, are arranged in the inter-oscillator optical path units and implement a sign of the pseudo Ising interaction between two coherent oscillators by controlling polarization and a phase of light exchanged between the two coherent oscillators; and
   a polarization measuring unit that measures pseudo spins of the plurality of coherent oscillators by measuring polarization of light generated by the plurality of coherent oscillators with left-handed circular polarization and right-handed circular polarization used as bases after the plurality of coherent oscillator arrive at a steady state.

2. The Ising model quantum computation device according to claim 1, wherein the plurality of coherent oscillators are a plurality of slave lasers.

3. The Ising model quantum computation device according to claim 1, wherein the plurality of coherent oscillators are a plurality of Bose-Einstein condensates.

4. The Ising model quantum computation device according to claim 1, further comprising:

a master oscillator that injects light to the plurality of coherent oscillators and synchronizes oscillation phases of the plurality of coherent oscillators; and master-to-oscillator optical path units that are arranged between the master oscillator and the coherent oscillators.

5. The Ising model quantum computation device according to claim 4, further comprising:

master-to-oscillator intensity control units that are arranged in the master-to-oscillator optical path units and implement a magnitude of pseudo Zeeman energy in each coherent oscillator by controlling an intensity of light injected to each coherent oscillator; and master-to-oscillator polarization control units that are arranged in the master-to-oscillator optical path units and implement a magnitude and a sign of the pseudo Zeeman energy in each coherent oscillator by controlling polarization and a phase of light injected to each coherent oscillator.

6. The Ising model quantum computation device according to claim 4, further comprising adjacent spin direction fixing units that are arranged in the master-to-oscillator optical path units and fix the directions of pseudo spins of two coherent oscillators to be different from each other when the sign of pseudo Ising interaction between the two coherent oscillators is positive and fix the directions of the pseudo spins of two coherent oscillators to be the same when the sign of the pseudo Ising interaction between the two coherent oscillators is negative by controlling the intensity, the polarization, and the phase of light injected to the two coherent oscillators when the polarization of light generated by the two coherent oscillators performing the pseudo Ising interaction through the inter-oscillator optical paths is not significantly measured as left-handed circular polarization or right-handed circular polarization.

7. The Ising model quantum computation device according to claim 6, further comprising peripheral spin direction fixing units that are arranged in the master-to-oscillator optical path units and fix a direction of a pseudo spin of an adjacent coherent oscillator to a direction of a current time point by controlling the intensity, the polarization and the phase of light injected to the adjacent coherent oscillator performing pseudo Ising interaction with the two coherent oscillators through the inter-oscillator optical path units when the polarization of light generated by the two coherent oscillators performing the pseudo Ising interaction through the inter-oscillator optical path units is not significantly measured as left-handed circular polarization or right-handed circular polarization.

8. The Ising model quantum computation device according to claim 4, wherein a delay time of pseudo Ising interaction between two coherent oscillators performing the pseudo Ising interaction through the inter-oscillator optical path units is shorter than a reciprocal of an injection locking width in the master oscillator and the two coherent oscillators.

9. The Ising model quantum computation device according to claim 4, wherein the master oscillator is a master laser.

10. An Ising model quantum computation method comprising in sequence:

an oscillating step of starting oscillation of a plurality of coherent oscillators that have an oscillation mode in which light having left-handed circular polarization or right-handed circular polarization is generated;

an interaction implementing step of implementing a magnitude and a sign of pseudo Ising interaction between two coherent oscillators by controlling an intensity, polarization and a phase of light exchanged between the two coherent oscillators for each pair of the plurality of coherent oscillators; and a spin measuring step of measuring pseudo spins of the plurality of coherent oscillators by measuring polarization of light generated by the plurality of coherent oscillators with left-handed circular polarization and right-handed circular polarization used as bases after the plurality of coherent oscillator arrive at a steady state.

11. The Ising model quantum computation method according to claim 10, wherein the plurality of coherent oscillators are a plurality of slave lasers.

12. The Ising model quantum computation method according to claim 10, wherein the plurality of coherent oscillators are a plurality of Bose-Einstein condensates.

13. The Ising model quantum computation method according to claim 10, wherein, in the oscillating step, oscillation of a master oscillator synchronizing oscillation phases of the plurality of coherent oscillators is started by injecting light to the plurality of coherent oscillators.

14. The Ising model quantum computation method according to claim 13, wherein, in the interaction implementing step, a magnitude and a sign of pseudo Zeeman energy in each coherent oscillator are implemented by controlling an intensity, polarization, and a phase of light injected to each coherent oscillator from the master oscillator.

15. The Ising model quantum computation method according to claim 13, wherein, in the interaction implementing step, the directions of pseudo spins of two coherent oscillators are fixed to be different from each other when the sign of pseudo Ising interaction between the two coherent oscillators is positive, and the directions of the pseudo spins of two coherent oscillators are fixed to be the same when the sign of the pseudo Ising interaction between the two coherent oscillators is negative by controlling the intensity, the polarization, and the phase of light injected to the two coherent oscillators when the polarization of light generated by the two coherent oscillators performing the pseudo Ising interaction is not significantly measured as left-handed circular polarization or right-handed circular polarization.

16. The Ising model quantum computation method according to claim 15, wherein, in the interaction implementing step, a direction of a pseudo spin of an adjacent coherent oscillator is fixed to a direction of a current time point by controlling the intensity, the polarization and the phase of light injected to the adjacent coherent oscillator performing pseudo Ising interaction with two coherent oscillators when the polarization of light generated by the two coherent oscillators performing the pseudo Ising interaction is not significantly measured as left-handed circular polarization or right-handed circular polarization.

17. The Ising model quantum computation method according to claim 13, wherein a delay time of pseudo Ising interaction between two coherent oscillators performing the pseudo Ising interaction is shorter than a reciprocal of an injection locking width in the master oscillator and the two coherent oscillators.

18. The Ising model quantum computation method according to claim 13, wherein the master oscillator is a master laser.

19. An Ising model quantum computation method comprising in sequence:

an oscillating step of starting oscillation of a plurality of coherent oscillators that have an oscillation mode in which light having left-handed circular polarization or right-handed circular polarization is generated;

an interaction implementing step of implementing a magnitude and a sign of pseudo Ising interaction between two coherent oscillators to approach final values from initial values by controlling an intensity, polarization and a phase of light exchanged between the two coherent oscillators for each pair of the plurality of coherent oscillators; and a spin measuring step of measuring pseudo spins of the plurality of coherent oscillators by measuring polarization of light generated by the plurality of coherent oscillators with left-handed circular polarization and right-handed circular polarization used as bases after the magnitude and the sign of the pseudo Ising interaction arrive at the final values.

20. The Ising model quantum computation method according to claim 19, wherein the plurality of coherent oscillators are a plurality of slave lasers.

21. The Ising model quantum computation method according to claim 19, wherein the plurality of coherent oscillators are a plurality of Bose-Einstein condensates.

22. The Ising model quantum computation method according to claim 19, wherein, in the oscillating step, oscillation of a master oscillator synchronizing oscillation phases of the plurality of coherent oscillators by injecting light to the plurality of coherent oscillators is started.

23. The Ising model quantum computation method according to claim 22,
wherein, in the interaction implementing step, a magnitude and a sign of pseudo Zeeman energy in each coherent oscillator are implemented so as to approach final values from initial values by controlling an intensity, polarization, and a phase of light injected to each coherent oscillator from the master oscillator, and
wherein, in the spin measuring step, pseudo spins of the plurality of coherent oscillators are measured by measuring polarization of light generated by the plurality of coherent oscillators with left-handed circular polarization and right-handed circular polarization used as bases after the magnitude and the sign of the pseudo Zeeman energy arrive at the final values.

24. The Ising model quantum computation method according to claim 22, wherein, in the interaction implementing step, the directions of pseudo spins of two coherent oscillators are fixed to be different from each other when the sign of pseudo Ising interaction between the two coherent oscillators is positive, and the directions of the pseudo spins of two coherent oscillators are fixed to be the same when the sign of the pseudo Ising interaction between the two coherent oscillators is negative by controlling the intensity, the polarization, and the phase of light injected to the two coherent oscillators when the polarization of light generated by the two coherent oscillators performing the pseudo Ising interaction is not significantly measured as left-handed circular polarization or right-handed circular polarization.

25. The Ising model quantum computation method according to claim 24, wherein, in the interaction implementing step, a direction of a pseudo spin of an adjacent coherent oscillator is fixed to a direction of a current time point by controlling the intensity, the polarization and the phase of light injected to the adjacent coherent oscillator performing pseudo Ising interaction with two coherent oscillators when the polarization of light generated by the two coherent oscillators performing the pseudo Ising interaction is not significantly measured as left-handed circular polarization or right-handed circular polarization.

26. The Ising model quantum computation method according to claim 22, wherein a delay time of pseudo Ising interaction between two coherent oscillators performing the pseudo Ising interaction is shorter than a reciprocal of an injection locking width in the master oscillator and the two coherent oscillators.

27. The Ising model quantum computation method according to claim 22, wherein the master oscillator is a master laser.

* * * * *